(12) United States Patent
Matsushita

(10) Patent No.: US 7,741,011 B2
(45) Date of Patent: Jun. 22, 2010

(54) POLYMERIZABLE COMPOSITION AND PLANOGRAPHIC PRINTING PLATE PRECURSOR USING THE SAME, ALKALI-SOLUBLE POLYURETHANE RESIN, AND PROCESS FOR PRODUCING DIOL COMPOUND

(75) Inventor: Tetsunori Matsushita, Shizuoka-ken (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 0 days.

(21) Appl. No.: 12/236,159

(22) Filed: Sep. 23, 2008

(65) Prior Publication Data

US 2009/0087785 A1 Apr. 2, 2009

(30) Foreign Application Priority Data

Sep. 28, 2007 (JP) ............................. 2007-256328

(51) Int. Cl.
*G03F 7/027* (2006.01)
*G03F 7/00* (2006.01)

(52) U.S. Cl. ................ 430/284.1; 430/906; 430/302; 522/96; 528/60; 525/421; 525/426; 562/556; 562/553; 562/507; 562/567; 562/574

(58) Field of Classification Search ........................ None
See application file for complete search history.

(56) References Cited

U.S. PATENT DOCUMENTS

2002/0136987 A1 * 9/2002 Oshima ................... 430/281.1

FOREIGN PATENT DOCUMENTS

| JP | 1-271741 A | 10/1989 |
|---|---|---|
| JP | 8-12424 B2 | 2/1996 |
| JP | 2006-225432 A | 8/2006 |

* cited by examiner

*Primary Examiner*—Cynthia Hamilton
(74) *Attorney, Agent, or Firm*—Buchanan Ingersoll & Rooney PC

(57) ABSTRACT

A polyurethane resin is synthesized from a compound represented by the following Formula (1), a polymerizable composition includes the polyurethane resin, a planographic printing plate precursor includes a photosensitive layer including the composition, and a method produces a diol compound that can be used as a raw material of the polyurethane resin. In Formula (1), $R^1$ and $R^2$ each independently represent a single bond or an alkylene group optionally having a substituent, $R^3$ represents a hydrogen atom or an alkyl group, $R^4$ represents a hydrogen atom or an alkyl group, and A represents a divalent or higher linking group, provided that $R^1$ and $R^2$ are not both a single bond.

Formula (1)

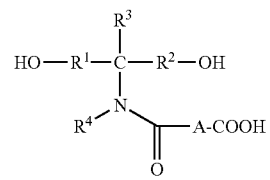

11 Claims, No Drawings

POLYMERIZABLE COMPOSITION AND PLANOGRAPHIC PRINTING PLATE PRECURSOR USING THE SAME, ALKALI-SOLUBLE POLYURETHANE RESIN, AND PROCESS FOR PRODUCING DIOL COMPOUND

CROSS-REFERENCE TO RELATED APPLICATION

This application claims priority under 35 USC 119 from Japanese Patent Application No. 2007-256328, the disclosure of which is incorporated by reference herein.

BACKGROUND OF THE INVENTION

1. Field of the Invention

The present invention relates to a polymerizable composition and a planographic printing plate precursor, an alkali-soluble polyurethane resin, as well as a process for producing a diol. More particularly, it relates to a polymerizable composition suitable for a photosensitive layer of a negative planographic printing plate precursor in which writing at a high sensitivity with laser light is possible, a negative planographic printing plate precursor including the polymerizable composition in a photosensitive layer, an alkali-soluble polyurethane resin excellent in solubility in an aqueous alkali solution contained in the polymerizable composition, and a process for producing a diol compound suitable as a raw material of the polyurethane resin.

2. Description of the Related Art

Conventionally, as a photosensitive planographic plate printing precursor, a presensitized plate in which a lipophilic photosensitive resin layer is provided on a hydrophilic support has been widely used. As the process for manufacturing the plate, a desired printing plate has been obtained by dissolving and removing a non-exposed part after mask exposure (surface exposure) via a lithographic film.

In recent years, a digitalization technique has come into wide use, in which image information is electronically treated, accumulated and outputted using a computer. Further, a new image outputting format responding to such a digitalization technique has been put into practice in various ways. As a result, a computer to plate (CTP) technique of scanning light having high directivity such as laser light according to digitalized image information, and directly manufacturing a printing plate without using a lithographic film has received attention, and an important technical issue concerns how to obtain a planographic printing plate precursor adapted thereto.

As such a planographic printing plate precursor which can be scanning-exposed, a configuration in which a lipophilic photosensitive resin layer (hereinafter, also referred to as photosensitive layer) containing a photosensitive compound which can generate an active species such as a radical or Bronsted acid by laser exposure is provided on a hydrophilic support has been proposed, and is already commercially available. By laser exposure-scanning this planographic printing plate precursor based on digital information to generate an active species only in a laser-irradiated region, and by insolubilizing the region by causing a physical or chemical change in the photosensitive layer as a result of the irradiation, followed by developing treatment, a negative planographic printing plate can be obtained. In particular, a planographic printing plate on which a photopolymerizable photosensitive layer including a photopolymerization initiator excellent in photosensitive speed, a compound containing a polymerizable ethylenic unsaturated double bond and a binder polymer soluble in an alkali developer and, further, optionally, an oxygen impermeable protective layer, are provided, can provide a printing plate having a desirable printing performance due to advantages such as excellent productivity, simplified developing treatment, and favorable resolution and ink receptivity.

A polymerizable composition forming a photosensitive layer of such a planographic printing plate precursor is required to have properties such that an energy-imparted region is rapidly cured to form a film having a high strength and, at the same time, an unexposed part is rapidly dissolved and removed by an alkali developer.

Conventionally, for the purpose of improving a cured film strength, and imparting an image region in the planographic printing plate with high printing durability, a polyurethane resin binder comprising an alkali-soluble group has been used in such a photosensitive polymerizable composition (see, for example, Japanese Patent Application Publication (JP-B) No. 8-12424 and Japanese Patent Application Laid-Open (JP-A) No. 1-271741). As the alkali-soluble group contained in such a polyurethane resin binder, dimethylolpropionic acid and dimethylolbutanoic acid are generally used. However, the polyurethane resin binder may not be sufficient in developability due to high aggregating property arising from a urethane bond part and, in a developing layer, development scum is precipitated over time, and adhered to a plate material after plate making to generate stains and, therefore, there is a problem that it is difficult to obtain excellent image forming property when used in the photosensitive layer in the planographic printing plate precursor.

In response to such a problem, for example, a technique of using a carboxylic acid unit having a specified structure in a urethane resin for the purpose of improving alkali developability, and a technique of introducing a unit into a urethane resin for the purpose of assisting developer solubility by a method of using a compound producing an acid group by hydrolysis as a raw material have been proposed (see, for example, JP-A No. 2006-225432). In a polymerizable composition containing a urethane resin obtained by such a method, alkali developability is improved, and precipitation over time of development scum in a developer is effectively suppressed. However, improvement in solubility in an alkali developer influences the excellent film property originally possessed by a polyurethane resin, whereby the film property of the resulting film is degraded, and a problem may arise whereby, when used in the photosensitive layer of the planographic printing plate precursor, printing durability is deteriorated.

In this way, in the polymerizable composition, the strength of a cured film, and developability of an uncured region generally have incompatible properties and, in particular, when used as the photosensitive layer of the planographic printing plate precursor, these properties lower the printing durability of an image part and increase contamination of a non-image part and, therefore, a polymerizable composition which resolve both of these issues is currently necessary.

SUMMARY OF THE INVENTION

The present invention has been made in view of the above circumstances and provides a polymerizable composition and a planographic printing plate precursor, an alkali-soluble polyurethane resin, as well as a process for producing a diol. A first aspect of the present invention provides the polymerizable composition comprising an alkali-soluble polyurethane resin synthesized from a compound represented by the Formula (1) as one of raw materials, a compound having an addition polymerizable ethylenic unsaturated bond, and a thermal polymerization initiator.

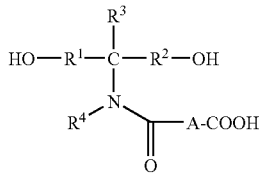

Formula (1)

In the Formula (1), $R^1$ and $R^2$ each represent independently a single bond or an alkylene group, $R^3$ represents a hydrogen atom or an alkyl group, $R^4$ represents a hydrogen atom or an alkyl group, and A represents a divalent or higher linking group, provided that $R^1$ and $R^2$ are not both a single bond.

A second aspect of the present invention provides an alkali-soluble polyurethane resin synthesized from the compound represented by the following Formula (1) as one of raw materials.

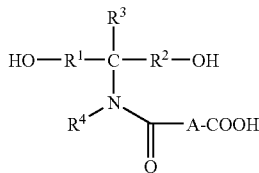

Formula (1)

In the Formula (1), $R^1$ and $R^2$ each represent independently a single bond or an alkylene group optionally having a substituent, $R^3$ represents a hydrogen atom or an alkyl group, $R^4$ represents a hydrogen atom or an alkyl group, and A represents a divalent or higher linking group, provided that $R^1$ and $R^2$ are not both a single bond.

A third aspect of the present invention provides the planographic printing plate precursor comprising a photosensitive layer including the polymerizable composition of the invention on a support.

A forth aspect of the present invention provides a process for producing a compound represented by the following Formula (2) comprising hydrolyzing a compound represented by the following Formula (3) with water at a temperature of 60° C. or lower without using an acidic catalyst.

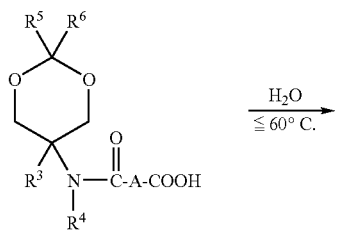

Formula (3)

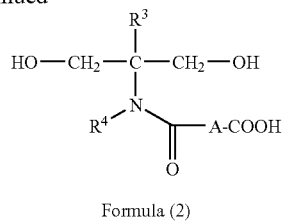

Formula (2)

In the Formula (2), $R^3$ represents a hydrogen atom or an alkyl group, $R^4$ represents a hydrogen atom or an alkyl group, and A represents a divalent or higher linking group. In the Formula (3), $R^5$ and $R^6$ each represent independently a hydrogen atom or an alkyl group, and $R^3$, $R^4$ and A are the same as $R^3$, $R^4$ and A in the Formula (2).

DETAILED DESCRIPTION OF THE INVENTION

In the process of the invention, it is preferable that after the compound represented by the Formula (3) is hydrolyzed with water at a reaction temperature of 60° C. or lower without using an acidic catalyst, a water amount contained by the compound represented by the Formula (2) is made to be 0.1% or less using an organic solvent in azeotropy with water under reduced pressure and under the temperature condition of 60° C. or lower.

In the following explanation, an alkali-soluble polyurethane resin synthesized from the compound represented by the Formula (1) as one of raw materials will be explained by conveniently referring to as "specified polyurethane resin".

The specified polyurethane resin used in the polymerizable composition of the invention is a novel polymer which is excellent in film forming property and alkali developability of an uncured part, and has physical property that precipitation is not generated in an alkali developer. This specified polyurethane resin is such that after it is dissolved in an aqueous alkali solution at a pH 10 or higher, and is allowed to stand at a room temperature for 60 days, precipitation is not generated. Herein, generation of no precipitation refers to that after 12.5 g of the specified polyurethane resin is dissolved in 0.5 liter of an aqueous alkali solution at a pH 12, and is stored under the atmosphere of 25° C. for 60 days, precipitation of the polymer is not observed visually.

The specified polyurethane resin in the invention has a terminal carboxyl ester group bound to a specified amido group. In the specified polyurethane resin having such the characteristic, precipitation of the polymer with time caused by hydrolysis of an ester bond seen in a polyurethane resin having an ester bond is suppressed.

The specified polyurethane resin is synthesized by using a compound having a carboxylic acid group, and a terminal carboxyl group bound to a specified amido group having higher hydrophilic property than an ester group, such as the compound represented by the Formula (1) and it is thought that, by possession of such the structure derived from the compound represented by the Formula (1), sufficient alkali solubility is manifested. Therefore, in the planographic printing plate precursor in which the polymerizable composition of the invention is applied to a photosensitive layer, alkali solubility of an unexposed part is sufficiently exerted by excellent alkali solubility due to the specified polyurethane resin. For this reason, it is presumed that the excellent effect of suppressing precipitation of a binder polymer (development scum) in a developer after development treatment is also exerted while excellent printing durability at an exposed part (image part) is maintained.

The process of the invention is a process for producing the compound represented by the Formula (2) which is one aspect of the invention among the compound represented by the Formula (1) which is a diol compound used as one of raw materials of the specified polyurethane resin. The compound represented by the Formula (2) can be stably and simply obtained by the process of the invention.

In the process of the invention, a water amount contained by the compound represented by the Formula (2) can be made to be 0.1% by mass or less, by hydrolyzing the compound represented by the Formula (3) with water at a reaction temperature of 60° C. or lower without using an acidic catalyst and, thereafter, using an organic solvent in azeotropy with water under reduced pressure and under the temperature condition of 60° C. or lower. The compound represented by the Formula (2) is a compound having low thermal stability, but by conducting the present aspect, it becomes possible to reduce a water content to 0.1% by mass or less. Therefore, the compound represented by the Formula (2) (diol compound) obtained by the process of the invention can be also used suitably in synthesis of a polyurethane resin, requiring raw materials to have a low water amount.

According to an aspect of the invention, the polymerizable composition suitable in a photosensitive layer of a negative planographic printing plate precursor, which is cured by imparting an energy to form a film having a high strength and, at the same time, is excellent in alkali developability of an uncured region, and dose not generate a development scum in a developer after development, and an alkali-soluble polyurethane resin contained in such the polymerizable composition can be provided.

According to an aspect of the invention, the planographic printing plate precursor comprising a photosensitive layer including the polymerizable composition of the invention, which is excellent in printing durability of an image part, and developability of an unexposed part can be provided.

According to an aspect of the invention, the process by which a diol compound useful as a raw material of an alkali-soluble polyurethane resin contained in the polymerizable composition of the invention can be stably and simply produced can be provided.

The invention will be explained in detail.

<Polymerizable Composition>

The polymerizable composition of the invention comprises an alkali-soluble polyurethane resin using the compound represented by the Formula (1) as a raw material, a compound having an addition polymerizable ethylenic unsaturated bond, and a compound having a light or thermal polymerization initiator.

The polymerizable composition of the invention has a mechanism that the photo or thermal polymerization initiator is degraded by light or heat to generate a radical, and this generated radical causes a polymerization reaction of the compound having an ethylenic unsaturated bond. Each component contained in the polymerizable composition of the invention will be explained in detail below.

[Alkali-Soluble Polyurethane Resin Obtained by Using Compound Represented by Formula (1) (Specified Polyurethane Resin.)]

The specified polyurethane resin of the invention is a resin synthesized by using the compound represented by the following Formula (1) as one of raw materials. That is, it is a polymer compound obtained by using at least the compound represented by the following Formula (1) which is a diol compound, and an isocyanate compound, and reacting them.

The compound represented by the Formula (1) will be explained below.

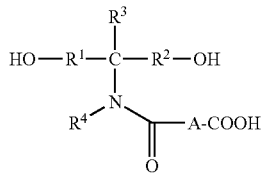

Formula (1)

In the Formula (1), $R^1$ and $R^2$ each represent independently a single bond or an alkylene group optionally having a substituent, $R^3$ represents a hydrogen atom, or an alkyl group, $R^4$ represents a hydrogen atom or an alkyl group, and A represents a divalent or higher linking group, provided that $R^1$ and $R^2$ are not both a single bond.

The compound represented by the Formula (1) will be explained in detail.

In the Formula (1), $R^1$ and $R^2$ each represent independently a single bond or an alkylene group optionally having a substituent, provided that $R^1$ and $R^2$ are not both a single bond.

As the alkylene group represented by $R^1$ or $R^2$, an alkylene group of a carbon atom number of 1 to 20 is preferable, an alkylene group of a carbon atom number of 1 to 6 is more preferable, and an alkylene group of a carbon atom number of 1 to 4 is further preferable. In addition, examples of a substituent which can be introduced into the alkylene group include a halogen atom (—F, —Br, —Cl, —I), and an alkyl group optionally substituted alkyl group.

In the Formula (1), $R^3$ represents a hydrogen atom or an alkyl group.

As the alkyl group represented by $R^3$, an alkyl group of a carbon atom number of 1 to 20 is preferable, an alkyl group of a carbon atom number of 1 to 12 is more preferable, and an alkyl group of a carbon atom number of 1 to 8 is further preferable. In addition, the alkyl group may be either linear, branched or cyclic. The alkyl group represented by $R^3$ may further have a substituent, and examples of a substituent which can be introduced include a halogen atom, and an alkoxy group.

The alkyl group represented by $R^3$ is particularly preferably an alkyl group having no substituent, specifically, a methyl group, and an ethyl group from a viewpoint of easy availability of a raw material.

$R^4$ represents a hydrogen atom or an alkyl group.

As the alkyl group represented by $R^4$, an alkyl group of a carbon atom number of 1 to 20 is preferable, an alkyl group of a carbon atom number of 1 to 12 is more preferable, and an alkyl group of a carbon atom number of 1 to 8 is further preferable. Examples of the alkyl group include a methyl group, and an ethyl group. The alkyl group may further have a substituent, and examples of a substituent which can be introduced include a halogen atom, and an alkoxy group.

As $R^4$, a hydrogen atom is preferable from a viewpoint of hydrophilicity.

A represents a divalent or higher linking group. As the linking group mentioned herein, a linking group comprising no cyclic structure in a part of its structure is preferable.

Examples of the linking group represented by A include a linking group constructed to comprise two or more atoms selected from the group consisting of a carbon atom, a hydrogen atom, an oxygen atom, a nitrogen atom, and a sulfur atom. More specifically, the number of atoms constituting A is preferably 1 to 30, more preferably 1 to 25, further preferably 2 to 20, and most preferably 2 to 10. A valent number of the linking group is preferably 2 to 5-valent. When there is the linking group other than that constituting an amido group and terminal carboxylic acid, it may bind to a substituent except for a hydroxy group.

Among the compound represented by the Formula (1), a compound represented by the following Formula (2) is more preferable.

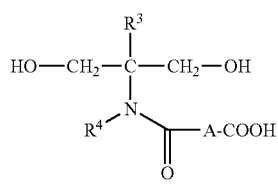

Formula (2)

Formula (2)

In the Formula (2), $R^3$ represents a hydrogen atom or an alkyl group, and $R^4$ represents a hydrogen atom or an alkyl group, and A represents a linking group.

In the Formula (2), as the divalent or higher linking represented by A, a linear linking group is preferable. In the linear linking group, the number of atoms constituting a main skeleton is preferably 1 to 20, more preferably 2 to 10, and further preferably 2 to 7.

Herein, the "main skeleton of a linking group" refers to an atom or an atom group which is used only for linking a carbonyl atom and terminal COOH in a specified amido group (—N($R^4$)C(=O)—) and, particularly, when there are a plurality of linking routes, refers to an atom or an atom group constituting a route in which the number of atoms used is minimum.

In the Formula (2), as the alkyl group represented by $R^3$, an alkyl group of a carbon atom number of 1 to 20 is preferable, an alkyl group of a carbon atom number of 1 to 12 is more preferable, and an alkyl group of a carbon atom number of 1 to 8 is further preferable. Examples of the alkyl group include a methyl group, and an ethyl group. The alkyl group may further have a substituent, and examples of a substituent which can be introduced include a halogen atom, and an alkyl group.

In the Formula (2), as the alkyl group represented by $R^4$, an alkyl group of a carbon atom number of 1 to 20 is preferable, and an alkyl group of a carbon atom number of 1 to 8 is more preferable. As $R^4$, a hydrogen atom is preferable from a viewpoint of hydrophilicity.

Preferable examples of the compound represented by the Formula (1) are shown below, but the invention is not limited to them.

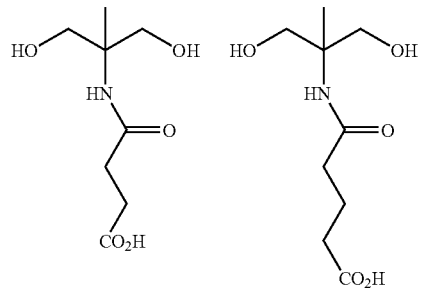

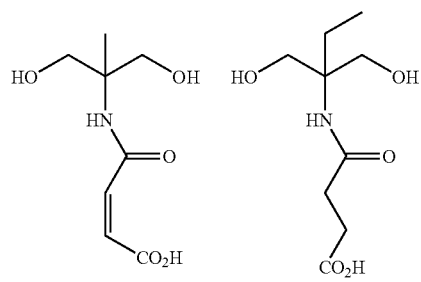

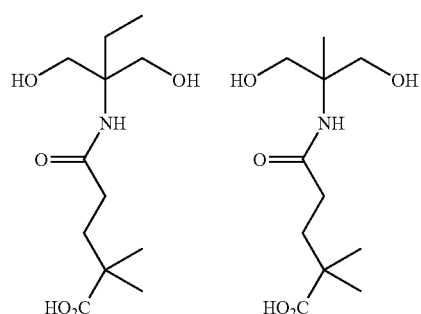

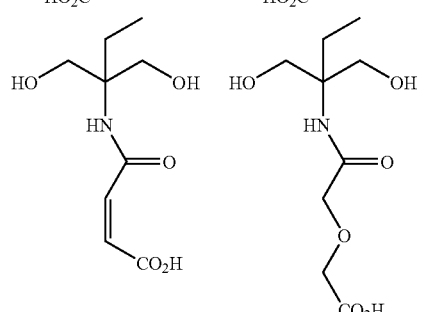

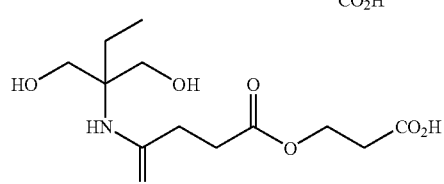

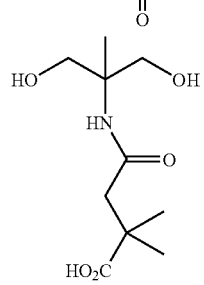

-continued
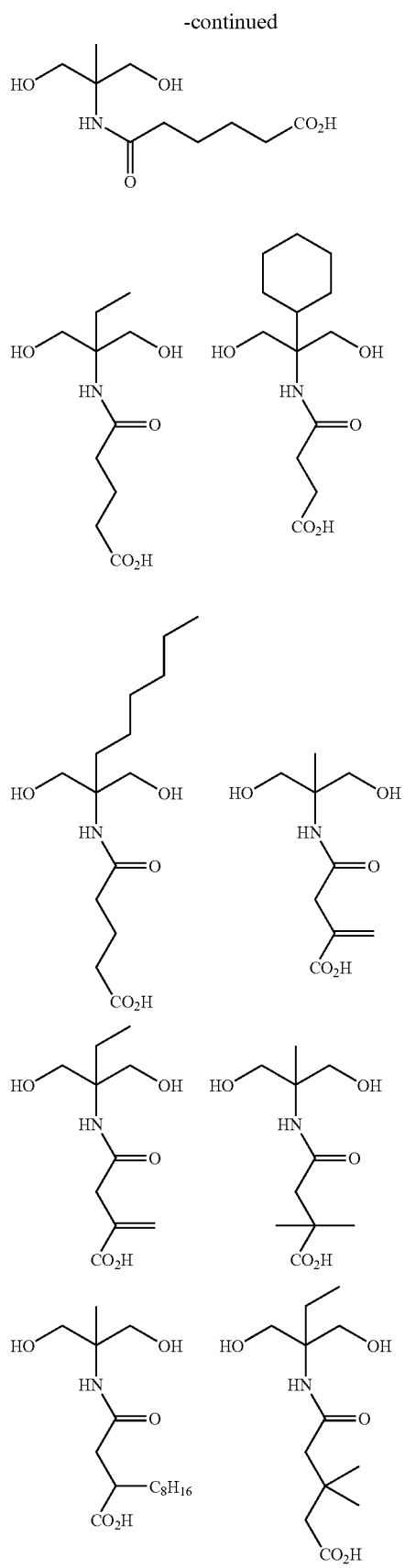
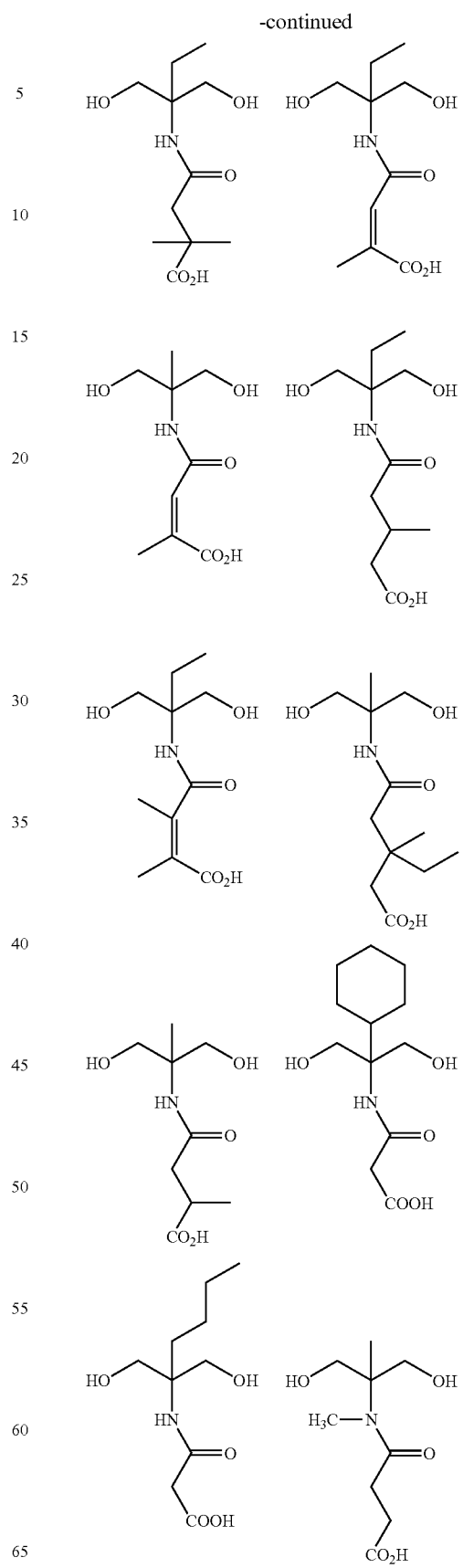

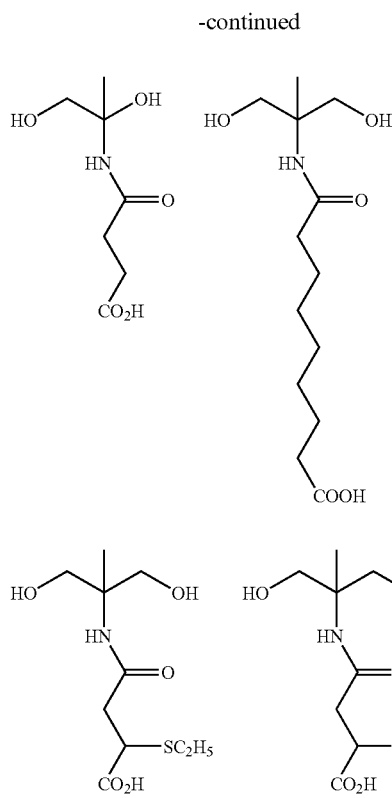

The compound represented by the Formula (1) can be produced by referring to the method described, for example, in Macromolecules 1996, 5375-5383.

In particular, the compound represented by the Formula (2) can be stably and simply produced by a process described in detail below.

<Process for Producing Compound Represented by Formula (2)>

A process for producing the compound represented by the Formula (2) which is one aspect of the compound represented by the Formula (1) (process of the invention) will be explained in detail below.

The compound represented by the Formula (2) can be produced by hydrolyzing the compound represented by the following Formula (3) with water at a reaction temperature of 60° C. or lower without using an acidic catalyst.

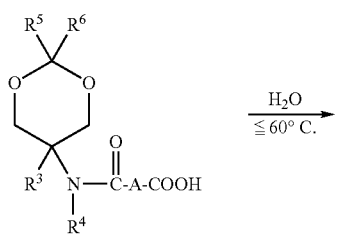

Formula (3)

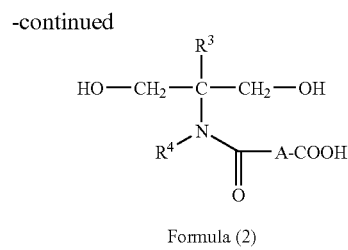

Formula (2)

In the Formula (3), $R^5$ and $R^6$ each represent independently a hydrogen atom or an alkyl group, and $R^3$, $R^4$ and A are the same as $R^3$, $R^4$ and A in the Formula (2). $R^3$, $R^4$ and A in the Formula (2) are as described above.

In the Formula (3), examples of alkyl represented by $R^5$ or $R^6$ include a methyl group and an ethyl group.

The compound represented by the Formula (3) is a compound obtained by protecting a diol part possessed by a diol compound having an amino group, which is a raw material of the compound and, thereafter, reacting an amino group of the diol compound, thereby, introducing a partial structure having a carboxyl group at an end into the diol compound via a specified amido group.

The compound represented by the Formula (3) can be specifically obtained, for example, by the method described in Synthesis Example 1 described below.

In the process of the invention, a temperature at which the compound represented by the Formula (3) is hydrolyzed is 60° C. or lower, preferably 30° C. or higher from a viewpoint of a reaction temperature and side reaction suppression, more preferably 30 to 60° C., and further preferably 40 to 50° C.

The reason why the acidic catalyst is not applied in the process for producing the compound represented by the Formula (2) is not to undergo hydrolysis due to a carboxylic acid group present in a molecule.

In the process of the invention, a water amount contained in the compound represented by the Formula (2) can be made to be 0.1% by mass or less by hydrolyzing the compound represented by the Formula (3) and, thereafter, using an organic solvent in azeotropy with water under reduced pressure under the temperature condition of 60° C. or lower. By making an amount of water contained by azeotropy dehydration like this 0.1% by mass or less, the compound represented by the Formula (2) can be suitably used as a resin raw material of the polyurethane resin.

It is preferable that, as an organic solvent used in azeotropy with water, an organic solvent which is inert to an isocyanate compound used as a raw material upon production of the polyurethane resin together with the compound represented by the Formula (2), and has a boiling point of 100° C. or lower is selected. Examples of the organic solvent include acetonitrile, ethyl acetate, butyl acetate, acetone, ethyl methyl ketone, and toluene.

An amount of the organic solvent used is different depending on an amount of water contained by the compound represented by the Formula (2), and is preferably a 2- to 20-fold amount based on a mass of the compound of the Formula (2).

The reduced pressure condition is different depending on an organic solvent used, and the temperature condition, and is preferably 50 mbar (5.0×10³ Pa) or lower. The temperature condition is 60° C. or lower and, from a viewpoint of a reaction time and side reaction suppression, preferably 30° C. or higher, more preferably 30 to 60° C., and more preferably 40 to 50° C.

When the compound represented by the Formula (2) is a viscous oil, the compound can be further effectively dehydrated by adding a high boiling point solvent which can not be distilled off under reduced pressure. Examples of the high boiling point solvent usable in this case include solvents such as N-methylpyrrolidone, dimethylformamide, and dimethylacetamide.

In the process of the invention, if necessary, azeotropic dehydration described above may be repeated, thereby, an amount of water contained by the compound of the Formula (2) can be made to be 0.1% by mass or less. It is more preferable that an amount of water contained in the compound of the Formula (2) is made to be 0.05% by mass or less. A water amount in the invention can be measured by a Karl Fischer's method. A water amount herein is a value measured by "MKC-510N" manufactured by KYOTO ELECTRONICS MANUFACTURING CO., LTD.

Each reaction temperature (deprotection, dehydration) in the process of the invention is limited to 60° C. or lower, respectively, as described above because when the reaction is carried at a reaction temperature of 60° C. or higher, an amido-ester exchange reaction (see below) occurs intramolecularly and intermolecularly, an unsubstituted amino group adversely influencing on a urethanization reaction upon use of the compound of the Formula (2) in synthesis of the polyurethane resin is produced and, therefore, it is necessary to suppress such the production of the unsubstituted amino group.

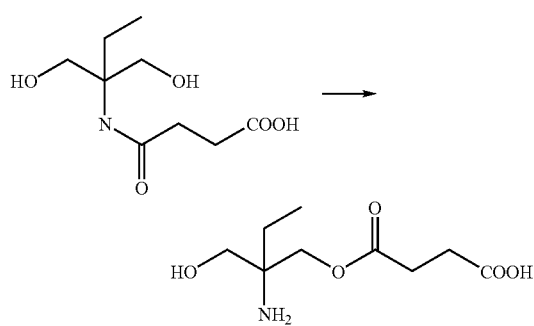

One kind, or two or more kinds of a structure derived from the compound represented by the Formula (1) may be contained in the specified polyurethane resin.

In the specified polyurethane resin, a total content of repetition units derived from the compound represented by the Formula (1) is appropriately determined by a structure thereof, and design of a photosensitive layer to which the polymerizable composition containing the specified polyurethane resin is applied, and is preferably in a range of 1 to 50 mol %, more preferably 10 to 50 mol %, further preferably 15 to 50 mol % based on a total mole amount of polymer components.

—Fundamental Skeleton of Specified Polyurethane Resin—

The specified polyurethane resin is a polyurethane resin containing, as a fundamental skeleton, a structural unit represented by the reaction product of at least one kind of a diisocyanate compound represented by the Formula (I), and at least one kind of a diol compound represented by the following Formula (II). This specified polyurethane resin is synthesized from at least one kind of the compound represented by the Formula (1) as the diol compound represented by the following Formula (II).

$$OCN-X^0-NCO \quad \text{Formula (1)}$$

$$HO-Y^0-OH \quad \text{Formula (II)}$$

In the Formulas (I) and (II), $X^0$ and $Y^0$ each represent independently a divalent organic residue.

The specified polyurethane resin may be synthesized, for example, from the diisocyanate compound and the compound represented by the Formula (1), but a specified polyurethane resin synthesized from a combination of a plurality of kinds of diol compounds including other diol compounds, and the diisocyanate compound in addition to the compound represented by the Formula (1) is preferable from a viewpoint of alkali solubility.

A weight average molecular weight of the specified polyurethane resin, from a viewpoint of image forming property by exposure to light, and printing durability, is preferably 5000 to 500000, more preferably 8000 to 300000, and most preferably 10000 to 150000.

The specified polyurethane resin in the invention preferably comprises a functional group having an unsaturated bond on its side chain. As such the functional group having an unsaturated bond, a group represented by the following Formulas (III) to (V) is preferable, and a group represented by the following Formula (III) is most preferable. Groups represented by the Formulas (III) to (V) are described in detail below.

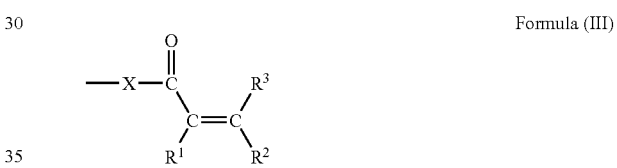

Formula (III)

In the Formula (III), $R^1$ to $R^3$ each represent independently a hydrogen atom or a monovalent organic group. Preferable examples of $R^1$ include a hydrogen atom and an alkyl group optionally having a substituent and, among these, a hydrogen atom and a methyl group are preferable because of high radical reactivity. $R^2$ and $R^3$ each represent independently a hydrogen atom, a halogen atom, an amino group, a carboxyl group, an alkoxycarbonyl group, a sulfo group, a nitro group, a cyano group, an alkyl group optionally having a substituent, an aryl group optionally having a substituent, an alkoxy group optionally having a substituent, an aryloxy group optionally having a substituent, an alkylamino group optionally having a substituent, an arylamino group optionally having a substituent, an alkylsulfonyl group optionally having a substituent, or an arylsulfonyl group optionally having a substituent and, among them, a hydrogen atom, a carboxyl group, an alkoxycarbonyl group, an alkyl group optionally having a substituent, and an aryl group optionally having a substituent are preferable because of high radical reactivity.

In the Formula (III), X represents an oxygen atom, a sulfur atom, or $-N(R^{12})-$, and $R^{12}$ represents a hydrogen atom or a monovalent organic group. Herein, $R^{12}$ includes an alkyl group optionally having a substituent and, among these, a hydrogen atom, a methyl group, an ethyl group, and an isopropyl group are preferable because of high radical reactivity.

Herein, examples of the substituent which can be introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amido group, an alkylsulfonyl group, and an arylsulfonyl group.

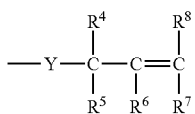

Formula (IV)

In the Formula (IV), $R^4$ to $R^8$ each represent independently a hydrogen atom or a monovalent organic group. $R^4$ to $R^8$ preferably include a hydrogen atom, a halogen atom, an amino group, a dialkylamino group, a carboxyl group, an alkoxycarbonyl group, a sulfo group, a nitro group, a cyano group, an alkyl group optionally having a substituent, an aryl group optionally having a substituent, an alkoxy group optionally having a substituent, an aryloxy group optionally having a substituent, an alkylamino group optionally having a substituent, an arylamino group optionally having a substituent, an alkylsulfonyl group optionally having a substituent, and an arylsulfonyl group optionally having a substituent. Among them, a hydrogen atom, a carboxyl group, an alkoxycarbonyl group, an alkyl group optionally having a substituent, and an aryl group optionally having a substituent are preferable.

Examples of the substituent which can be introduced include the same substituents as those for the Formula (III). Y represents an oxygen atom, a sulfur atom, or —$N(R^{12})$—. $R^{12}$ is as defined in $R^{12}$ for the Formula (III), and preferable examples of $R^{12}$ are as defined for the Formula (III).

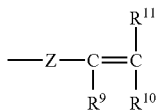

Formula (V)

In the Formula (V), $R^9$ preferably includes a hydrogen atom and an alkyl group optionally having a substituent. Among these, a hydrogen atom and a methyl group are preferable because of high radical reactivity. $R^{10}$ and $R^{11}$ each include independently a hydrogen atom, a halogen atom, an amino group, a dialkylamino group, a carboxyl group, an alkoxycarbonyl group, a sulfo group, a nitro group, a cyano group, an alkyl group optionally having a substituent, an aryl group optionally having a substituent, an alkoxy group optionally having a substituent, an aryloxy group optionally having a substituent, an alkylamino group optionally having a substituent, an arylamino group optionally having a substituent, an alkylsulfonyl group optionally having a substituent, and an arylsulfonyl group optionally having a substituent. Among them, a hydrogen atom. a carboxyl group, an alkoxycarbonyl group, an alkyl group optionally having a substituent, and an aryl group optionally having a substituent are preferable because of high radical reactivity.

Herein, examples of the substituent which can be introduced include the same substituents as those for the Formula (III). Z represents an oxygen atom, a sulfur atom, —$N(R^{13})$—, or a phenylene group optionally having a substituent. $R^{13}$ includes an alkyl group optionally having a substituent. Among these, a methyl group, an ethyl group, and an isopropyl group are preferable because of high radical reactivity.

In order to introduce an unsaturated bond into a side chain of the specified polyurethane resin, when at least one of the diisocyanate compound represented by the Formula (I) and the diol compound represented by the Formula (II) has at least one of groups represented by the Formulas (III) to (V), the specified polyurethane resin in which the group represented by the Formulas (III) to (V) is introduced into a side chain can be obtained as the reaction product of the diisocyanate compound and the diol compound. By such the method, the specific polyurethane resin can be produced more easily than substitution or introduction of a desired side chain after reaction or production of the polyurethane resin.

As the diisocyanate compound which is used for introducing an unsaturated bond into a side chain of the specified polyurethane resin, there is, for example, a product obtained by addition-reacting a triisocyanate compound, and one equivalent of a monofunctional alcohol or a monofunctional amine compound having an unsaturated group.

As the triisocyanate compound, for example, following compounds are exemplified, being not limiting.

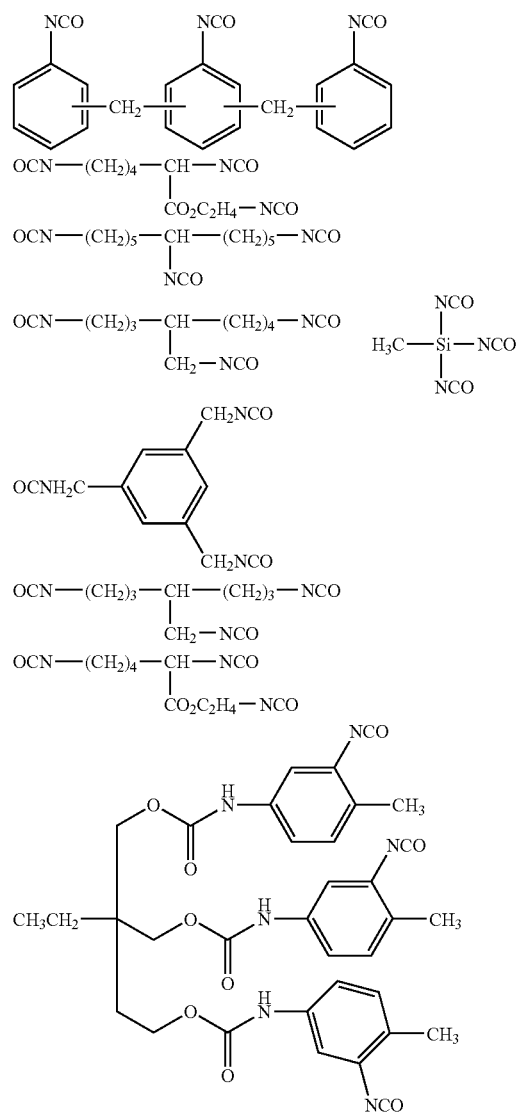

-continued

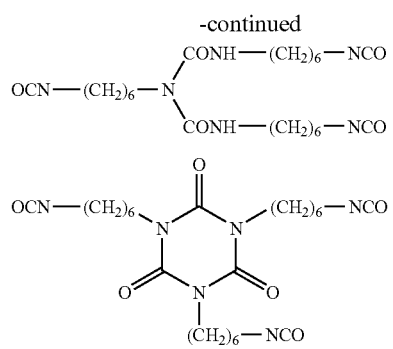

As the monofunctional alcohol or the monofunctional amine compound having an unsaturated group, the following compounds are exemplified, being not limiting.

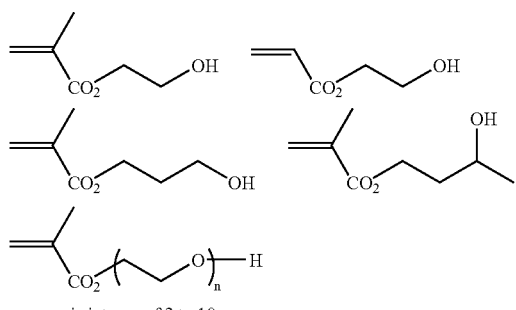

n is integer of 2 to 10

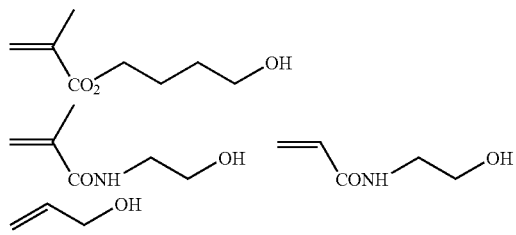

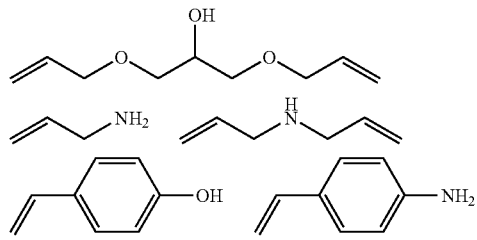

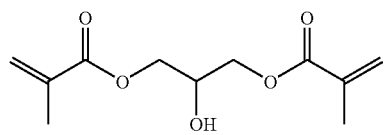

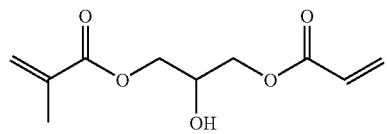

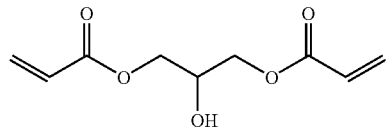

-continued

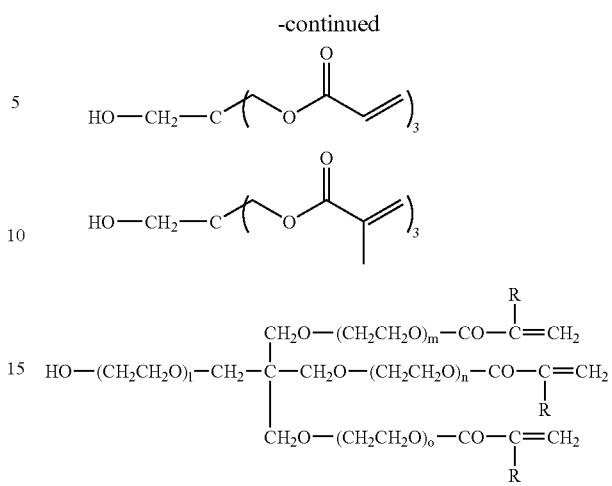

R = hydrogen or methyl group
l, m, n, o = integer of 1 to 20

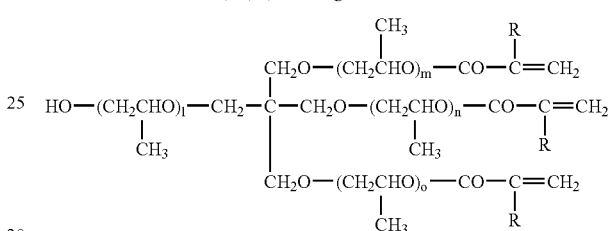

R = hydrogen or methyl group
l, m, n, o = integer of 1 to 20

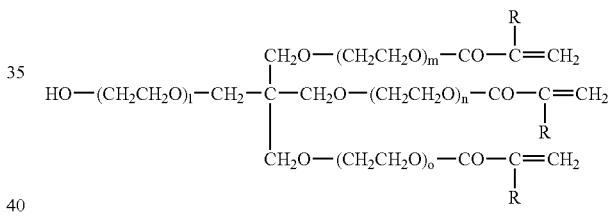

R = hydrogen or methyl group
l, m, n, o = integer of 1 to 20

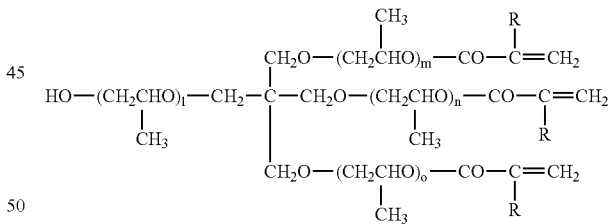

R = hydrogen or methyl group
l, m, n, o = integer of 1 to 20

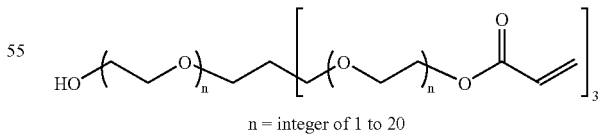

n = integer of 1 to 20

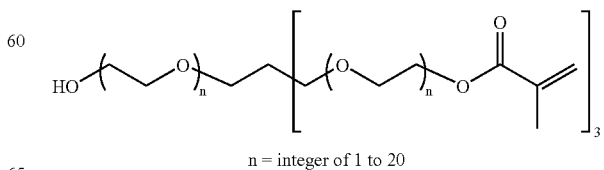

n = integer of 1 to 20

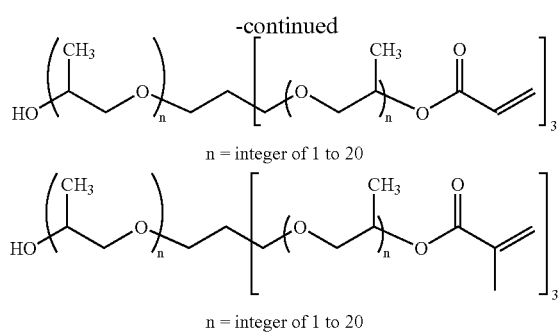

Herein, as the method of introducing an unsaturated group into a side chain of the polyurethane resin, a method of using a diisocyanate compound containing an unsaturated group on a side chain as a raw material of production of the polyurethane resin is suitable. Examples of the diisocyanate compound which can be obtained by addition-reacting a triisocyanate compound, and one equivalent of a monofunctional alcohol or a monofunctional amine compound having an unsaturated group, and having an unsaturated group on a side chain are not limited to, but include the following compounds.

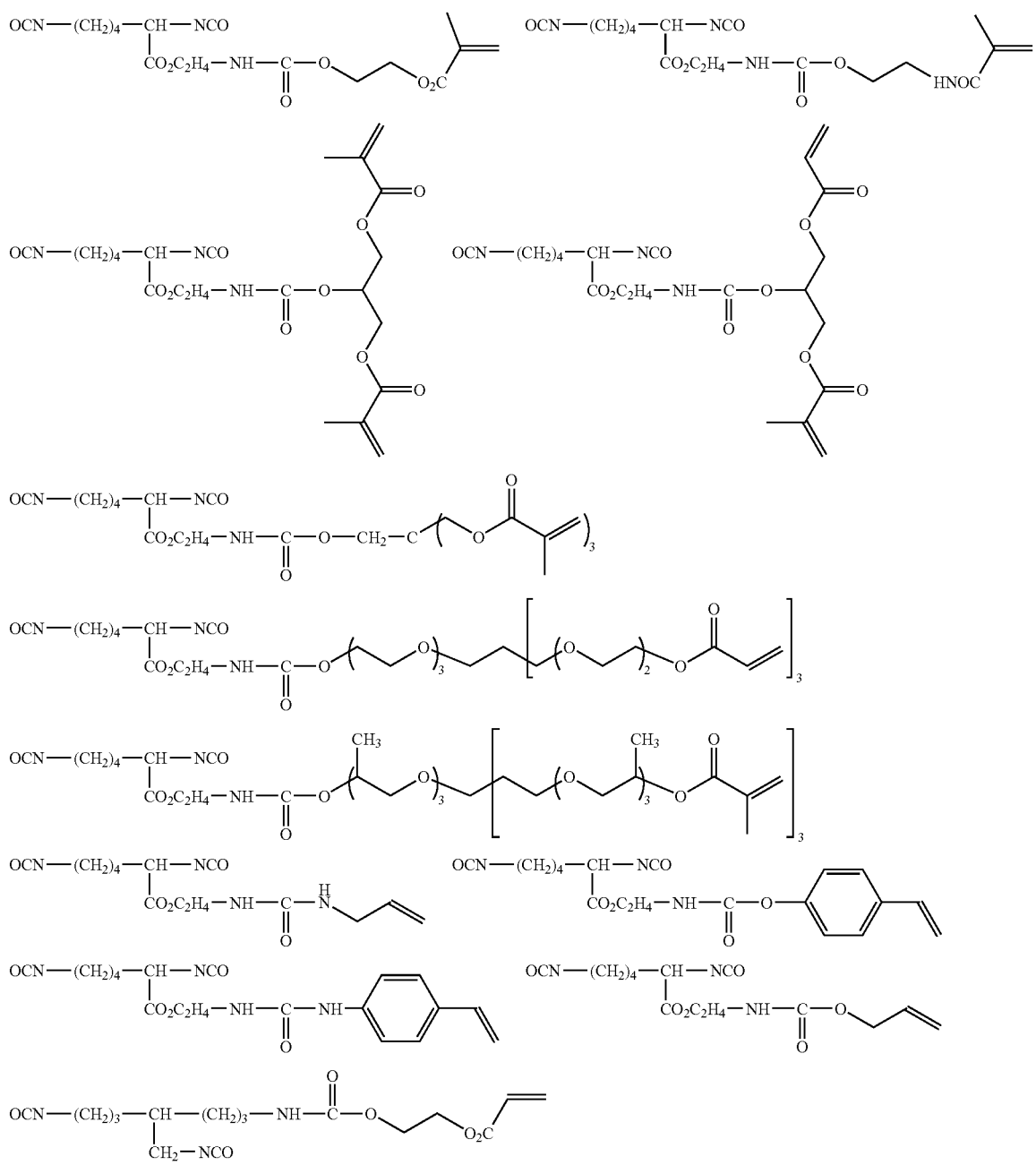

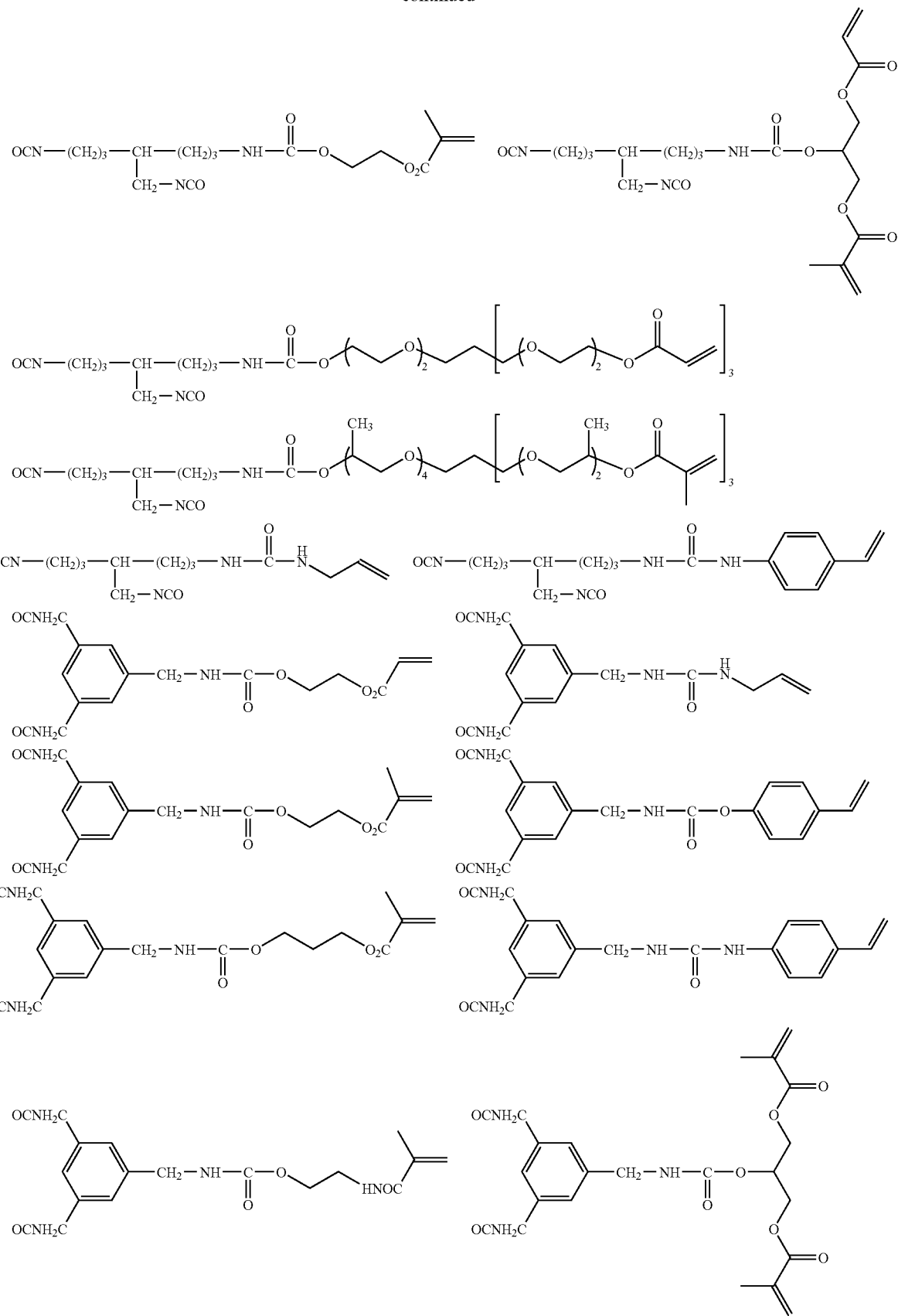

-continued
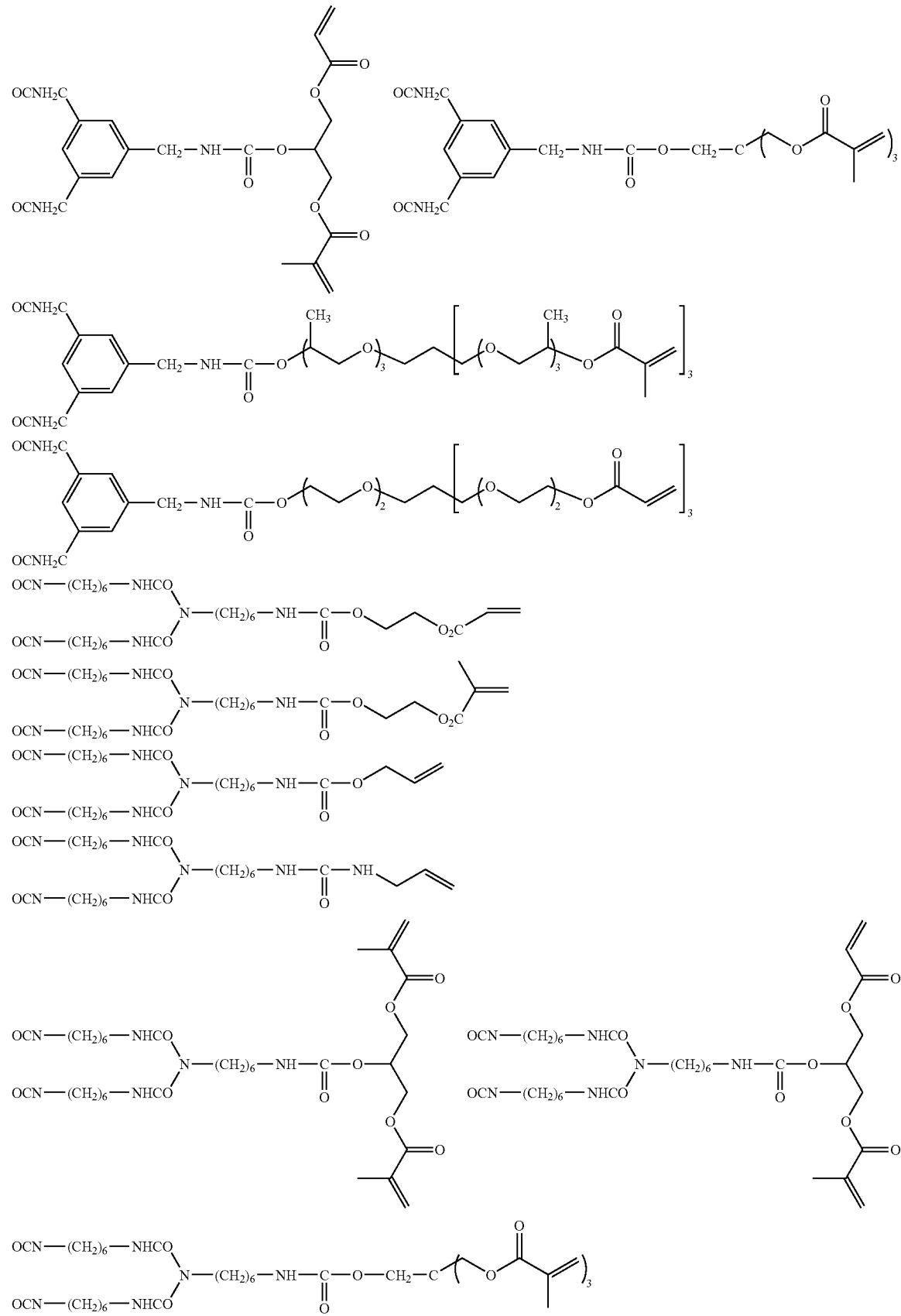

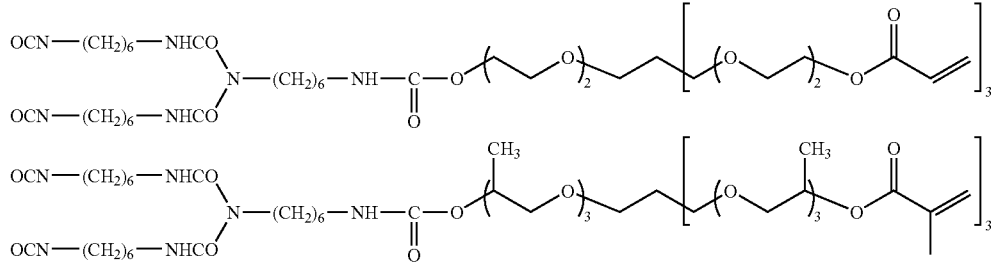

As the method of introducing an unsaturated group into a side chain of the specified polyurethane resin, a method of using a diol compound containing an unsaturated group on a side chain as a raw material of production of the polyurethane resin is also suitable. Such the diol compound may be, for example, a commercially available diol compound such as glycerin monomethacrylate and trimethylolpropane monoallyl ether, or may be a compound easily produced by a reaction of a halogenated diol compound, a triol compound or an aminodiol compound, and carboxylic acid, acid chloride, isocyanate, alcohol, amine, thiol or halogenated alkyl compound having an unsaturated group. Specific examples of these compounds include compounds described in JP-A No. 2002-251008, paragraphs [0064] to [0066].

In production of the specified polyurethane resin, the previously known other diisocyanate compounds and other diol compounds in addition to the aforementioned compounds may be used in combination with the compound represented by the Formula (1), or the compound represented by the Formula (2) which is one exemplary embodiment thereof, without any limitation in such a range that the effect or the advantage of the invention is not deteriorated. Specifically, examples include compounds described in "Polymer Data Handbook-Basic Version-(edited by the Society of Polymer Science, Japan, BAIFUKAN CO., LTD, 1986)". These other diisocyanate compounds, and other diol compounds may be used alone, or may be used by combining two or more kinds, respectively.

Examples of other diisocyanate compound include aromatic diisocyanate compounds such as 2,4-tolylene diisocyanate, a dimer of 2,4-tolylene diisocyanate, 2,6-tolylene diisocyanate, p-xylene diisocyanate, m-xylene diisocyanate, 4,4'-diphenylmethane diisocyanate, 1,5-naphthylene diisocyanate, and 3,3'-dimethylbiphenyl-4,4'-diisocyanate; aliphatic diisocyanate compounds such as hexamethylene diisocyanate, trimethylhexamethylene diisocyanate, lysine diisocyanate, and dimer acid diisocyanate; alicyclic diisocyanate compounds such as isophorone diisocyanate, 4,4'-methylenebis (cyclohexylisocyanate), methylcyclohexane-2,4 (or 2,6) diisocyanate, and 1,3-(isocyanatemethyl)cyclohexane; diisocyanate compounds which are a reaction product of diol and diisocyanate such as an adduct of 1 mole of 1,3-butylene glycol and 2 moles of tolylene diisocyanate.

Examples of other diol compounds include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1, 3-pentanediol, 1,4-bis-β-hydroxyethoxycyclohexane, cyclohexanedimethanol, tricyclodecanedimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenated bisphenol A, hydroquinonedihydroxyethyl ether, p-xylene glycol, dihydroxyethylsulfone, bis(2-hydroxyethyl)-2,4-tolylene dicarbaniate, 2,4-tolylene-bis(2-hydroxyethylcarbamide), bis(2-hydroxyethyl)-m-xylene dicarbamate, bis(2-hydroxyethyl) isophthalate, 1,3-propanediol, 1,4-butanediol, 1,5-pentanediol, 1,6-hexanediol, 1,7-heptanediol, 1,8-octanediol, 2-butene-1,4-diol, cis-2-butene-1,4-diol, trans-2-butene-1,4-diol, catechol, resorcine, hydroquinone, 4-methylcatechol, 4-t-butylcatechol, 4-acetylcatechol, 3-methoxycatechol, 4-phenylcatechol, 4-methylresorcine, 4-ethylresorcine, 4-t-butylresorcine, 4-hexylresorcine, 4-chlororesorcine, 4-benzylresorcine, 4-acetylresorcine, 4-carbomethoxyresorcine, 2-methylresorcine, 5-methylresorcine, t-butylhydroquinone, 2,5-di-t-butylhydroquinone, 2,5-di-t-amylhydroquinone, tetramethylhydroquinone, tetrachlorohydroquinone, methylcarboaminohydroquinone, methylureidohydroquinone, methylthiohydroquinone, benzoylbornene-3,6-diol, bisphenol A, bisphenol S, 3,3'-dichlorobisphenol S, 4,4'-dihydroxybenzophenone, 4,4'-dihydroxybiphenyl, 4,4'-thiodiphenol, 2,2'-dihydroxydiphenylmethane, 3,4-bis(p-hydroxyphenyl) hexane, 1,4-bis(2-(p-hydroxyphenyl)propyl)benzene, bis(4-hydroxyphenyl)methylamine, 1,3-dihydroxynaphthalene, 1,4-dihydroxynaphthalerie, 1,5-dihydroxynaphthalene, 2,6-dihydroxynaphthalene, 1,5-dihydroxyantliraquinone, 2-hydroxybenzyl alcohol, 4-hydroxybenzyl alcohol, 2-hydroxy-3,5-di-t-butylbenzyl alcohol, 4-hydroxy-3,5-di-t-butylbenzyl alcohol, 4-hydroxyphenethyl alcohol, 2-hydroxyethyl-4-hydroxybenzoate, 2-hydroxyethyl-4-hydroxyphenyl acetate, resorcinemono-2-hydroxyethyl ether, diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, Polyethylene glycol having a weight average molecular weight of 1000, polyethylene glycol having a weight average molecular weight of 1500, polyethylene glycol having a weight average molecular weight of 2000, polyethylene glycol having a weight average molecular weight of 3000, polyethylene glycol having a weight average molecular weight of 7500, polypropylene glycol having a weight average molecular weight of 400, polypropylene glycol having a weight average molecular weight of 700, polypropylene glycol having a weight average molecular weight of 1000, polypropylene glycol having a weight average molecular weight of 2000, polypropylene glycol having a weight average molecular weight of 3000, polypropylene glycol having a weight average molecular weight of 4000, polyether diol compounds such as PTMG650, PTMG1000, PTMG20000, PTMG3000, NEWPOL PE-61, NEWPOL PE-62, NEWPOL, PE-64, NEWPOL, PE-68, NEWPOL PE-71, NEWPOL PE-74, NEWPOL PE-75, NEWPOL PE-78, NEWPOL PE-108, NEWPOL PE-128, NEWPOL BPE-20, NEWPOL BPE-20F, NEWPOL BPE-20NK, NEWPOL BPE-20T, NEWPOL, BPE-20G, NEWPOL BPE-40, NEWPOL BPE-60, NEWPOL BPE-100, NEWPOL BPE-180, NEWPOL BP-2P, NEWPOL BPE-23P, NEWPOL BPE-3P, NEWPOL BPE-5P, NEWPOL 50HB-100, NEWPOL, 50HB-260, NEWPOL 50HB-400, NEWPOL 50HB-660, NEWPOL 50HB-2000, and NEWPOL, 50HB-5100 manufactured by Sanyo Chemical Industries, Ltd., and, further, polyester diol compounds and polycarbonate diol compounds.

Alternatively, they may be used by combining with a diol compound containing a carboxyl group such as 3,5-dihydroxybenzoic acid, 2,2-bis(hydroxymethyl)propionic acid, 2,2-bis(2-hydroxyurea)propionic acid, 2,2-bis(3-hydroxypropyl)propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine, and N,N-bis(2-hydroxyethyl)-3-carboxy-propionamid.

Further, aliphatic diamine compounds such as ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl)methylamine, 1,3-bis(3-aminopropyl)tetramethylsiloxane, piperazine, 2,5-dimethylpiperazine, N-(2-aminoethyl)piperazine, 4-amino-2,2,6,6-tetramethylpiperidine, N,N-dimethylethylenediamine, lysine, L-cystine, and isophoronediamine; aromatic diamine compounds such as o-phenylenediamine, m-phenylenediamine, p-phenylenediamine, 2,4-tolylenediamine, benzidine, o-ditoluidine, o-dianisidine, 4-nitro-m-phenylenediamine, 2,5-dimethoxy-p-phenylenediamine, bis-(4-aminophenyl)sulfone, 4-carboxy-o-phenylenediamine, 3-carboxy-m-phenylenediamine, 4,4'-diaminophenyl ether, and 1,8-naphthalenediamine; heterocyclic amine compounds such as 2-aminoimidazole, 3-aminetriazole, 5-amino-1H-tetrazole, 4-aminopyrazole, 2-aminobenzimidazole, 2-amino-5-carboxy-triazole, 2,4-diamino-6-methyl-s-triazine, 2,6-diaminopyridine, 1-histidine, DL-tryptophan, and adenine; amino alcohols and amino phenol compounds such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycine, 2-aminobenzyl alcohol, 4-aminophenethyl alcohol, 2-carboxy-5-amino-1-naphthol, and L-tyrosine can be also used.

In addition, a urethane polymer obtained by capping an unreacted terminal isocyanate group with a radical polymerizable group-containing alcohol compound to stop a reaction further improves printing durability, being more preferable. Examples of the radical polymerizable group-containing alcohol compound include 2-hydroxyethyl(meth)acrylate, 2-hydroxypropyl(meth)acrylate, 2-hydroxy-3-chloropropyl(meth)acrylate, 2-hydroxy-3-allyloxypropyl(meth)acrylate, 2-hydroxy-3-phenoxypropyl(meth)acrylate, 4-hydroxybutyl(meth)acrylate, glycerol diacrylate, glycerol acrylate methacrylate, glycerol dimethacrylate, pentaerythritol triacrylate, and tris(acryloyloxyethyl) isocyanurate.

An acid value of the specified polyurethane resin, from a viewpoint of suppression of generation of a development scum, is preferably 0.3 meq/g to 1.4 meq/g, and more preferably 0.5 meq/g to 0.9 meq/g.

The specified polyurethane resin contained in the polymerizable composition of the invention is a novel polyurethane resin synthesized from the compound represented by the Formula (1) having a carboxylic acid group and an amido group having higher hydrophilicity than that of an ester bond as the diol compound which is a raw material, and has the property that it is excellent in solubility in an alkali developer, and dose not generate precipitation of the polymer with time in a developer after development. A method of synthesizing the specified polyurethane resin which is a novel compound, and date for identifying it will be explicitly shown in Examples described later.

In the polymerizable composition of the invention, the specified polyurethane resins may be used alone, or in combination of plural of them.

A content of the specified polyurethane resin in the polymerizable composition of the invention is preferably 4 to 50% by mass, further preferably 10 to 30% by mass in terms of a solid content.

In the polymerizable composition of the invention, in addition to the specified polyurethane resin, one or more kinds of other alkali-soluble binder polymers may be used in combination in such a range that the effect or the advantage of the invention is not deteriorated.

It is preferable that other binder polymer usable in combination is used in a range of 1 to 60% by mass, preferably 1 to 40% by mass, and further preferably 1 to 20% by mass based on a total amount of all binder polymer components.

As another binder polymer that can be used in combination, conventionally-known polymers can be used without limitation. Examples include an acryl main chain binder, a urethane binder, and an acetal-modified polyvinyl alcohol-based resin (butyral resin etc.), and an acryl main chain binder, and a urethane binder are preferably used.

In the polymerizable composition of the invention, a total content of all binder polymers, that is, in the case of the specified polyurethane resin alone, a content thereof and, in the case used in combination with other binder polymer, a total amount of the specified polyurethane resin and the binder polymer to be used in combination can be appropriately determined. Particularly, when the polymerizable composition is used as a photosensitive layer of a planographic printing plate precursor described later, the content is in a range of usually 10 to 90% by mass, preferably 20 to 80% by mass, further preferably 30 to 70% by mass based on a total mass of nonvolatile components in the polymerizable composition.

(Compound Having Ethylenic Unsaturated Bond)

The compound having addition polymerizable ethylenic unsaturated bond for use in the invention is an addition polymerizable compound having at least one ethylenic unsaturated double bond, and is selected from compounds having at least one ethylenic unsaturated bond, and is preferably selected from compounds having two or more ethylenic unsaturated bonds. The compound group is widely known in the industrial field of the art, and any one belonging thereto it may be used in the invention with no specific limitation. For example, the compounds in the group may have one selected from various chemical morphologies of monomers, prepolymers, or (that is, dimers, trimers and oligomers), as well as their mixtures and copolymers. Examples of the monomers and their copolymers include unsaturated carboxylic acids (for example, acrylic acid, methacrylic acid, itaconic acid, crotonic acid, isocrotonic acid, and maleic acid) and their esters, and amides. Preferred for use hereinable examples thereof are include esters of unsaturated carboxylic acids and aliphatic polyvalent alcohols, and amides of unsaturated carboxylic acids and aliphatic polyvalent amines. Preferable examples thereof further include: Also preferred for use herein are addition-reaction products of an unsaturated carboxylates carboxylic acid ester or amides having a nucleophilic substituent such as a hydroxyl group, an amino grouor a mercapto group and a monofunctional or polyfunctional isocyanates or an epoxides; and dehydrating condensation products of an unsaturated carboxylic acid ester or amide having a nucleophilic substituent such as a hydroxyl group, an amino grouor a mercapto group and thereof with monofunctional or polyfunctional carboxylic acids. Preferable examples thereof further include: In addition, also preferred are addition-reaction products of an unsaturated carboxylates or amides having an electrophilic substituent such as an isocyanate group or an epoxy group and a monofunctional or polyfunctional alcohols, amines or thiols; and substitution-reaction products of an unsaturated carboxylates or amides having a removable substituent such as a halogen or a tosyloxy group and a monofunctional or polyfunctional alcohols, amines or thiols. Preferable examples thereof further include compounds formed by using As other examples, the above-described unsaturated carboxylic acids may be replaced with unsaturated phosphonic acids, styrenes or vinyl ethers in place of the unsaturated carboxylic acids, and the compounds of those groups are also usable herein.

Specific examples of monomer, which is the ester of an aliphatic polyvalent alcohol compound and an unsaturated carboxylic acid, include acrylic esters such as ethylene glycol diacrylate, triethylene glycol diacrylate, 1,3-butanediol diacrylate, tetramethylene glycol diacrylate, propylene glycol diacrylate, neopentylglycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomers, and the likeor the like;

methacrylic esters such as tetramethylene glycol dimethacrylate, triethylene glycol dimethacrylate, neopentylglycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy)phenyl]dimethyl methane, bis-[p-(methacryloxyethoxy)phenyl] dimethyl methane, and the likeor the like;

itaconate esters such as ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, and the likeor the like;

crotonate esters such as ethylene glycol dicrotonate, tetramethylene glycol dicrotonate, pentaerythritol dicrotonate, sorbitol tetradicrotonate, and the likeor the like;

isocrotonate esters such as ethylene glycol diisocrotonate, pentaerythritol diisocrotonate, sorbitol tetraisocrotonate, and the likeor the like; and maleate esters such as ethylene glycol dimalate, triethylene glycol dimalate, pentaerythritol dimalate, sorbitol tetramaleate, and the likeor the like.

Examples of other esters preferably used include the aliphatic alcohol esters described in JP-B No. 46-27926, JP-B No. 51-47334, JP-A No. 57-196231; the aromatic skeleton-containing esters described in JP-A No. 59-5240, JP-A No. 59-5241, JP-A No. 2-226149; the amino group-containing esters described in JP-A No. 1-165613; and the like.

Specific examples of the amide monomer consisting of an aliphatic polyvalent amine compound and an unsaturated carboxylic acid include methylene bis-acrylamide, methylene bis-methacrylamide, 1,6-hexamethylene bis-acrylamide, 1,6-hexamethylene bis-methacrylamide, diethylenetriamine trisacrylamide, xylylene bisacrylamide, xylylene bis-methacrylamide, and the like.

Examples of other preferable amide monomers include the monomers having a cyclohexylene structure described in JP-B No. 54-21726.

Urethane addition-polymerizable compounds produced in addition reaction between an isocyanate and a hydroxyl group are also preferable, and specific examples thereof include the vinyl urethane compounds containing two or more polymerizable vinyl groups in the molecule, which are produced by addition of a polyisocyanate compound having two or more isocyanate groups in the molecule and a hydroxyl group-containing vinyl monomer represented by the following Formula (1), described in JP-B No. 48-41708.

$$CH_2=C(R^4)COOCH_2CH(R^5)OH \qquad (i)$$

In the Formula (i), $R^4$ and $R^5$ each represent independently a hydrogen atom or a methyl group.

Also preferable are the urethane acrylates described in JP-A No. 51-37193 and JP-B Nos. 2-32293 and 2-16765; and the urethane compounds having an ethylene oxide skeleton described in JP-B Nos. 58-49860, 56-17654, 62-39417, and 62-39418.

In addition, utilization of addition-polymerizable compounds having an amino structure or a sulfide structure in the molecule described in JP-A No. 63-277653, JP-A No. 63-260909, or JP-A No. 1-105238 may provide a photopolymerizable compound having excellent applicability in high-speed sensitization.

Other preferable examples thereof include polyfunctional acrylates and methacrylates such as the polyester acrylates and epoxyacrylates obtained in reaction of an epoxy resin with acrylic acid or methacrylic acid described in JP-A No. 48-64183, and JP-B Nos. 49-43191 or 52-30490. Still another examples thereof include the particular unsaturated compounds described in JP-B Nos. 46-43946, 1-40337, or 1-40336, the vinylphosphonic acid compounds described in JP-A No. 2-25493, and the like. In addition, the structures containing a perfluoroalkyl group described in JP-A No. 61-22048 are used preferably in some cases. Further, the photo-curing monomers and oligomers described in J. Adhesion Soc. Jpn. Vol. 20, No. 7, pp. 300-308 (1984) can be also preferably used.

Regarding these addition polymerizable compounds, details regarding the structure thereof and methods of use such as whether they are used singly or in combination, and the addition amount thereof, can be set as necessary in accordance with the intended ultimate performance of the polymerizable composition. For example, when the polymerizable composition of the invention is used as a recording layer (photosensitive layer) of a negative planographic printing plate precursor, the following viewpoints are considered. From the viewpoint of photosensitive speed, a structure having a larger unsaturated group content per molecule is preferable and, in many cases, difunctionality or higher is preferable. In addition, in order to enhance the strength of an image part, that is, of a cured film, trifunctionality or higher is favorable, and a method of regulating both of photosensitivity and strength by using in combination addition polymerizable compounds having different functionality numbers/different polymerizable groups (e.g., acrylic acid ester, methacrylic acid ester, styrene-based compound, vinyl ether-based compound) is also effective. While compounds having a large molecular weight and compounds having high hydrophobicity are excellent in photosensitive speed and film strength, these are not preferable in terms of developing speed or precipitation in a developer in some cases. In addition, regarding compatibility with other components (e.g., a binder polymer such as component (A) a light or thermal polymerization initiator such as component (C) or a colorant etc.) in the photosensitive layer, and dispersibility, selection of the addition polymerizable compound and methods of use thereof are important factors. For example, use of a low purity compound, or combined use of two or more kinds improves compatibility in some cases.

Addition polymerizable compounds may be used alone, or two or more kinds may be used in combination.

A content of the addition polymerizable compound in the polymerizable composition of the invention is in a range of preferably 5 to 80% by mass, further preferably 25 to 75% by mass based on a nonvolatile component.

The polymerizable composition of the invention can be suitably used in a recording layer (photosensitive layer) of the planographic printing plate precursor and, when used in such the utility, the addition polymerizable compound having a specified structure can be also selected for the purpose of improving adhesion property of a support and an overcoating layer of such the planographic printing plate precursor. Regarding an incorporation ratio of the addition polymerizable compound in the photosensitive layer, a larger ratio is advantageous in sensitivity, but when the ratio is too large, problems such as undesired phase separation of a composition, a problem of a production step due to tackiness of the photosensitive layer (e.g. deteriorated production derived from transference or adhesion of a photosensitive layer component), and precipitation from a developer may arise.

From these viewpoints, the addition polymerizable compound contained in the photosensitive layer of the planographic printing plate precursor is in a range of preferably 5 to 80% by mass, further preferably 25 to 75% by mass based on a total mass of the addition polymerizable compound and the binder polymer contained in the photosensitive layer.

Besides, in the method of using the addition polymerizable compound, an appropriate structure, incorporation and addition amount can be arbitrarily selected from a viewpoint of a magnitude of polymerization inhibition by oxygen, resolution, fogging property, refractive index change, and surface tackiness. Depending on the case, layer construction/coating method such as undercoating and overcoating, that is, an aspect of inclusion in a layer adjacent to the photosensitive layer may be implemented without inclusion in the photosensitive layer itself.

[Photo or Thermal Polymerization Initiator]

The polymerizable composition of the invention contains a polymerization initiator capable of generating an initiation species which causes and promotes a curing reaction of the addition polymerizable compound by energy impartation by either or both of exposure to light, and heating.

(Photo-Polymerization Initiator)

As the photopolymerization initiator for use in the invention, known photopolymerization initiators disclosed in patents or literatures, and the combination of two or more kinds of photopolymerization initiators (photopolymerization initiation system) can be suitably selected in consideration of the wavelength of the light source to be used.

In the case where a blue semiconductor laser, an Ar laser, a second harmonic of an infrared semiconductor laser or an SHG-YAG laser is used as a light source, various kinds of photopolymerization initiators (photopolymerization systems) have been proposed. Examples thereof include a certain kind of a photoreducing dye, for example, Rose Bengal, eosin or erythrocin disclosed in U.S. Pat. No. 2,850,445, a system of a combination of a dye and an initiator, for example, a complex initiating system of a dye and an amine (JP-B No. 44-20189), a combination system of hexaarylbiimidazole, a radical generator and a dye (JP-B No. 45-37377), a system of hexaarylbiimidazole and p-dialkylaminobenzylidene ketone (JP-B No. 47-2528 and JP-A No. 54-155292), a system of a cyclic cis-α-dicarbonyl compound and a dye (JP-A No. 48-84183), a system of a cyclic triazine and a merocyanine dye (JP-A No. 54-151024), a system of 3-ketocoumarin and an activator (JP-A No. 52-112681 and JP-A No. 58-15503), a system of biimidazole, a styrene derivative and thiol (JP-A No. 59-140203), a system of an organic peroxide and a dye (JP-A No. 59-1504, JP-A No. 59-140203, JP-A No. 59-189340, JP-A No. 62-174203, JP-B No. 62-1641 and U.S. Pat. No. 4,766,055), a system of a dye and an active halogen compound (JP-A No. 63-1718105, JP-A No. 63-258903 and JP-A No. 3-264771), a system of a dye and a borate compound (JP-A No. 62-143044, JP-A No. 62-150242, JP-A No. 64-13140, JP-A No. 64-13141, JP-A No. 64-13142, JP-A No. 64-13143, JP-A No. 64-13144, JP-A No. 64-17048, JP-A No. 1-229003, JP-A No. 1-298348 and JP-A No. 1-138204), a system of a dye having a rhodanine ring and a radical generator (JP-A No. 2-179643 and JP-A No. 2-244050), a system of titanocene and a 3-ketocoumarin dye (JP-A No. 63-221110), a system of combining titanocene, a xanthene dye and an addition polymerizable ethylenic unsaturated compound containing an amino group or a urethane group (JP-A No. 4-221958 and JP-A No. 4-219756), a system of titanocene and a specific merocyanine dye (JP-A No. 6-295061), and a system of titanocene and a dye having a benzopyran ring (JP-A No. 8-334897).

The particularly preferable photopolymerization initiator (system) according in the invention includes at least one titanocene compound. Titanocene compounds for use in the invention are not particularly limited, and any compound can be used as long as it can generate active radicals when irradiated with light in the coexistence with other sensitizing dye. For example, known compounds disclosed in JP-A No. 59-152396, JP-A No. 61-151197, JP-A No. 63-41483, JP-A No. 63-41484, JP-A No. 2-249, JP-A No. 2-291, JP-A No. 3-27393, JP-A No. 3-12403 or JP-A No. 6-41170 can be arbitrarily used.

Further examples include di-cyclopentadienyl-Ti-di-chloride, di-cyclopentadienyl-Ti-bis-phenyl, di-cyclopentadienyl-Ti-bis-2,3,4,5,6-pentafluorophen-1-yl (hereinafter, also referred to as "T-1"), di-cyclopentadienyl-Ti-bis-2,3,5,6,-tetrafluorophen-1-yl, di-cyclopentadienyl-Ti-bis-2,4,6-trifluorophen-1-yl, di-cyclopentadienyl-Ti-bis-2,6-difluorophen-1-yl, di-cyclopentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,4-difluorophen-1-yl, and bis(cyclopentadienyl)-bis(2,6-difluoro-3-(pyr-1-yl)phenyl)titanium (hereinafter, also referred to as "T-2").

(Thermal Polymerization Initiator)

As a thermal polymerization initiator for initiating and progressing a curing reaction of the addition polymerizable compound, used in the invention, a thermal degradation-type radical generator which is degraded by heat to generate a radical is useful. Such the radical generator is such that, by using in combination the aforementioned infrared absorbing agent, the infrared absorbing agent produces heat upon infrared laser irradiation, a radical is generated by the heat, and a combination of them enables recording.

Examples of the radical generator include an onium salt, a triazine compound having a trihalomethyl group, a peroxide, an azo-based polymerization initiator, azide compound, quinone diazide, an oxime ester compound, and a triarylmonoalkyl borate compound, and the onium salt or the oxime ester compound is highly sensitive, being preferable. The onium salt which can be suitably used as the polymerization initiator in the invention will be explained below. Examples of the preferable onium salt include an iodonium salt, a diazonium salt, and a sulfonium salt. In the invention, these onium salts function not as an acid generator, but as an initiator of radical polymerization. Onium salts which are suitably used in the invention are onium salts represented by the following Formulas (A) to (C).

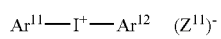 Formula (A)

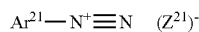 Formula (B)

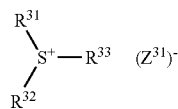 Formula (C)

In the Formula (A), $Ar^{11}$ and $Ar^{12}$ each represent independently an aryl group of a carbon number of 20 or less optionally having 1 to 6 substituents, and examples of a preferable substituent include an alkyl group of a carbon number of 1 to 12, an alkenyl group of a carbon number of 1 to 12, an alkynyl group of a carbon number of 1 to 12, an aryl group of a carbon number of 1 to 12, an alkoxy group of a carbon number of 1 to 12, an aryloxy group of a carbon number of 1 to 12, a halogen atom, an alkylamino group of a carbon number of 1 to 12, a dialkylamino group of a carbon number of 1 to 12, an alkylamido group or an arylamido group of a carbon number of 1 to 12, a carbonyl group, a carboxyl group, a cyano group, a sulfonyl group, a thioalkyl group of a carbon number of 1 to 12, and a thioaryl group of a carbon number of 1 to 12.

$(Z^{11})^-$ represents a monovalent anion such as a halogen ion, a perchlorate ion, a hexafluorophosphate ion, a tetrafluoroborate ion, a sulfonic acid ion, a sulfinic acid ion, a thiosulfonic acid ion, and a sulfate ion. From a viewpoint of stability and reactivity, a perchlorate ion, a hexafluorophosphate ion, a tetrafluoroborate ion, a sulfonic acid ion, and a carboxylic acid ion are preferable.

In the Formula (B), $Ar^{21}$ represents an aryl group of a carbon number of 20 or less optionally having 1 to 6 substituents, and examples of a preferable substituent include an alkyl group of a carbon number of 1 to 12, an alkenyl group of a carbon number of 1 to 12, an alkynyl group of a carbon number of 1 to 12, an aryl group of a carbon number of 1 to 12, an alkoxy group of a carbon number of 1 to 12, an aryloxy group of a carbon number of 1 to 12, a halogen atom, an alkylamino group of a carbon number of 1 to 12, a dialkylamino group of a carbon number of 1 to 12, an alkylamido group or an arylamido group of a carbon number of 1 to 12, a carbonyl group, a carboxyl group, a cyano group, a sulfonyl group, a thioalkyl group of a carbon number of 1 to 12, and a thioaryl group of a carbon number of 1 to 12.

$(Z^{21})^-$ represents a monovalent anion such as a halogen ion, a perchlorate ion, a hexafluorophosphate ion, a tetrafluoroborate ion, a sulfonic acid ion, a sulfinic acid ion, a thiosulfonic acid ion, and a sulfate ion. From a viewpoint of stability and reactivity, a perchlorate ion, a hexafluorophosphate ion, a tetrafluoroborate ion, a sulfonic acid ion, and a sulfinic acid ion are preferable.

In the Formula (C), $R^{31}$, $R^{32}$ and $R^{33}$ each represent independently an aryl group, or an alkyl group, an alkenyl group, or an alkynyl group of a carbon number of 20 or less optionally having 1 to 6 substituents and, preferably from a viewpoint of reactivity and stability, an aryl group is desirable. Examples of a preferable substituent include an alkyl group of a carbon number of 1 to 12, an alkenyl group of a carbon number of 1 to 12, an alkynyl group of a carbon number of 1 to 12, an aryl group of a carbon number of 1 to 12, an alkoxy group of a carbon number of 1 to 12, an aryloxy group of a carbon number of 1 to 12, a halogen atom, an alkylamino group of a carbon number of 1 to 12, a dialkylamino group of a carbon number of 1 to 12, an alkylamido group or an arylamido group of a carbon number of 1 to 12, a carbonyl group, a carboxyl group, a cyano group, a sulfonyl group, a thioalkyl group of a carbon number of 1 to 12, and a thioaryl group of a carbon number of 1 to 12.

$Z^{31-}$ represents a monovalent anion such as a halogen ion, a perchlorate ion, a hexafluorophosphate ion, a tetrafluoroborate ion, a sulfonic acid ion, a sulfinic acid ion, a thiosulfonic acid ion, and a sulfate ion. From a viewpoint of stability and reactivity, a perchlorate ion, a hexafluorophosphate ion, a tetrafluoroborate ion, a sulfonic acid ion, a sulfinic acid ion, and a carboxylic acid ion are preferable. Particularly, a carboxylic acid ion of JP-A No. 2001-343742, further preferably a carboxylic acid ion of JP-A No. 2002-148790 is preferable.

Examples of the onium salt which can be suitably used as the polymerization initiator (radical generator) in the invention include those described in JP-A No. 2007-62051. As an example of the polymerization initiator which can be suitably used in the invention, onium salts represented by the Formula (A) (I-1) to (I-28), onium salts represented by the Formula (B) [ON-1] to [ON-5], and onium salts represented by the Formula (C) (S-1) to (S-17) are exemplified, being not limiting.

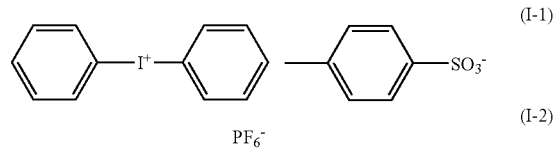

-continued
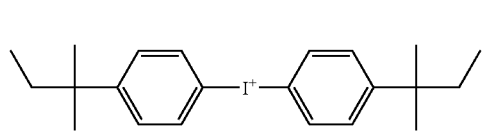 (I-3)
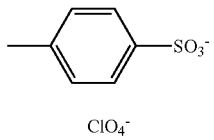
ClO₄⁻ (I-4)
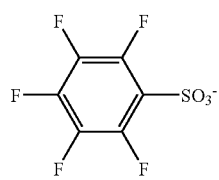
CF₃SO₃⁻ (I-5)
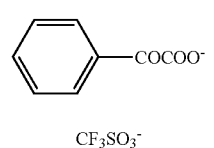 (I-6)
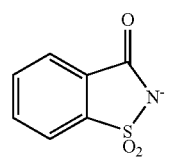 (I-7)
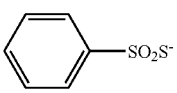 (I-8)
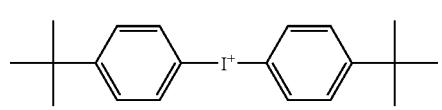
ClO₄⁻ (I-9)
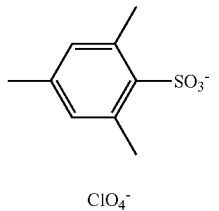 (I-10)
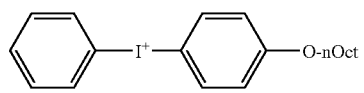
CF₃COO⁻ (I-11)
CF₃SO₃⁻ (I-12)
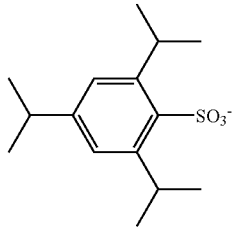 (I-13)
(I-14)
-continued
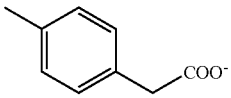 (I-15)
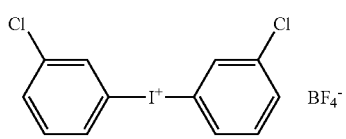 BF₄⁻ (I-16)
 (I-17)
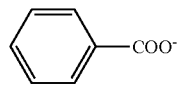 (I-18)
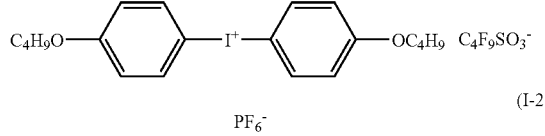 C₄F₉SO₃⁻ (I-19)
PF₆⁻ (I-20)
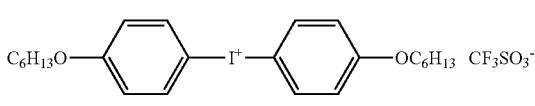 CF₃SO₃⁻ (I-21)
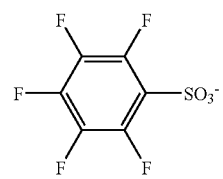 (I-22)
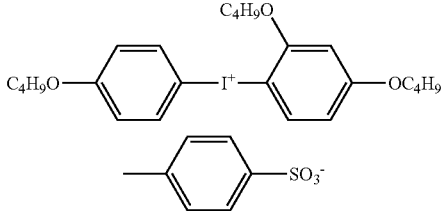 (I-23)
PF₆⁻ (I-24)
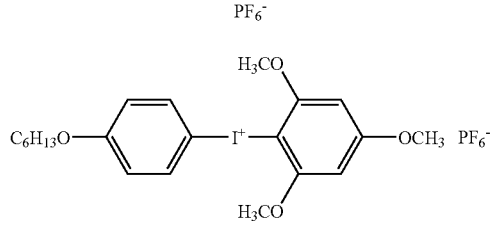 PF₆⁻ (I-25)
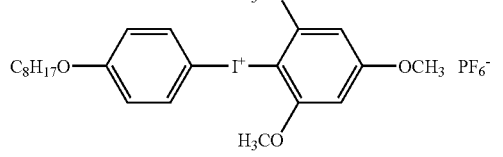 PF₆⁻ (I-26)

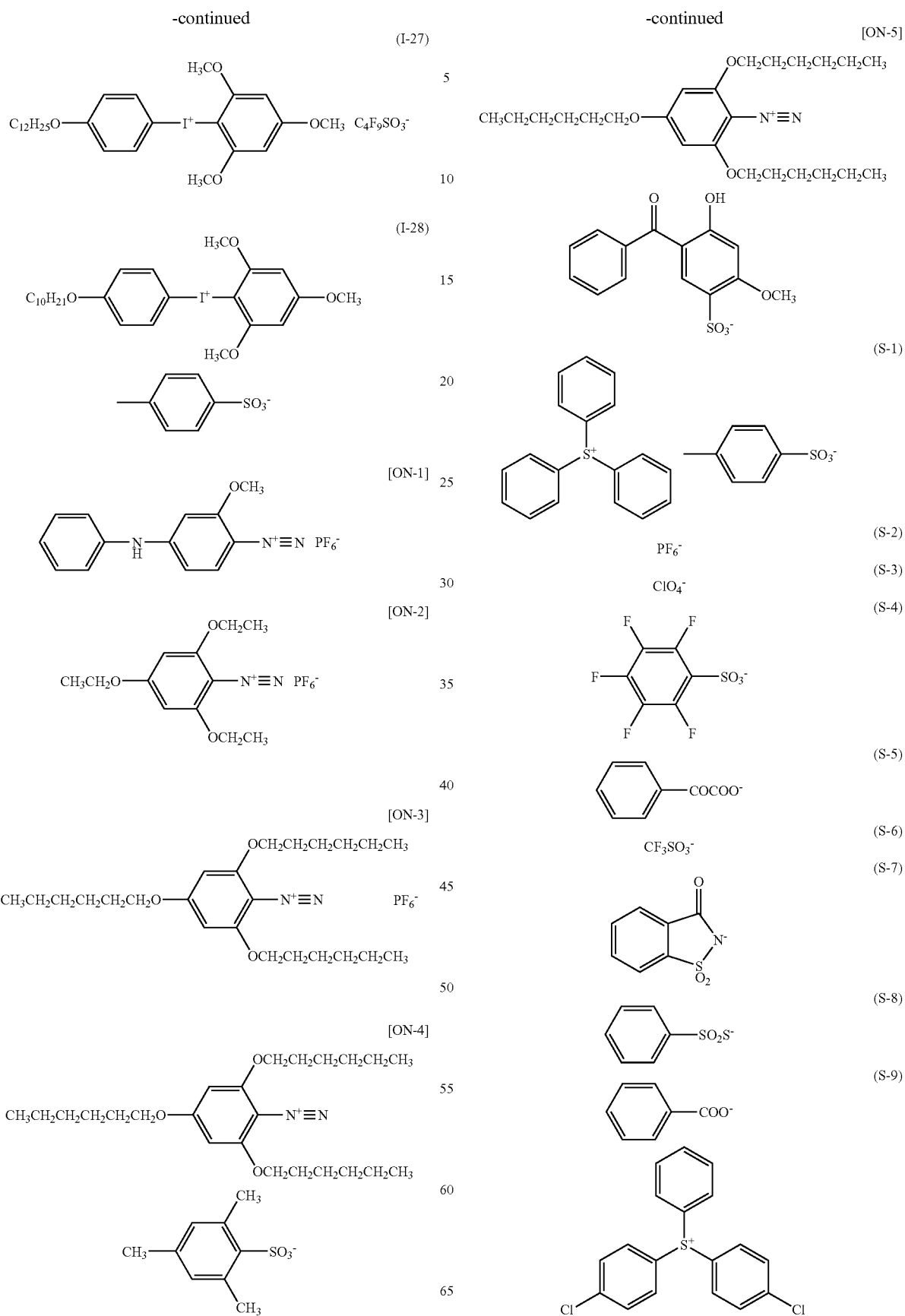

-continued

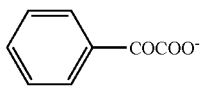 (S-10)

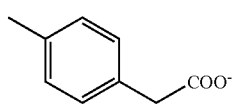 (S-11)

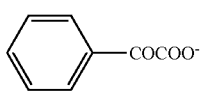 (S-12)

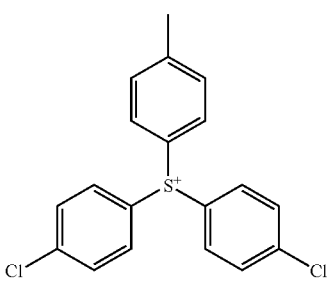 (S-13)

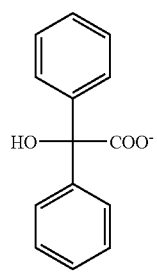

BF$_4^-$

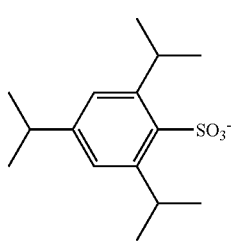 (S-15)

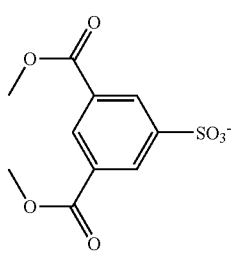 (S-16)

-continued

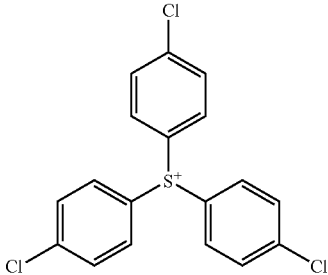

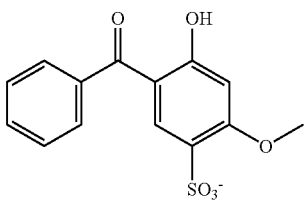 (S-17)

The polymerization initiator for use in the invention preferably has a maximum absorption wavelength of 400 nm or less, more preferably 360 nm or less. This setting of the absorption wavelength into the ultraviolet ray range enables to process the planographic printing plate precursor under white light.

Examples of other preferable polymerization initiator include specified aromatic sulfonium salts described in JP-A No. 2002-148790, JP-A No. 2002-148790, JP-A No. 2001-343742, and JP-A No. 2002-006482.

Examples of the polymerization initiator other than onium salt compound include a triazine-based compound and a borate-based compound such as those shown below.

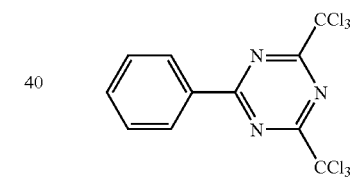

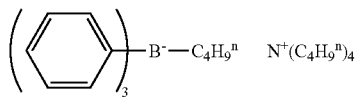

Besides, examples of a compound which can be suitably used as the polymerization initiator in the invention include an oxime ester compound. This oxime ester compound will be explained. Examples of a preferable oxime ester compound include a compound represented by the following Formula (D).

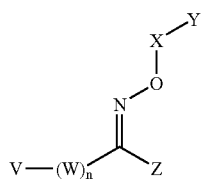 (D)

In the Formula (D), X represents a carbonyl group, a sulfone group, or a sulfoxide group, and Y represents a cyclic or chain alkyl group of a carbon number of 1 to 12, an alkenyl group, an alkynyl group, an aryl group of a carbon number of 6 to 18, or heterocyclic group.

Examples of the aryl group in the Formula (D) include aromatic hydrocarbon compounds such as a benzene ring, a naphthalene ring, an anthracene ring, a phenanthrene ring, a pyrene ring, and a triphenylene ring. The heterocyclic group refers to an aromatic compound having at least one of a nitrogen atom, a sulfur atom and an oxygen atom in a ring structure, and examples include a pyrrole group, a furan group, a thiophene group, a selenophenone group, a pyrazole group, an imidazole group, a triazole group, a tetrazole group, an oxazole group, a thiazole group, an indole group, a benzofuran group, a benziminidazole group, a benzoxazole group, a benzothiazole group, a pyridine group, a pyrimidine group, a pyrazine group, a triazine group, a quinoline group, a carbazole group, an acridine group, a phenoxazine group, and a phenothiazine group.

These substituents represented by Y can be substituted with compounds containing a halogen atom, a hydroxy group, a nitrile group, a nitro group, a carboxyl group, an aldehyde group, an alkyl group, a thiol group, an aryl group, an alkenyl group, an alkynyl group, an ether group, an ester group, a urea group, an amino group, an amido group, a sulfide group, a disulfide group, a sulfoxide group, a sulfo group, a sulfone group, a hydrazine group, a carbonyl group, an imino group, a halogen atom, a hydroxy group, a nitrile group, a nitro group, a carboxyl group, a carbonyl group, a urethane group, an alkyl group, a thiol group, an aryl group, phosphoroso group, a phospho group or a carbonylether group.

Z in the Formula (D) has the same meaning as that of Y, or is a nitrile group, a halogen atom, a hydrogen atom, or an amino group, and these compounds of Z can be substituted with compounds containing a halogen atom, a hydroxy group, a nitrile group, a nitro group, a carboxyl group, an aldehyde group, an alkyl group, a thiol group, an aryl group, an alkenyl group, an alkynyl group, an ether group, an ester group, a urea group, an amino group, an amido group, a sulfide group, a disulfide group, a sulfoxide group, a sulfo group, a sulfone group, a hydrazine group, a carbonyl group, an imino group, a halogen atom, a hydroxy group, a nitrile group, a nitro group, a carboxyl group, a carbonyl group, a urethane group, an alkyl group, a thiol group, an aryl group, a phosphoroso group, a phospho group or a carbonyl ether group.

W in the Formula (D) represents a divalent organic group, and represents a methylene group, a carbonyl group, a sulfoxide group, a sulfone group, or an imino group, and the methylene group and the imino group can be substituted with compounds containing an alkyl group, an aryl group, an ester group, a nitrile group, a carbonyl ether group, a sulfo group, a sulfoether group, or an ether group. And, n represents an integer of 0 or 1.

V in the Formula (D) is a cyclic or chain alkyl group of a carbon number of 1 to 12, an alkenyl group, an alkynyl group, an aryl group of a carbon number of 6 to 18, an alkoxy group, or an aryloxy group, and examples of the aryl group include aromatic hydrocarbon compounds such as a benzene ring, a naphthalene ring, an anthracene ring, a phenanthrene group, a pyrene group, and a triphenylene group, and hetero atom-containing aromatic compounds such as a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzothiazole group, a pyridine group, a pyrimidine group, a pyrazine group, a triazine group, a quinoline group, a carbazole group, an acrydine group, phenoxazine group, and phenothiazine. These compounds of V can be substituted with compounds containing a halogen atom, a hydroxy group, a nitrile group, a nitro group, a carboxyl group, an aldehyde group, an alkyl group, a thiol group, an aryl group, an alkenyl group, an alkynyl group, an ether group, an ester group, a urea group, an amino group, an amido group, a sulfide group, a disulfide group, a sulfoxide group, a sulfo group, a sulfone group, a hydrazine group, a carbonyl group, an imino group, a halogen atom, a hydroxy group, a nitrile group, a nitro group, a carboxyl group, a carbonyl group, a urethane group, an alkyl group, a thiol group, an aryl group, a phosphoroso group, a phospho group, or a carbonyl ether group.

V and Z may be taken together to form a ring.

As the oxime ester compound represented by the Formula (D), from a viewpoint of sensitivity, it is preferable that X is a carbonyl group, Y is an aryl group or a benzoyl group, Z is an alkyl group or an aryl group, W is a carbonyl group, and V is an aryl group. Further preferably, an aryl group of V has a thioether substituent.

A structure of an N—O bond in the Formula (D) may be an E isomer or Z isomer.

Preferable examples of the oxime ester compound used for the invention further include those described in "Progress in Organic Coatings" 13 (1985), 123 150; J. C. S. Perkin II (1979), 1653 1660; Journal of Photopolymer Science and Technology (1995), 205 232; J. C. S. Perkin II (1979), 156 162; JP-A No. 2000-66385; or JP-A No. 2000-80068.

Specific examples of preferable oxime ether compounds for the invention are described below, while the invention should not be limited thereto.

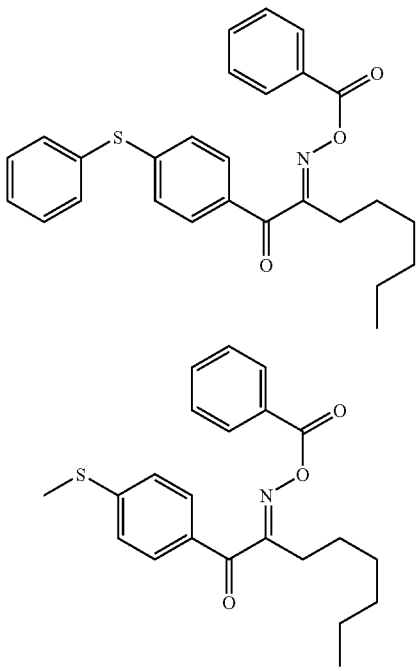

-continued
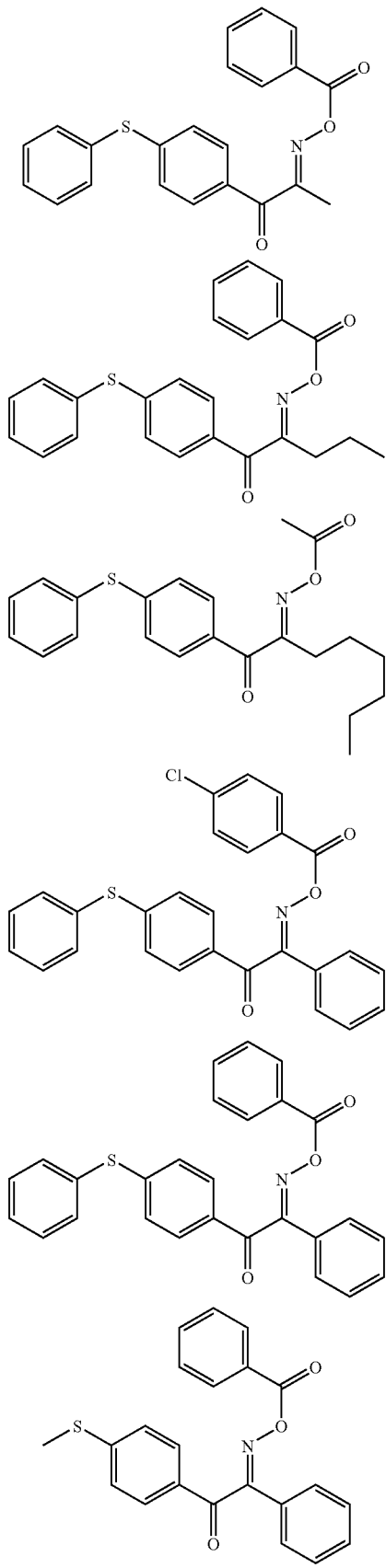
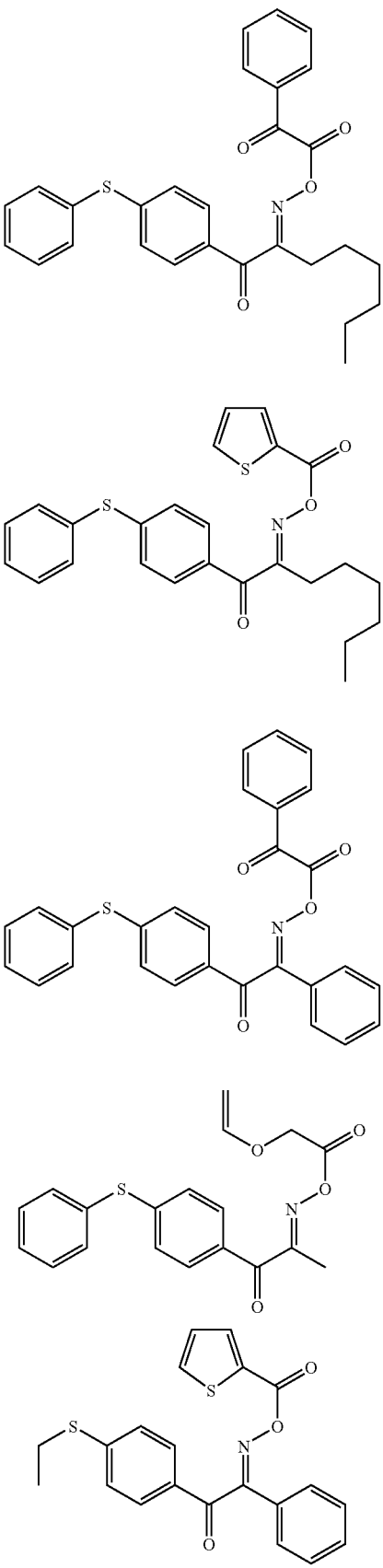

-continued
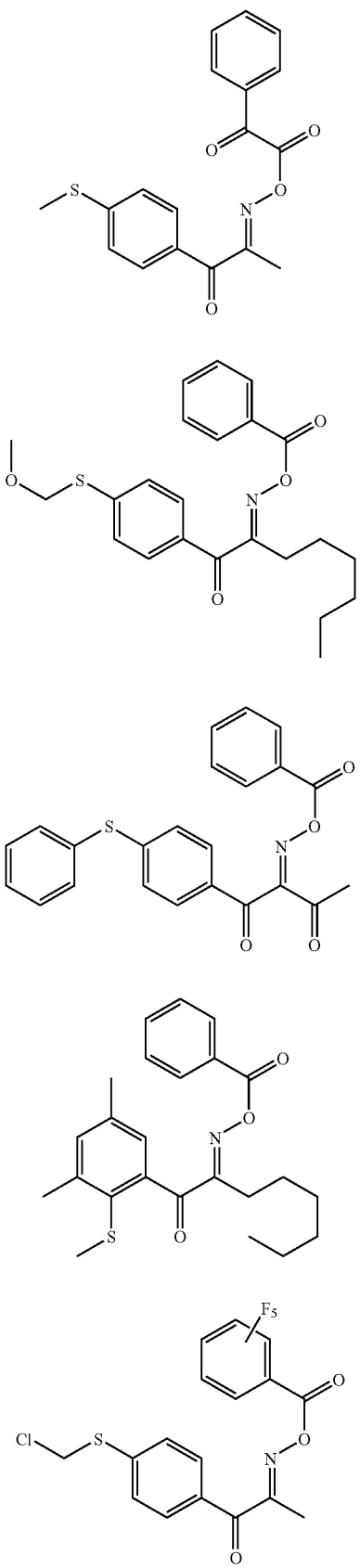
-continued
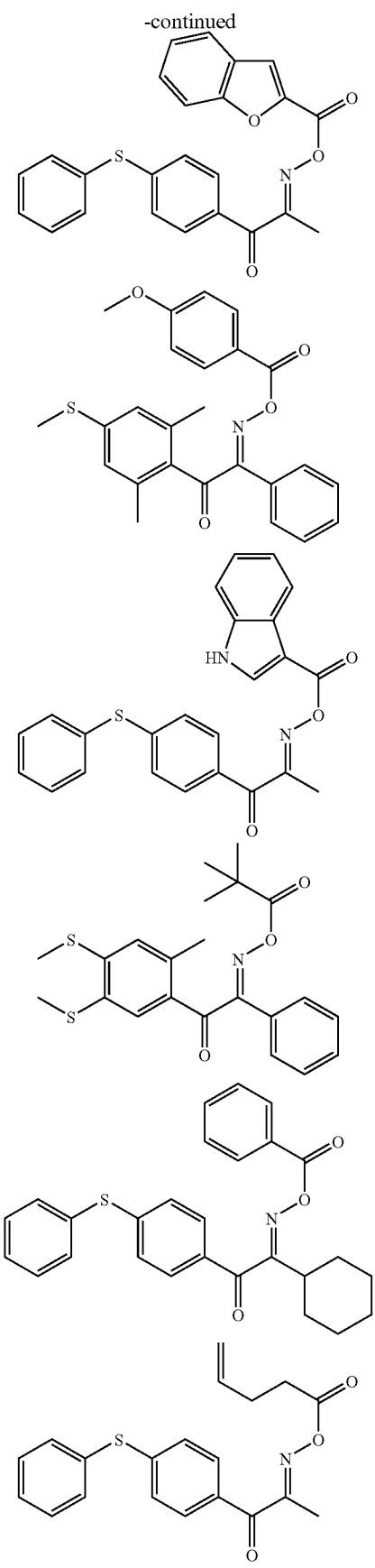

-continued
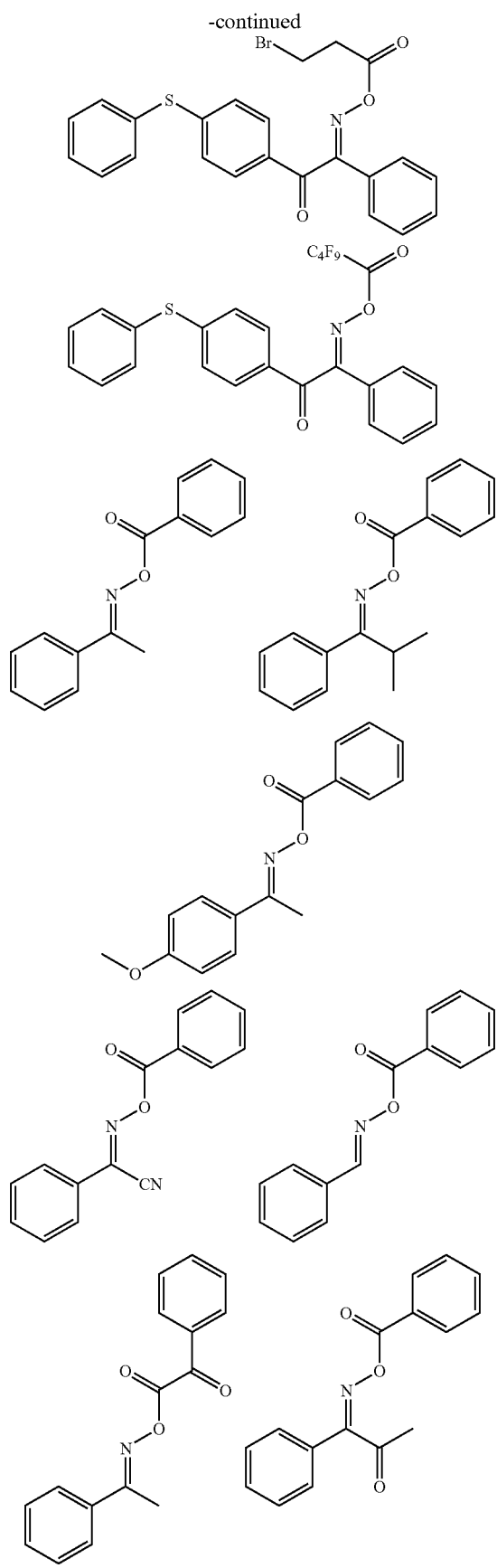
-continued
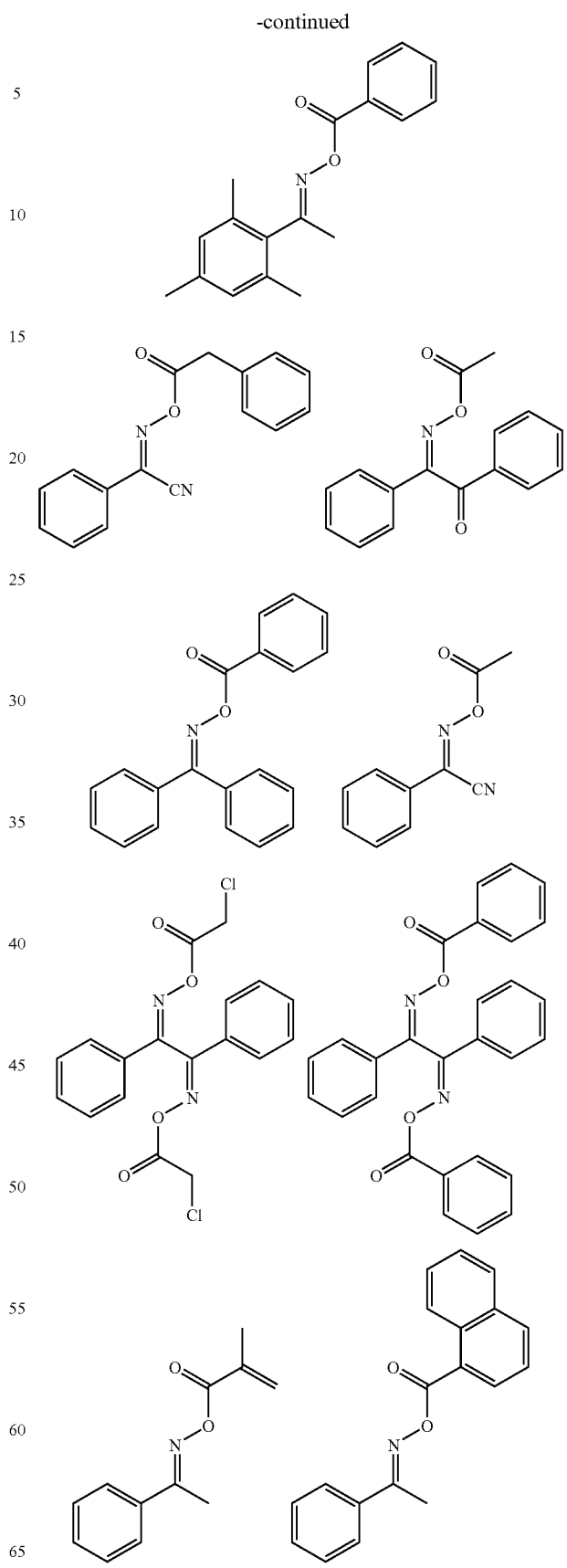

-continued
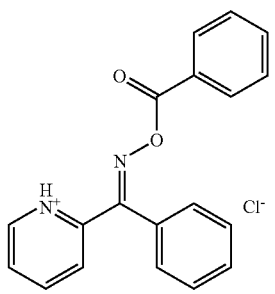
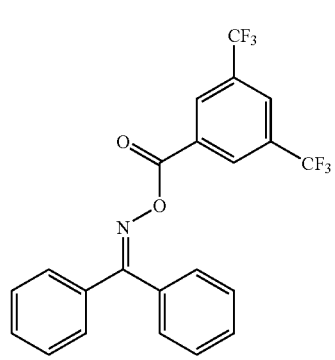
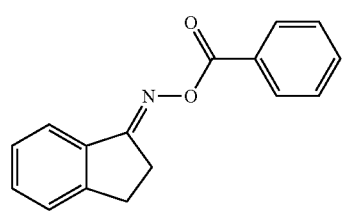
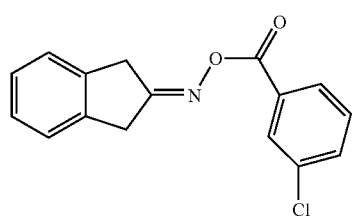
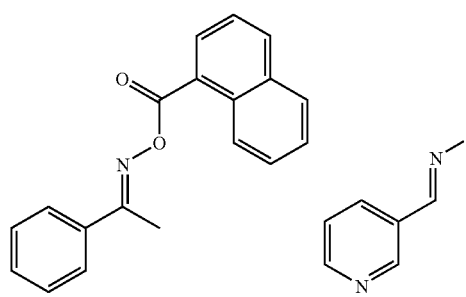
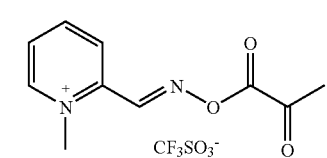
-continued
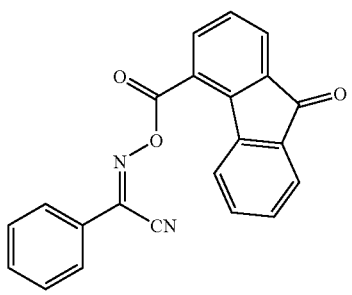
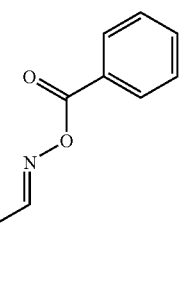
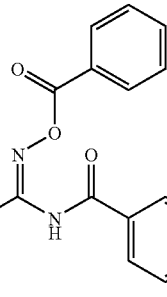
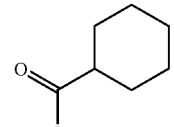
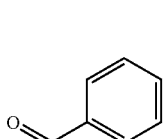
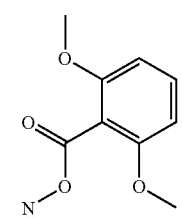
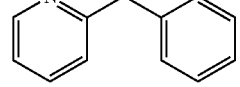
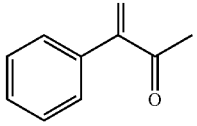
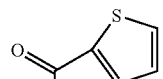
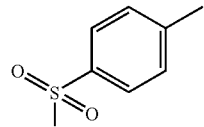
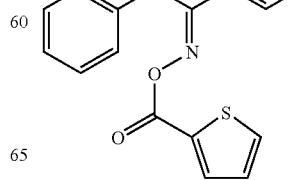

-continued
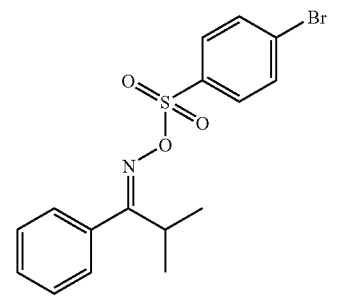
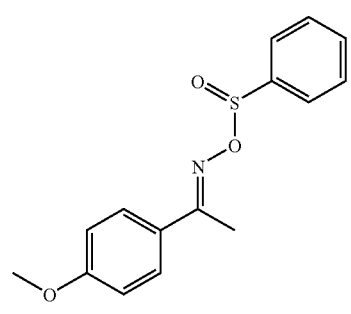
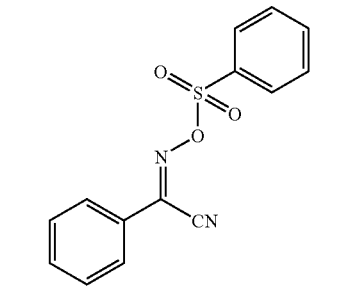
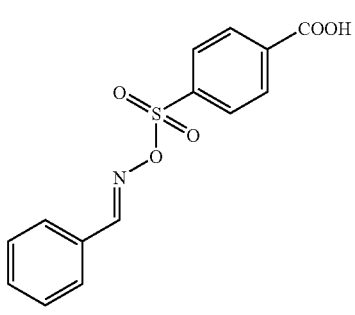
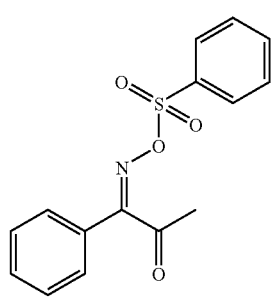
-continued
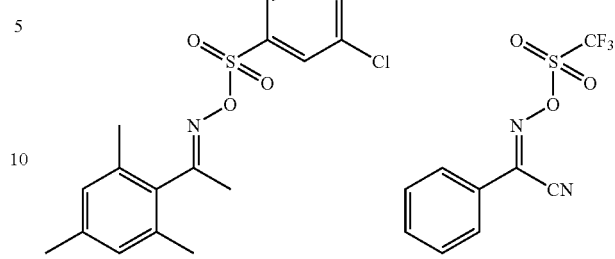
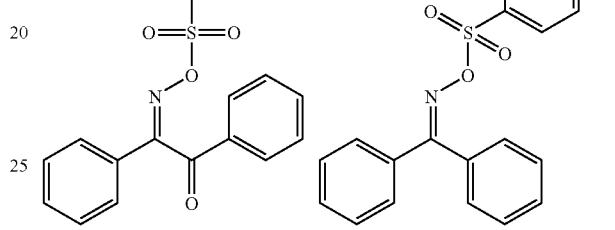
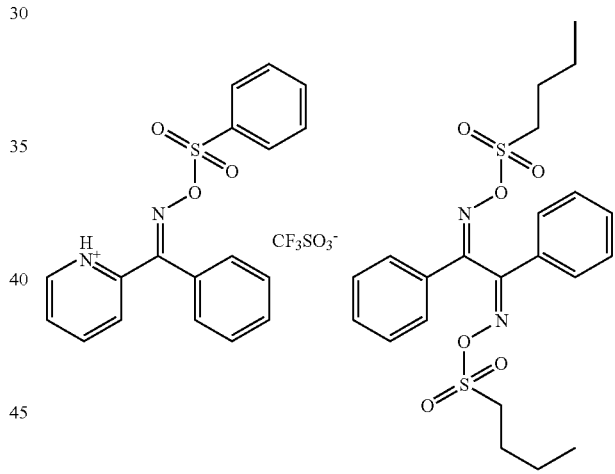
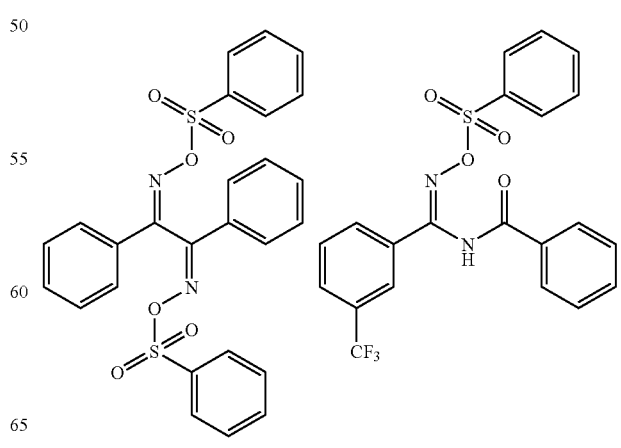

53
-continued
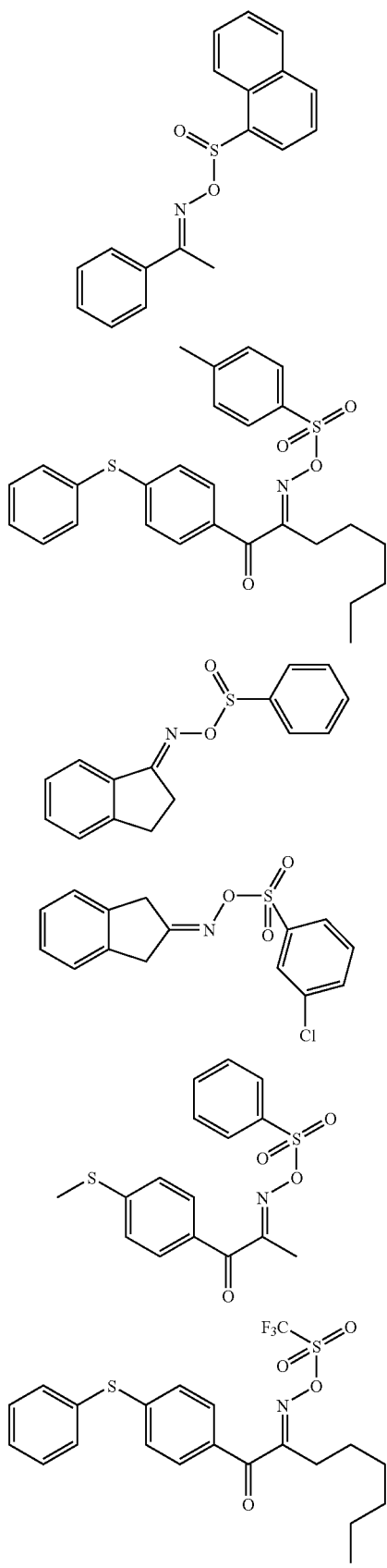
54
-continued
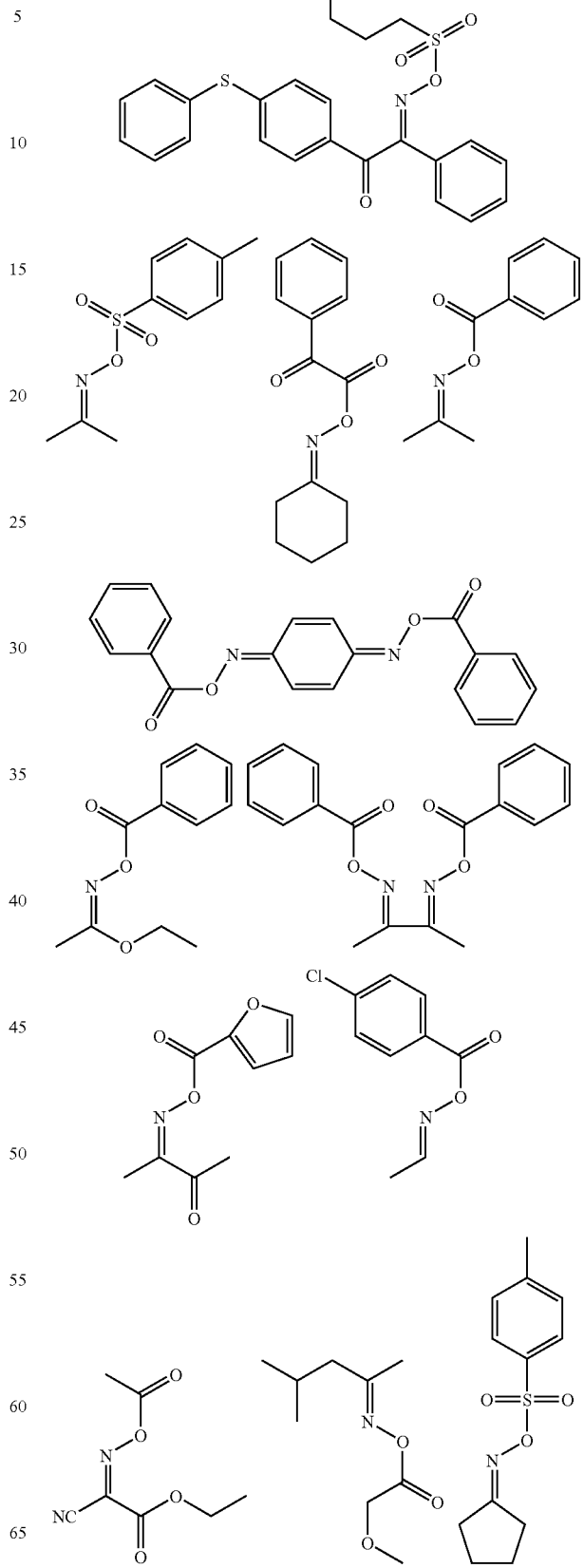

-continued

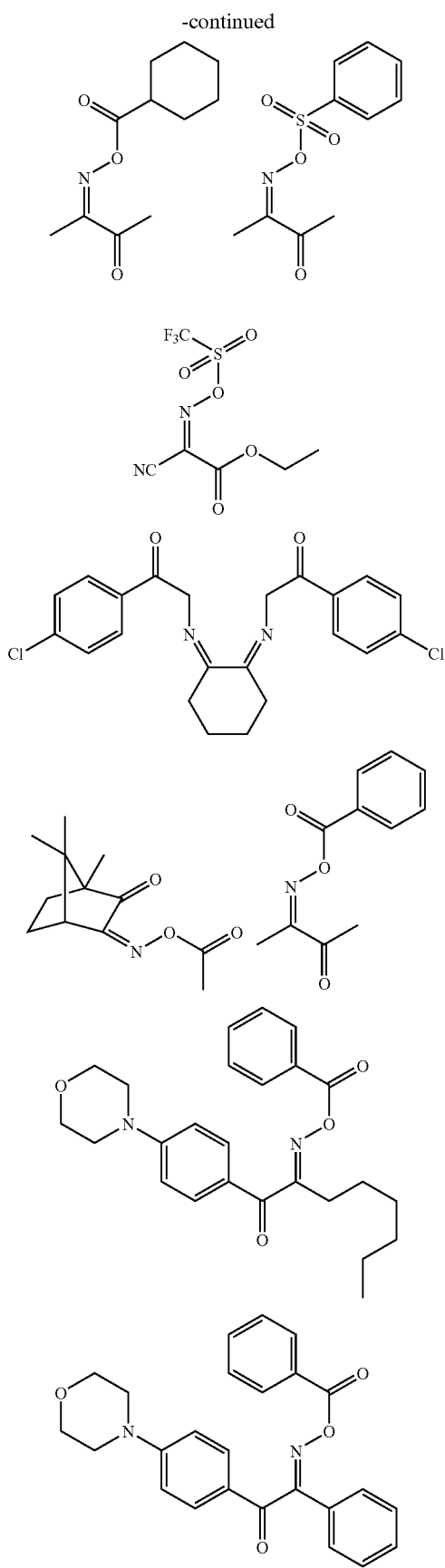

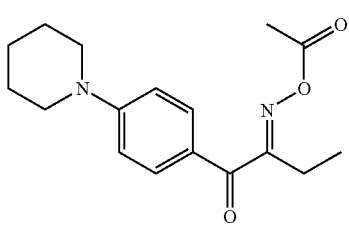

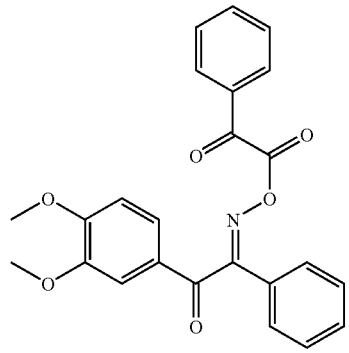

These polymerization initiators may be used alone, or two or more kinds may be used in combination.

The polymerization initiator can be added at a ratio of 0.1 to 50% by mass, preferably 0.5 to 30% by mass, particularly preferably 1 to 20% by mass based on a total solid content constituting the polymerizable composition or the photosensitive layer from a viewpoint of sensitivity when the polymerizable composition of the invention is applied as the photosensitive layer of a negative planographic printing plate precursor, and staining of a non-image part generated at printing. In addition, when these polymerization initiators are applied to the photosensitive layer of the planographic printing plate precursor, they may be added to the same layer together with other components, or the photosensitive layer is Formulated into a multilayer structure, and the polymerization initiator may be added to an adjacent layer separately from other components.

The polymerizable composition of the invention can be applied to various applications utilizing these mechanisms, is suitable, for example, as an image recording layer (photosensitive layer) of a negative image recording material (e.g. planographic printing plate precursor), or a highly sensitive material for photofabrication, or alternatively can be applied to a hologram material, or production of an electronic material such as a photoresist.

Among them, the polymerizable composition of the invention is suitable as an image recording layer of a negative planographic printing plate precursor which can be directly drawn by scanning exposure and, when applied to such the utility, it is preferable from a viewpoint of sensitivity that the polymerizable composition further contains a sensitizing dye adapted to light used in scanning exposure. That is, when the polymerizable composition of the invention is applied to the photosensitive layer of the negative planographic printing plate precursor, it is preferable that the image recording layer contains an infrared absorbing agent shown below as the sensitizing dye as is particularly suitable in plate making by direct photolithography with laser light having a wavelength of 300 to 1,200 nm.

[Sensitizing Dye]

In the polymerizable composition of the invention, a sensitizing dye can be used. As the sensitizing dye, a dye having an absorption wavelength depending on exposing light source is selected and, generally, a sensitizing dye having an absorption peak in 350 to 850 nm is preferable. Examples of such the sensitizing dye include a spectral sensitizing dye, and the following dye or pigment which absorbs light of a light source to interact with a photopolymerization initiator.

Examples of a preferable spectral sensitizing dye or a dye include polynuclear aromatic compounds (e.g. pyrene, perylene, triphenylene), xanthenes (e.g. fluorescein, eosin, erythrolan, Rhodamine B, Rose Bengal), cyanine (e.g. thiacarbocyanine, oxacarbocyanine), merocyanines (e.g. merocyanine, carbomerocyanine), thiazines (e.g. thioene, methylene blue, toluidine blue), acridines (e.g. acridine orange, chloroflavin, acriflavine), phthalocyanines (e.g. phthalocyanine, metal phthalocyanine), porphyrins (e.g. tetraphenylporphyrin, central metal-substituted porphyrin), chlorophylls (e.g. chlorophyll, chlorophyllin, central metal-substituted chlorophyll), metal complexes, anthraquinones (e.g. anthraquinone), and squaliums (e.g. squalium).

Examples of more preferable spectral sensitizing dyes and dyes include the styryl dyes described in JP-B No. 37-13034; the cation dyes described in JP-A No. 62-143044; the quinoxalinium salts described in JP-B No. 59-24147; the new methylene blue compound described in JP-A No. 64-33104; the anthraquinones described in JP-A No. 64-56767; the benzoxanthene dyes described in JP-A No. 2-1714; the acridines described in JP-A Nos. 2-226148 and 2-226149; the pyrylium salts described in JP-B No. 40-28499; the cyanines described in JP-B No. 46-42363; the benzofuran dyes described in JP-A No. 2-63053; the conjugate ketone dyes described in JP-A Nos. 2-85858 and 2-216154; the dyes described in JP-A No. 57-10605; the azo cinnamylidene compounds described in JP-B No. 2-30321; the cyanine dyes described in JP-A No. 1-287105; the xanthene dyes described in JP-A Nos. 62-31844, 62-31848, and 62-143043; the aminostyrylketone described in JP-B No. 59-28325; the merocyaninedyes described in JP-B No. 61-9621; the dyes described in JP-A No. 2-179643; the merocyanine dyes described in JP-A No. 2-244050; the merocyanine dyes described in JP-B No. 59-28326; the merocyanine colorants described in JP-A No. 59-89803; the merocyanine dyes described in JP-A No. 8-129257; the benzopyran dyes described in JP-A No. 8-334897; and the like.

(Infrared Absorbing Agent)

When exposure is performed using laser emitting infrared-ray at 760 to 1,200 nm as a light source in the invention, an infrared absorbing agent is usually used. The infrared absorbing agent has the function of converting absorbed infrared-ray into heat. By the heat produced thereupon, the radical generator (polymerization initiator) is thermally degraded to generate a radial. The infrared absorbing agent used in the invention is a dye or a pigment having absorption maximum at a wavelength of 760 nm to 1200 nm.

The dye may be any one of commercial dyes including known dyes described in e.g. "Senryo Binran" (Dye Handbook) (published in 1970 and compiled by Society of Synthetic Organic Chemistry, Japan). Examples of such dyes include azo dyes, metal complex salt azo dyes, pyrazolone azo dyes, naphthoquinone dyes, anthraquinone dyes, phthalocyanine dyes, carbonium dyes, quinone imine dyes, methine dyes, cyanine dyes, squarylium colorants, pyrylium salts, metal thiolate complexes and the like.

Examples of a preferable dye include cyanine dyes described in JP-A No. 58-125246, JP-A No. 59-84356, JP-A No. 59-202829, and JP-A No. 60-78787, methine dyes described in JP-A No. 58-173696, JP-A No. 58-181690, and JP-A No. 58-194595, naphthoquinone dyes described in JP-A No. 58-112793, JP-A No. 58-224793, JP-A No. 59-48187, JP-A No. 58-112793, JP-A No. 58-224793, JP-A No. 59-48187, JP-A No. 59-73996, JP-A No. 60-52940, and JP-A No. 60-63744, squalium dyes described in JP-A No. 58-112792, and cyanine dyes described in British Patent No. 434,875.

Near infrared ray-absorbing sensitizers described in U.S. Pat. No. 5,156,938 may be also preferably used. Also preferably used are substituted aryl benzo(thio) pyrylium salts described in U.S. Pat. No. 3,881,924, trimethine thiapyrylium salts described in JP-A No. 57-142645 (U.S. Pat. No. 4,327, 169), pyrylium-containing compounds described in JP-A Nos. 58-181051, 58-220143, 59-41363, 59-84248, 59-84249, 59-146063, or 59-146061, cyanine colorants described in JP-A No. 59-216146, pentamethine thiopyrylium salts described in U.S. Pat. No. 4,283,475, and pyrylium compounds described in JP-B Nos. 5-13514 or 5-19702. Examples of the preferable dye further include infrared ray-absorbing sensitizers represented by Formula (I) or (II) described in U.S. Pat. No. 4,756,993.

Examples of the infrared absorbing dye used in the invention further include specific indolenine cyanine dyes disclosed in JP-A Nos. 2002-278057 and 2002-278057 as shown below.

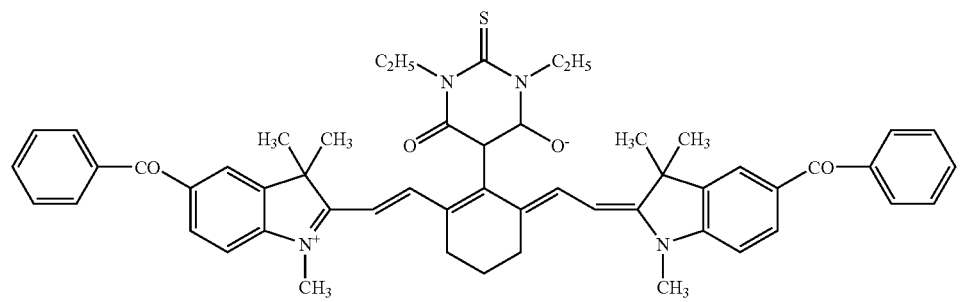

-continued

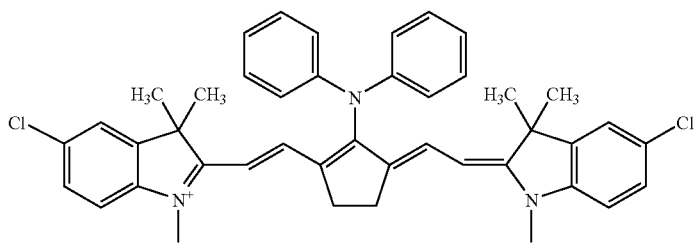

BF4-

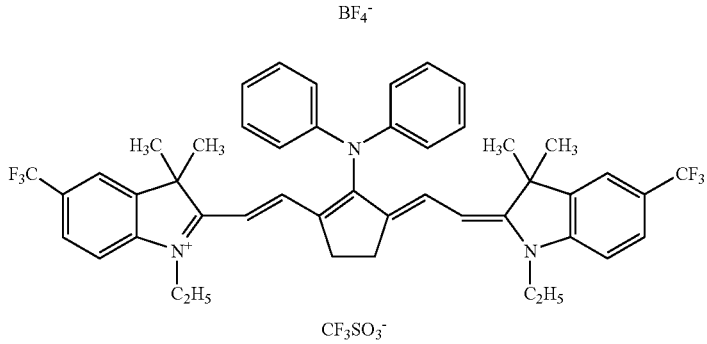

CF3SO3-

Among these dyes, particularly preferable examples include cyanine dyes, squalium dyes, pyrylium salts, nickel thiolate complexes, and indoleninecynanine dyes. Cyanine dyes and indoleninecyanine dyes are further preferable, and particularly preferable examples include cyanine dyes represented by the following Formula (a) to Formula (e).

Formula (a)

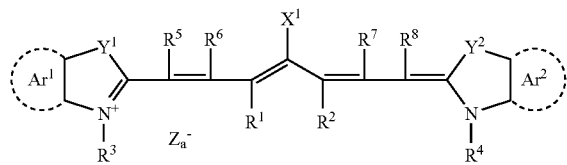

In the Formula (a), $X^1$ represents a hydrogen atom, a halogen atom, $-NPh_2$, $-X^2-L^1$ or a group shown below.

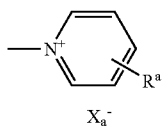

Herein, $X^2$ represents an oxygen atom, a nitrogen atom, or a sulfur atom, and $L^1$ represents a hydrocarbon group of a carbon atom number of 1 to 12, an aromatic ring having a hetero atom, or a hydrocarbon group of a carbon atom number of 1 to 12 comprising a hetero atom. Herein, a hetero atom represents N, S, O, a halogen atom, or Se. $X_a^-$ is defined like $Z_a^-$ described later, and $R^a$ represents a hydrogen atom, an alkyl group, an aryl group, a substituted or unsubstituted amino group, or a substituent selected from a halogen atom.

$R^1$ and $R^2$ each represent independently a hydrocarbon group of a carbon atom number of 1 to 12. From a viewpoint of storage stability of a photosensitive layer coating solution, it is preferable that $R^1$ and $R^2$ are a hydrocarbon group of a carbon atom number of 2 or more, and it is particularly preferable that $R^1$ and $R^2$ are taken together to form a 5-membered ring or a 6-membered ring.

$Ar^1$ and $Ar^2$ may be the same or different and represent an aromatic hydrocarbon group optionally having a substituent. Examples of a preferable aromatic hydrocarbon group include a benzene ring, a naphthalene ring. Examples of a preferable substituent include a hydrocarbon group of a carbon atom number of 12 or less, a halogen atom, and an alkoxy group of a carbon atom number of 12 or less. $Y^1$ and $Y^2$ may be the same or different and represent a sulfur atom, or a dialkylmethylene group of a carbon atom number of 12 or less. $R^3$ and $R^4$ may be the same or different and represent a hydrocarbon group of a carbon atom number of 20 or less optionally having a substituent. Examples of a preferable substituent include an alkoxy group of a carbon atom number of 12 or less, a carboxyl group, and a sulfo group. $R^5$, $R^6$, $R^7$ and $R^8$ may be the same or different, and represent a hydrogen atom or a hydrocarbon group of a carbon atom number of 12 or less. From a viewpoint of availability of a raw material, a hydrogen atom is preferable. $Z_a^-$ represents a counter-anion, provided that when the cyanine dye represented by the Formula (a) has an anionic substituent in its structure, and it is not necessary to neutralize a charge, $Z_a^-$ is not necessary. Preferable $Z_a^-$, from a viewpoint of storage stability of a photosensitive layer coating solution, is a halogen ion, a perchlorate ion, a tetrafluoroborate ion, a hexafluorophosphate ion, or a sulfonic acid ion, particularly preferably a perchlorate ion, a hexafluorophosphate ion, or an arylsulfonic acid ion.

In the invention, example of the cyanine dye represented by the Formula (a) which can be suitably used, include those described in JP-A No. 2001-133969, paragraphs [0017] to [0019], JP-A No. 2002-40638, paragraphs [0012] to [0038], and JP-A No. 2002-23360, paragraphs [0021] to [0023], in addition to cyanine dyes exemplified below.

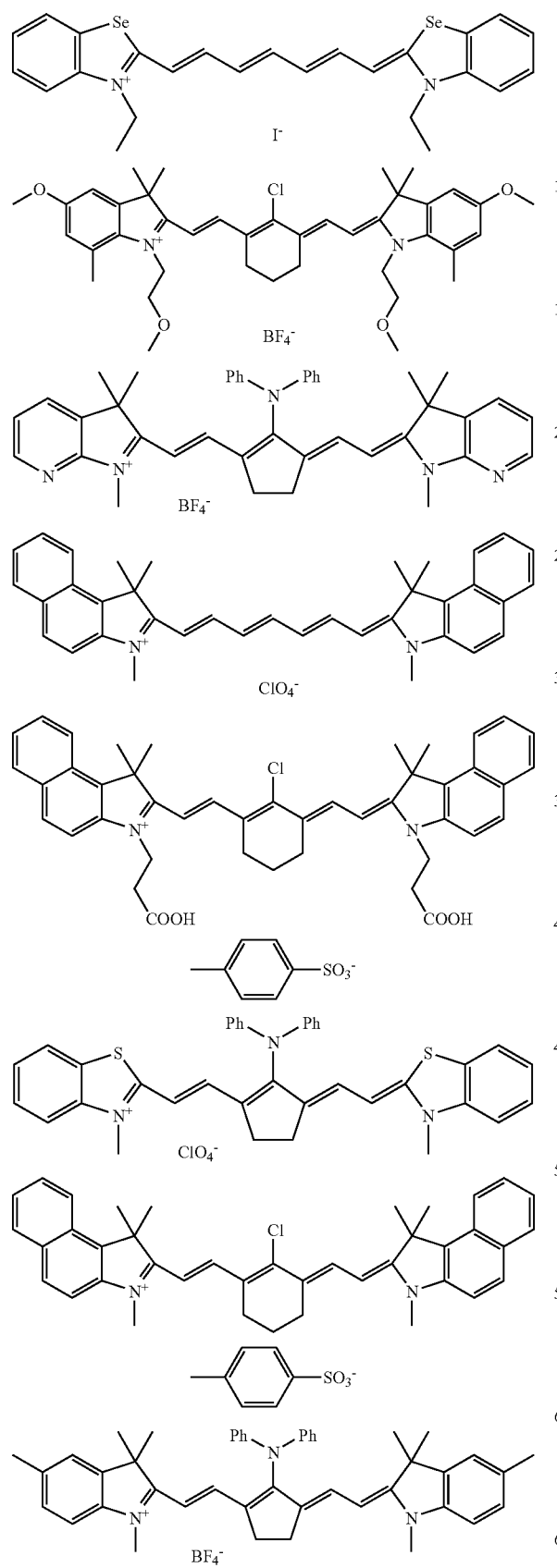
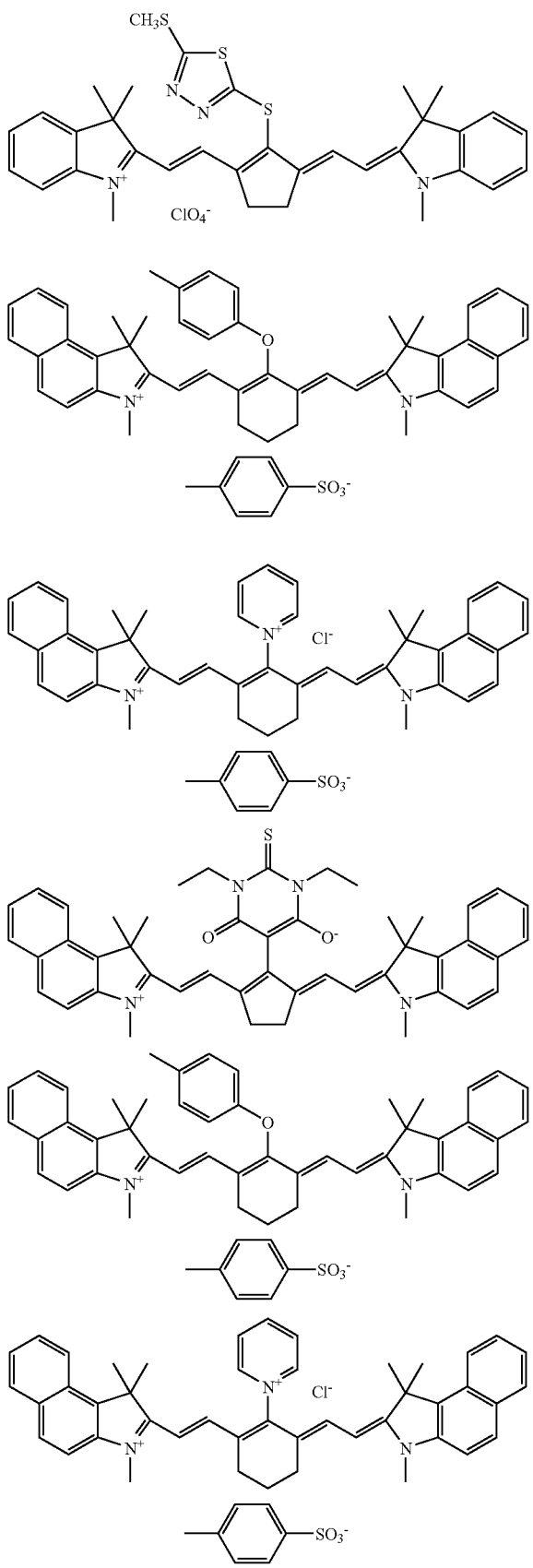
-continued

-continued

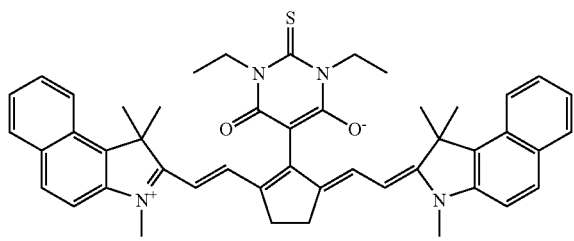

Formula (b)

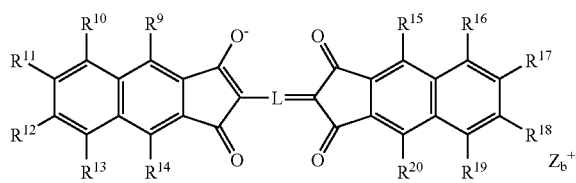

In the Formula (b), L represents a methine chain of a conjugated carbon atom number of 3 or more, and the methine chain may have a substituent, and substituents may be taken together to form a ring structure. $Z_b^+$ represents a counter cation. Examples of a preferable counter-cation include ammonium, iodonium, sulfonium, phosphonium, pyridinium, and an alkali metal cation ($Na^+$, $K^+$, $Li^+$). $R^9$ to $R^{14}$, and $R^{15}$ to $R^{20}$ each represent independently a hydrogen atom, or a substituent selected from a halogen atom, a cyano group, an alkyl group, an aryl group, an alkenyl group, an alkynyl group, a carbonyl group, a thio group, a sulfonyl group, a sulfinyl group, an oxy group, and an amino group, or a substituent which is a combination of two or three of them, or may be taken together to form a ring structure. Herein, in the Formula (b), from a viewpoint of easy availability and the effect that L represents a methine chain of a conjugated carbon atom number of 7, and $R^9$ to $R^{14}$, and $R^{15}$ to $R^{20}$ represent all a hydrogen atom.

In the invention, examples of the dye represented by the Formula (b) which can be suitably used include dyes exemplified below.

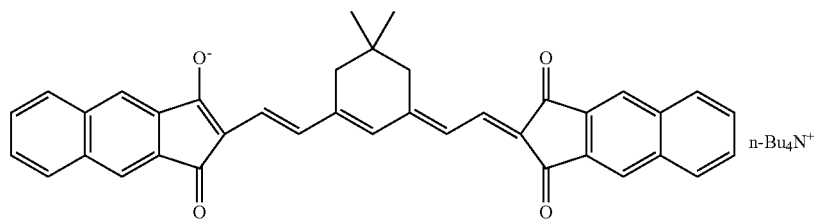

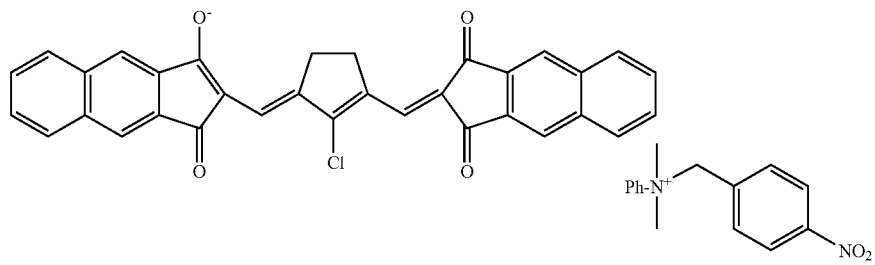

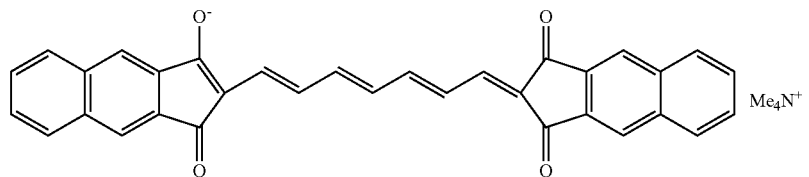

Formula (c)

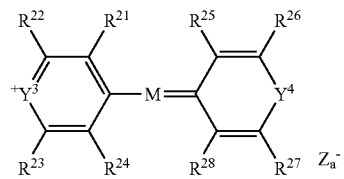

In the Formula (c), $Y^3$ and $Y^4$ each represent an oxygen atom, a sulfur atom, a selenium atom, or a tellurium atom. M represents a methine chain of a conjugated carbon number of 5 or more. $R^{21}$ to $R^{24}$, and $R^{25}$ to $R^{28}$ may be the same or different, and represent a hydrogen atom, a halogen atom, a cyano group, an alkyl group, an aryl group, an alkenyl group, an alkynyl group, a carbonyl group, a thio group, a sulfonyl group, a sulfinyl group, an oxy group, or an amino group. In the Formula, $Z_a^-$ represents a counter anion, and has the same meaning as that of $Z_a^-$ in the Formula (a).

In the invention, examples of the dye represented by the Formula (c) which can be suitably used include dyes exemplified below.

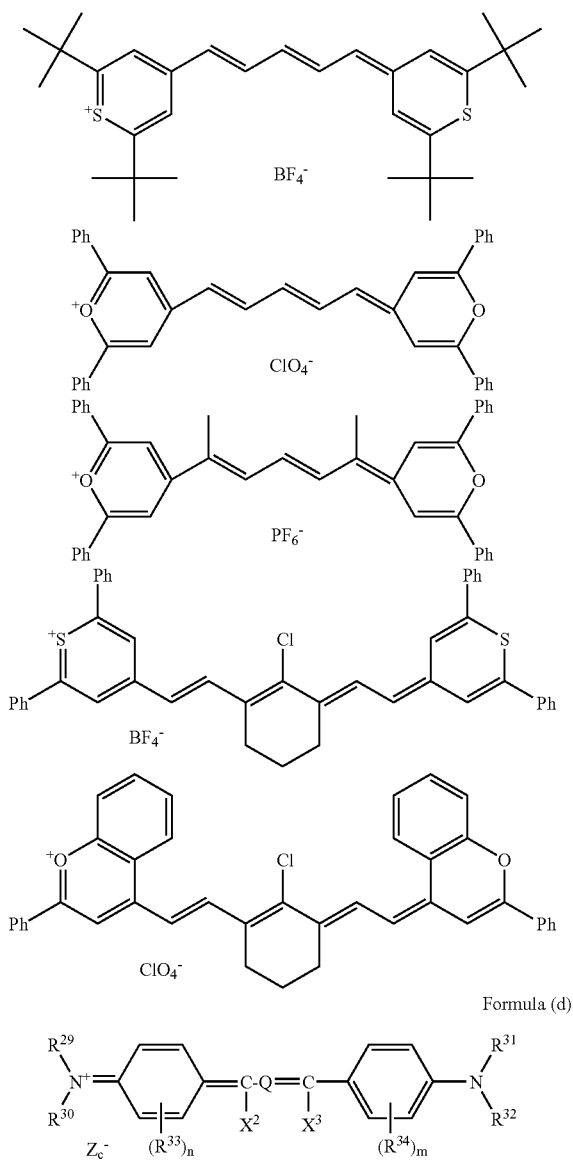

Formula (d)

In the Formula (d), $R^{29}$ to $R^{31}$ each represent independently a hydrogen atom, an alkyl group, or an aryl group. $R^{33}$ and $R^{34}$ each represent independently an alkyl group, a substituted oxy group, or a halogen atom, and n and m each represent independently an integer of 0 to 4. $R^{29}$ and $R^{30}$, or $R^{31}$ and $R^{32}$ may be taken together to form a ring, respectively, $R^{29}$ and/or $R^{30}$ may be take together with $R^{33}$, or $R^{31}$ and/or $R^{32}$ may be taken together with $R^{34}$ to form a ring and, further, when there are plural $R^{33}$s or $R^{34}$s, $R^{33}$s or $R^{34}$s may be take together to form a ring. $X^2$ and $X^3$ each are independently a hydrogen atom, an alkyl group, or an aryl group, and at least one of $X^2$ and $X^3$ represents a hydrogen atom or an alkyl group. Q is a trimethine group or a pentamethine group optionally having a substituent and may be taken together with a divalent organic group to form a ring structure. $Z_c^-$ represents a counter anion, and has the same meaning as $Z_a^-$ in the Formula (a).

In the invention, examples of the dye represented by the Formula (d) which can be suitably used include dyes exemplified below.

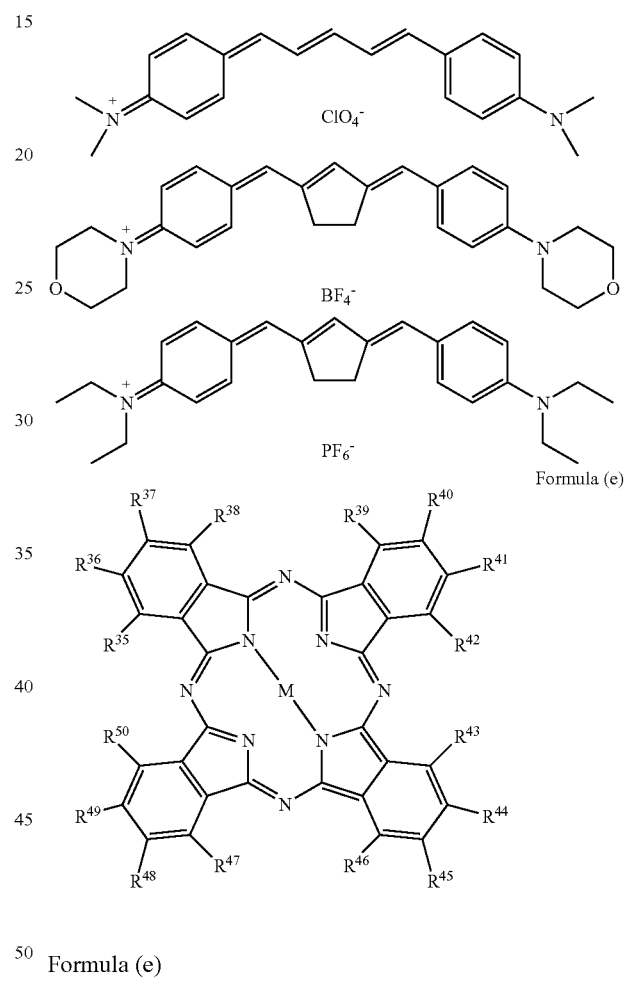

Formula (e)

In Formula (e), $R^{35}$ to $R^{50}$ each independently represent each independently represents a hydrogen atom, halogen atom, cyano group, alkyl group, aryl group, alkenyl group, alkynyl group, hydroxyl group, carbonyl group, thio group, sulfonyl group, sulfinyl group, oxy group, amino group, and onium salt structure, each of which may have a substituent; and M represents two hydrogen atoms, a metal atom, a halometal group or an oxymetal group, and examples of the metal atom contained therein include the groups IA, IIA, IIIB and IVB atoms in the periodic table, the transition metals in the first, second and third periods, and lanthanoid elements, and among these, copper, magnesium, iron, zinc, cobalt, aluminum, titanium and vanadium are preferable.

In the invention, examples of the dye represented by the Formula (e) which can be suitably used include dyes exemplified below.

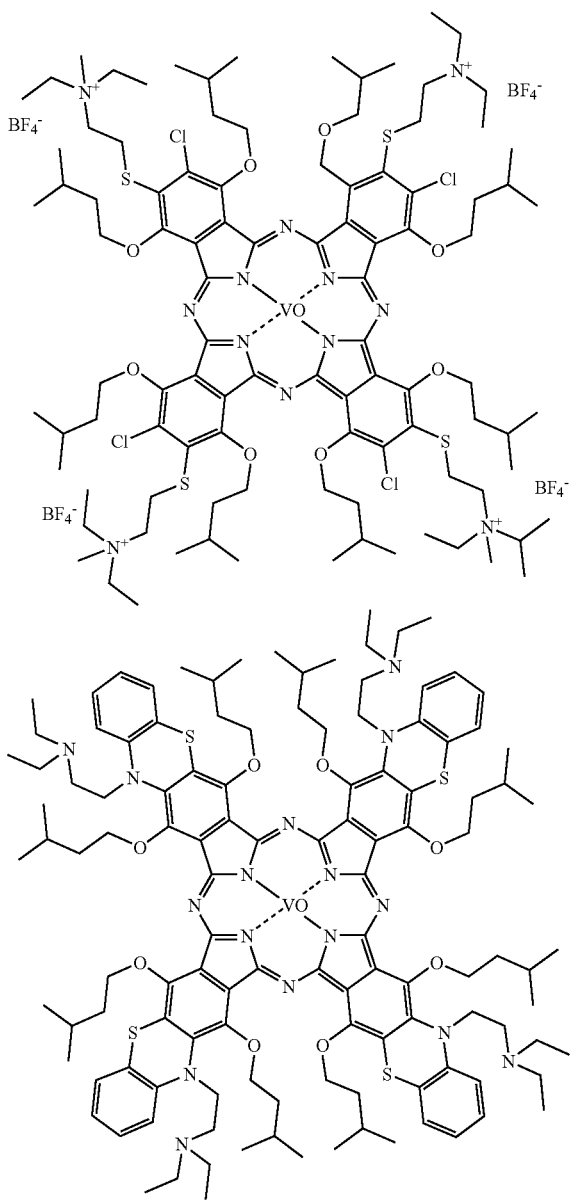

Examples of the pigment used in the invention include commercial pigments and those described in Color Index (C. I.) Handbook, "Saishin Ganryo Binran" (Newest Dye Handbook) (published in 1977 and compiled by Japanese Society of Pigment Technology), "Saishin Ganryho Oyo Gijyutsu" (Newest Pigment Applied Technology) (published in 1986 by CMC), and "Insatsu Inki Gijyutsu" (Printing Ink Technology) (published in 1984 by CMC).

Examples of the pigment include a black pigment, a yellow pigment, an orange pigment, a brown pigment, a red pigment, a purple pigment, a blue pigment, a green pigment, a fluorescent pigment, a metal powder pigment, and a polymer-bound dye. Specifically, an insoluble azo pigment, an azolake pigment, a condensed azo pigment, a chelate azo pigment, a phthalocyanine-based pigment, an anthraquinone-based pigment, a perylene or perinone-based pigment, a thioindigo-based pigment, a quinacridone-based pigment, a dioxazine-based pigment, an isoindolinone-based pigment, a quinophthalone-based pigment, a dyeing lake pigment, an azine pigment, a nitroso pigment, a nitro pigment, a natural pigment, a fluorescent pigment, an inorganic pigment, and carbon black can be used. Among these pigments, preferable is carbon black.

Such pigments may be used with or without being subjected to surface treatment. Examples of the method of surface treatment include a method of coating the surface with a resin or a wax, a method of allowing a surfactant to adhere to the surface, and a method of bonding a reactive substance (e.g., a silane coupling agent, an epoxy compound, a polyisocyanate etc.) onto the surface of the pigment. These methods of surface treatment are described in "Kinzoku Sekken No Seishitsu To Oyo" (Properties and Application of Metallic Soap) (Sachi Shobo), "Insatsu Inki Gijyutsu" (Printing Ink Technology) (published in 1984 by CMC Shuppan) and "Saishin Ganryho Oyo Gijyutsu" (Newest Pigment Applied Technology) (published in 1986 by CMC Shuppan).

A particle diameter of the pigment is in a range of preferably 0.01 µm to 10 µm, further preferably 0.05 µm to 1 µm, particularly preferably 0.1 µm to 1 µm. When the particle diameter of the pigment is less than 0.01 µm, this is not preferable in stability of a dispersion in an image photosensitive layer coating solution and, when the particle diameter is more than 10 µm, this is not preferable in uniformity of an image photosensitive layer.

As the method of dispersing the pigments, any known dispersion techniques used in production of inks or toners can be used. Examples of the dispersing machine include a supersonic dispersing device, a sand mill, an attritor, a pearl mill, a super mill, a ball mill, an impeller, a disperser, a KD mill, a colloid mill, a dynatron, a triple roll mill, and a press kneader. Details thereof are described in "Saishin Ganryho Oyo Gijyutsu" (Newest Pigment Applied Technology) (published in 1986 by CMC Shuppan).

The sensitizing dye of these infrared absorbing agents, which is added in order to promote curing of the polymerizable composition, when the polymerizable composition of the invention is applied as the photosensitive layer of the negative planographic printing plate precursor, may be added to the photosensitive layer, or may be added to another layer, for example, an overcoating layer or an under coating layer. Particularly, when the polymerizable composition of the invention is applied to the photosensitive layer of the negative photosensitive planographic printing plate precursor, these sensitizing dyes preferably have an optical concentration at absorption maximum in a range of a wavelength 760 nm to 1200 nm of the photosensitive layer, from 0.1 to 3.0. Since an optical concentration is determined by an addition amount of the infrared absorbing agent, and a thickness of the photosensitive layer, a predetermined optical concentration is obtained by controlling both conditions.

The optical concentration of the photosensitive layer can be measured by a conventional method. Examples of a measuring method include a method of forming a photosensitive layer having a thickness appropriately determined in a necessary range as a planographic printing plate of a coating amount after drying, and measuring the optical concentration with a transmission-type optical concentration meter, and a method of forming a photosensitive layer on a reflective support such as aluminum, and measuring a reflection concentration.

In addition, to describe a general addition amount of the sensitizing dye to the polymerizable composition, the dye is preferably added at 0.5 to 20% by mass in a total solid content. In this range, sensitivity of property chain due to exposure to light is high, high sensitivity is attained and, at the same time, there is no possibility that uniformity and a strength of a film are adversely influenced being preferable.

[Other Component]

To the polymerizable composition of the invention, in addition to the aforementioned components, other components suitable for its utility, and a production method such as a co-sensitizer, a polymerization inhibitor, a colorant, and a plasticizer can be appropriately added. A preferable additive when the polymerizable composition of the invention is applied particularly to a negative image recording material will be exemplified below.

(Co-Sensitizer)

By using the co-sensitizer in a photopolymerizable photosensitive layer, sensitivity of the photosensitive layer can be further improved. The mechanism of the action is not clear, but is thought to be based on the following chemical process in most cases. That is, it is presumed that various intermediate active species (radical, peroxide, oxidizing agent, reducing agent, etc.) produced during a photoreaction initiated by light absorption of the photopolymerization initiator (system), and a subsequent addition polymerization reaction, and the co-sensitizer are reacted to generate a new active radical. These can be broadly classified as (a) a co-sensitizer which can be reduced to generate an active radical, (b) a co-sensitizer which can be oxidized to generate an active radical, and (c) a co-sensitizer which is reacted with a radical having low activity, thereby converting the radical into a radical having high activity, or which acts as a chain transferring agent; however, in most cases, there is no commonly accepted theory regarding which of these classes individual compounds belong to.

(a) A compound which is reduced to generate an active radical, a compound having a carbon-halogen bond: It is thought that a carbon-halogen bond is reductively cleaved to generate an active radical. Specifically, for example, trihalomethyl-s-triazines, and trihalomethyloxadiazoles can be suitably used.

Compounds having a nitrogen-nitrogen bond: It is considered that the nitrogen-nitrogen bond is reductively cleaved to form active radicals. Specifically, hexaryl biimidazoles can be preferably used.

Compounds having an oxygen-oxygen bond: It is considered that the oxygen-oxygen bond is reductively cleaved to generate active radicals. Specifically, organic peroxides can be preferably used.

Onium compound: It is thought that a carbon-hetero bond, or an oxygen nitrogen bond is reductively cleaved to generate an active radical. Specifically, for example, diaryliodonium salts, triarylsulfonium salts, N-alkoxyprydinium (azinium) salts are suitably used. Ferrocene, iron arene complexes: An active radical can be reductively generated.

(b) A compound which is oxidized to generate an active radical, alkylate complex: It is thought that a carbon-hetero bond is oxidatively cleaved to generate an active radical. Specifically, for example, triarylalkylborates are suitably used.

Alkyl amine compounds: It is considered that a C—X bond on a carbon adjacent to the nitrogen is cleaved by oxidation to form active radicals. X is preferably a hydrogen atom, a carboxyl group, a trimethylsilyl group, or a benzyl group. Specific examples of the alkyl amine compound include ethanol amines, N-phenyl glycines, N-phenyliminodiacetic acid and its modified compounds, and N-trimethylsilylmethyl anilines.

Sulfur- or tin-containing compounds: A compound obtained by replacing the nitrogen atom in any of the above-described amines with a sulfur atom or a tin atom can form active radicals in a similar mechanism. Further, compounds having S—S bonds are known to act as sensitizers by cleavage of the S—S bonds.

Substituted methyl carbonyl compounds: Capable of forming active radicals through the cleavage of the carbonyl-α carbon bond upon oxidation. Further, compounds obtained by replacing the carbonyl in such a compound with an oxime ether exhibit the same action. Specifically, examples include 2-alkyl-1-[4-(alkylthio) phenyl]-2-morpholinopronone-1 and modified compounds thereof, as well as oxime ethers prepared by reacting such compounds with hydroxy amines and then etherifying N—OH.

Sulfinates: Capable of forming active radicals reductively. Specific examples of the sulfinates include sodium aryl sulfinates.

(c) A compound which reacts with a radical to convert it into a highly active radical, or acts as a chain transferring agent; for example, a group of compounds having SH, PH, SiH, or GeH in a molecule are used. These donate hydrogen to a radical spices having low activity to generate a radical, or are oxidized, and de-protonated, thereby, a radical can be generated. Examples include 2-mercaptobenzimidazoles.

More specific examples of these co-sensitizers are described much as an additive for the purpose of improving sensitivity in JP-A No. 9-236913. A part of them is exemplified below, but the co-sensitizer used in the photosensitive layer of the planographic printing plate precursor of the invention is riot limited to them.

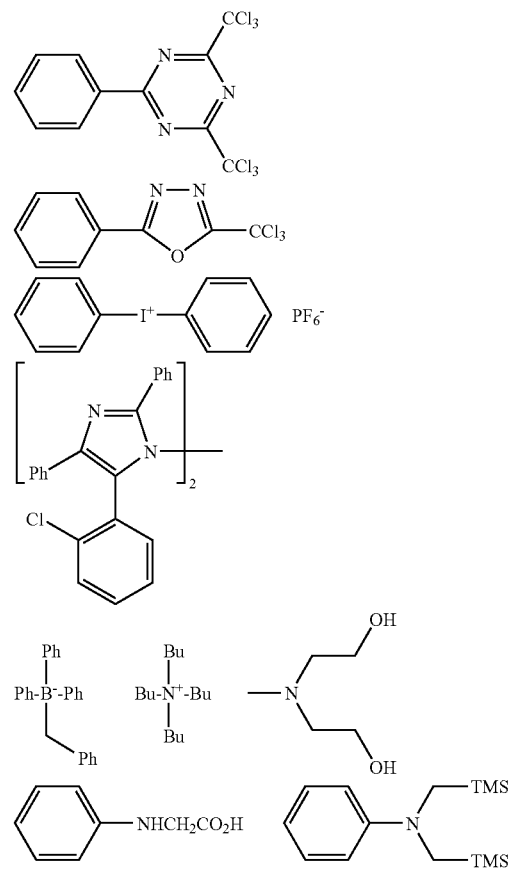

-continued

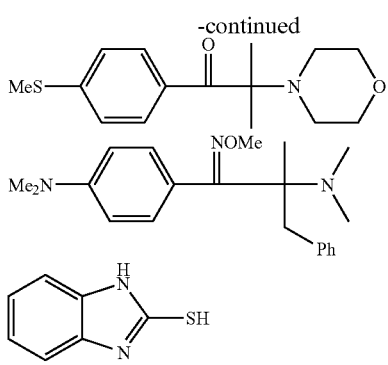

A variety of chemical modifications can be further applied the co-sensitizing dye for the purpose of improving the characteristics of the photosensitive layer. Examples of usable modification techniques include: bonding to a radical-generating part of, e.g., a sensitizing dye, titanocene or addition-polymerizable unsaturated compound; introduction of a hydrophilic group; introduction of a substituent for improvement of compatibility and inhibition of crystalline precipitation; introduction of a substituent for improving adhesion; and conversion into a polymer.

The co-sensitizer may be used singly or in a combination of two or more thereof. The amount of the co-sensitizer to be used may be in a range of 0.05 to 100 parts by mass, preferably 1 to 80 parts by mass, and more preferably 3 to 50 parts by mass, relative to 100 parts by mass of the polymerizable compound having an ethylenic unsaturated double bond.

(Polymerization Inhibitor)

In the invention, a small amount of a heat-polymerization inhibitor is preferably added to the photo- or thermal-polymerizable negative photosensitive layer of the planographic plate precursor of the invention so as to inhibit unnecessary thermal polymerization of the polymerizable compound having a polymerizable ethylenic unsaturated double bond during production or storage of the negative photosensitive composition. Examples of suitable thermal-polymerization inhibitor include hydroquinone, p-methoxyphenol, di-t-butyl-p-cresol, pyrogallol, t-butyl catechol, benzoquinone, 4,4'-thiobis(3-methyl-6-t-butyl phenol), 2,2'-methylene bis(4-methyl-6-t-butyl phenol), and N-nitrosophenyl hydroxylamine primary cerium salts. The amount of the thermal-polymerization inhibitor to be added is preferably about 0.01 mass % to about 5 mass % relative to the amount of nonvolatile constituents in the entire of the polymerizable composition. To prevent the polymerization inhibition by oxygen, a higher fatty acid compound such as behenic acid or behenic amide may be added in accordance with necessity as needed so that the higher fatty acid compound localizes on the surface of the photosensitive layer during drying after application of the composition onto a support or the like during the production process of the planographic printing plate precursor. The amount of the higher fatty acid compound to be added is preferably about 0.5 mass % to about 10 mass % based on the amount of nonvolatile constituents in the entire of the polymerizable composition.

(Coloring Agent)

In a case where the polymerizable composition of the invention is used in a photosensitive layer of a planographic printing plate precursor, a dye or pigment may be added to the polymerizable composition for the purpose of coloring of the photosensitive layer. The plate-checking property of the printing plate, such as visibility after plate-making and compatibility with an image densitometer, can thereby be improved. In consideration of the fact that many dyes lower the sensitivity of the photopolymerizable photosensitive layer, the coloring agent is preferably a pigment. Specific examples of the colorant include pigments such as phthalocyanine pigments, azo pigments, carbon black or titanium oxide, and dyes such as Ethyl Violet, Crystal Violet, azo dyes, anthraquinone dyes or cyanine dyes. The amount of the dyes and pigments to be added is preferably in a range of about 0.5 mass % to about 5 mass % based on the amount of nonvolatile constituents in the entire of the polymerizable composition.

(Other Additives)

Further, the known additives such as inorganic fillers and other plasticizers for improving physical properties of a cured film, and sensitizing agents which can improve ink receptivity of an ink on a photosensitive layer surface when the polymerizable composition of the invention is applied to the photosensitive layer of the planographic printing plate precursor, may be used.

Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetyl glycerin. When the plasticizer is used, it may be added in an amount of 10 mass % or less relative to the total mass of the polymer binder and the addition-polymerizable compound.

UV initiators and heat-crosslinking agents for enhancing the effects of heating and exposure to light after development can also be added for the purpose of improving the layer strength (printing durability) described later.

<Pranographic Printing Plate Precursor>

The planographic printing plate precursor of the invention is characterized in that it comprises a photosensitive layer comprising the polymerizable composition of the invention on a support. The planographic printing plate precursor of the invention may comprise other layer such as an intermediate layer and a protective layer, if necessary, in addition to the photosensitive layer.

(Photosensitive Layer)

The photosensitive layer in the planographic printing plate precursor of the invention comprises the aforementioned polymerizable composition of the invention.

The photosensitive layer is formed by dissolving components constituting the photosensitive layer in various organic solvents, and coating the coating solution on a support or an intermediate layer described later.

As the solvent to be used herein, there are acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol dimethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl actate, and ethyl lactate. These solvents can be used alone, or can be used by mixing. And, a concentration of a solid content in a coating solution is suitably 2 to 50% by mass.

A covering amount of the photosensitive layer can influence mainly on sensitivity and developability of the photosensitive layer, and a strength and printing durability of an exposed film, and it is desirable to appropriately select the amount depending on utility. When the covering amount is too small, printing durability becomes not sufficient. On the other hand, when the covering amount is too much, sensitivity is reduced, light exposure takes a time, and developing treatment needs a longer time, being undesirable. As the planographic printing plate precursor for scanning exposure which is a main object of the invention, the covering amount is suitably in a rage of about 0.1 g/m$^2$ to about 10 g/m$^2$ in terms of a mass after drying. 0.5 g/m$^2$ to 5 g/m$^2$ is more preferable.

[Support]

As the support of the planographic printing plate precursor of the invention, the previously known hydrophilic support which is used in the planographic printing plate precursor can be used without limitation.

The support to be used is preferably a dimensionally stable plate, and includes, for example, a paper, a paper laminated with a plastic (e.g. polyethylene, polypropylene, polystyrene etc.), a metal plate (e.g. aluminum, zinc, copper etc.), a plastic film (e.g. cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and a paper and a plastic on which the metal is laminated or deposited, and a surface of them may be subjected to the suitable known physical or chemical treatment for the purpose of providing hydrophilicity or enhancing a strength, if necessary.

Examples of a particularly preferable support include a paper, a polyester film and an aluminum plate and, among them, an aluminum plate which has good dimensional stability, is relatively inexpensive, and can provide a surface excellent in hydrophilicity and a strength by surface treatment, if necessary, is further preferable. In addition, a composite sheet on which an aluminum sheet is bound on a polyethylene terephthalate film as described in JP-B No. 48-18327 is also preferable.

The "aluminum plate" is a metal plate that contains at least aluminum as a primary component thereof and exhibits the dimensional stability. The aluminum plate can be selected from: a pure aluminum plate, an alloy plate containing aluminum as a primary component thereof and a trace amount of foreign elements; a plastic film laminated or vapor-deposited with aluminum; and a paper laminated or vapor-deposited with aluminum. Hereinafter, the above-described supports containing aluminum or aluminum alloy is referred to as the aluminum support.

Examples of the foreign element which may be contained in the aluminum alloy include silicon, iron, manganese, copper, magnesium, chromium, zinc, bismuth, nickel, and titanium. The foreign element content in the alloy is preferably 10 mass % or less. While an aluminum support formed of pure aluminum is particularly preferable in the invention, since it is difficult to produce perfectly pure aluminum in view of the refining technique, the aluminum used in the aluminum support used in the invention may have trace amount of foreign elements. The composition of the aluminum plate used in the invention is not specified, and conventionally known aluminum plates in common use can be appropriately used, for example, JIS A 1050, JIS A 100, JIS A 3103, JIS A 3005.

The thickness of the aluminum plate used in the invention is approximately in a range of 0.1 to 0.6 mm. The thickness may be appropriately changed depending on a size of a printer, a size of a printing plate, and a user's desire. The aluminum support may be subjected to a support surface treatment described below in accordance with necessity as needed.

(Roughening Treatment)

As a roughening treating method, there are mechanical roughening, chemical etching, and electrolysis graining disclosed in JP-A No. 56-28893. Further, a mechanical roughening method such as an electrochemical roughening method of performing electrochemical roughening in hydrochloric acid or a nitric acid electrolyte, a wire brush graining method of scratching an aluminum surface with a metal wire, a pole graining method of graining an aluminum surface with an abrasion ball and an abrasive, and a brush graining method of roughening a surface with a nylon brush and an abrasive can be used, and the roughening methods can be used alone or in combination. Among them, a method which is usefully used in roughening is an electrochemical method of performing chemical roughening in hydrochloric acid or a nitric acid electrolyte, and a suitable anode time coulomb is in a range of 50 C/dm$^2$ to 400 C/dm$^2$. Further specifically, it is preferable that alternating and/or direct electrolysis is performed under the condition of a temperature of 20 to 80° C., a time of 1 second to 30 minutes, and a current density of 100 C/dm$^2$ to 400 C/dm$^2$ in an electrolyte comprising 0.1 to 50% hydrochloric acid or nitric acid.

An aluminum support which has been roughening-treated like this may be chemically etched with an acid or an alkali. A preferably used etching agent is sodium hydroxide, sodium carbonate, sodium aluminate, sodium metasilicate, sodium phosphate, potassium hydroxide, and lithium hydroxide, and preferable ranges of a concentration and a temperature are 1 to 50%, and 20 to 100° C., respectively. In order to remove stain (smut) remaining on a surface after etching, acid washing is performed. As an acid, nitric acid, sulfuric acid, phosphoric acid, chromic acid, hydrofluoric acid, and hydrofluoroboric acid are used. Particularly, examples of a method of removing and treating a smut after electrochemical roughening treatment preferably include a method of contacting with 15 to 65 mass % sulfuric acid at a temperature of 50 to 90° C. described in JP-A No. 53-12739, and a method of alkali etching described in JP-B No. 48-28123. A method and the condition are not particularly limited as far as, after the aforementioned treatment, a central line average roughness Ra of the treated surface is preferably 0.2 to 0.5 μm.

(Anodizing Treatment)

It is preferable that the thus treated aluminum support is anodizing-treated thereafter.

In anodizing treatment, sulfuric acid, phosphoric acid, citric acid or boric acid/an aqueous solution of sodium borate are used alone or in combination of plural kinds as a main component of an electrolysis bath. Thereupon, an electrolyte may of course contain at least components which are usually contained in an Al plate, an electrode, tap water, and groundwater. Further, a second component, and a third component may be added. The second component, or the third component as mentioned herein includes an ion of a metal such as Na, K, Mg, Li, Ca, Ti, Al, V, Cr, Mn, Fe, Co, Ni, Cu, and Zn, a cation such as an ammonium ion, and an anion such as a nitric acid ion, a carbonic acid ion, a chlorine ion, a phosphoric acid ion, a fluorine ion, a sulfurous acid ion, a titanic acid ion, a silicic acid ion, and a boric acid ion, and the component may be contained at a concentration of around 0 to 10000 ppm. The condition of anodizing treatment is not particularly limited, but anodizing treatment is preferably performed by direct or alternating electrolysis in a range of 30 g/liter to 500 g/liter, a treatment solution temperature of 10 to 70° C., a current density of 0.1 A/m² to 40 A/m². A thickness of a formed anodized film is in a range of 0.5 µm to 1.5 µm, preferably 0.5 µm to 1.0 µm. The treatment condition is preferably selected so that a pore diameter of a micropore present in an anodized film is in a range of 5 nm to 10 nm, and a pore density is in a range of $8\times10^{15}/m^2$ to $2\times10^{16}/m^2$.

As treatment of hydrophilizing a support surface, the widely known method can be applied. As particularly preferable treatment, hydrophilizing treatment with silicate or polyvinylphosphonic acid is performed. A film is formed of 2 to 40 mg/m², more preferably 4 to 30 mg/m² as expressed by a Si or P element amount. A coating amount can be measured by a fluorescent X-ray analyzing method.

The hydrophilizing treatment is such that alkali metal silicate, or polyvinylphosphonic acid is 1 to 30% by mass, preferably 2 to 15% by mass, and is performed by immersing an aluminum support, on which an anodized film is formed, in an aqueous solution at 25° C. and a pH of 10 to 13, for example, at 15 to 80° C. for 0.5 to 120 seconds.

As the alkali metal silicate used in hydrophilizing treatment, sodium silicate, potassium silicate, and lithium silicate are used. Examples of hydroxide used for elevating a pH of an aqueous alkali metal silicate solution include sodium hydroxide, potassium hydroxide, and lithium hydroxide. In the treating solution, an alkaline earth metal salt or a Group IVB metal salt may be incorporated. Examples of the alkaline earth metal salt include a nitrate salt such as calcium nitrate, strontium nitrate, magnesium nitrate, and barium nitrate, and a water-soluble salt such as sulfate, hydrochloride, phosphate, acetate, citrate, and borate. Examples of the Group IVB metal salt include titanium tetraoxide, titanium trichloride, titanium potassium fluoride, titanium potassium citrate, titanium sulfate, titanium tetraiodide, zirconium oxide chloride, zirconium dioxide, zirconium oxychloride, and zirconium tetrachloride.

The alkaline earth metal silicate or the Group IVB metal salt can be used alone, or by combining two or more kinds. A preferable range of these metal salts is 0.01 to 10% by mass, and a further preferable range is 0.05 to 5.0% by mass. Silicate electrodeposition as described in U.S. Pat. No. 3,658,662 is also effective. Surface treatment in which a support subjected to electrolysis graining, and the anodizing treatment and the hydrophilizing treatment are combined, as disclosed in JP-B No. 46-27481, JP-A No. 52-58602, and JP-A No. 52-30503, is also effective.

[Intermediate Layer]

In the planographic printing plate precursor in the invention, an intermediate layer (also called undercoating layer) is provided for the purpose of improving adhesion property between the photosensitive layer and the support, and stain at an non-image part, and examples of such the intermediate layer include those described in JP-B No. 50-7481, JP-A No. 51-71123, JP-A No. 54-72104, JP-A No. 59-101651, JP-A No. 60-149491, JP-A No. 60-232998, JP-A No. 2-304441, JP-A No. 3-56177, JP-A No. 4-282637, JP-A No. 5-16558, JP-A No. 5-246171, JP-A No. 5-341532, JP-A No. 7-159983, JP-A No. 7-314937, JP-A No. 8-202025, JP-A No. 8-320551, JP-A No. 9-34104, JP-A No. 9-236911, JP-A No. 9-269593, JP-A No. 10-69092, JP-A No. 10-115931, JP-A No. 10-161317, JP-A No. 10-260536, JP-A No. 10-282679, JP-A No. 10-282682, JP-A No. 11-84674, JP-A No. 10-69092, JP-A No. 10-115931, JP-A No. 11-38635, JP-A No. 11-38629, JP-A No. 10-282645, JP-A No. 10-301262, JP-A No. 11-24277, JP-A No. 11-109641, JP-A No. 10-319600, JP-A No. 11-84674, JP-A No. 11-327152, JP-A No. 2000-10292, JP-A No. 2000-235254, JP-A No. 2000-352824, JP-A No. 2001-175001, and JP-A No. 2001-209170.

[Protective Layer]

In the planographic printing plate precursor having a photo or thermal polymerizable negative photosensitive layer like the invention, it is usually preferable that a protective layer (also called overcoating layer) is provided on the photosensitive layer for performing exposure to light in the air. The protective layer prevents mixing of a low-molecular compound such as oxygen and a basic substance present in the air which suppresses an image forming reaction generated by exposure in the photosensitive layer, into the photosensitive layer, and allows for exposure in the air. Therefore, the property desired in such the protective layer is low permeability of a low-molecular compound such as oxygen and, further, it is desirable that transmission of light used in exposure is not substantially inhibited, adhesion with the photosensitive layer is excellent, and it can be easily removed in a developing step after exposure. Such the devise with respect to the protective layer has previously been conducted, and is described in U.S. Pat. No. 3,458,311, and JP-B No. 55-49726.

Examples of a material usable as a component in the protective layer is preferably a water-soluble polymer compound having relatively high crystallinity. Specifically, water-soluble polymers such as polyvinyl alcohol, polyvinyl pyrrolidone, acidic celluloses, gelatin, gum arabic and polyacrylic acid are well-known in the art. Among these compounds, the use of polyvinyl alcohol as the major component may lead to the best results with respect to basic characteristics such as oxygen impermeability and removability at development. The polyvinyl alcohol used in the protective layer may be partially substituted by ester, ether or acetal insofar as it has unsubstituted vinyl alcohol units, which impart necessary oxygen impermeability and water solubility. Similarly, the polyvinyl alcohol may be a copolymer having a part that contains one or more other copolymerizable components.

Specific examples of the polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 (all trade name, manufactured by Kuraray Co., Ltd.).

Components (selection of PVA, use of additives), and a coating amount of the protective layer are selected in view of fogging property and adhesion property/flaw resistance in addition to oxygen barrier property/developing removability. In general, as a hydrolysis rate is higher (as an unsubstituted polyvinyl alcohol unit content in the protective layer is higher), or as a film thickness is greater, oxygen barrier property becomes higher, being advantageous in a sensitivity. However, when oxygen barrier property is extremely enhanced, a problem arises that an unnecessary polymerization reaction occurs at manufacturing/storage, and unnecessary fogging, and dot gain occurs. In addition, adhesion property with an image part, and flaw resistance are extremely important in plate handling. That is, when a hydrophilic layer consisting of a water-soluble polymer is laminated on a lipophilic photosensitive layer, film peeling due to a deficient adhering force easily occurs and, in order to improve adhesion property between these layers, various proposals have been made. For example, U.S. Pat. No. 292,501, and U.S. Pat. No. 44,563 describe that sufficient adhesion property is obtained by mixing 20 to 60% by mass of an acryl-based emulsion or a water-insoluble vinylpyrrolidone-vinyl acetate copolymer in a hydrophilic polymer mainly consisting of polyvinyl alcohol, and laminating the mixture on a photosensitive layer.

Any of these known techniques can be applied to the protective layer in the invention. A method of coating such the protective layer is described in detail, for example, in U.S. Pat. No. 3,458,311 and JP-B No. 55-49729.

In addition, a process of making a a planographic printing plate from the planographic printing plate precursor of the invention is described as follows.

[Making of Planographic Printing Plate Precursor]

In order to make the planographic printing plate precursor of the invention, at least an exposing process and a developing process are performed.

As a light source for exposing the negative planographic printing plate precursor of the invention, the known light source can be used without limitation. A desirable wavelength of the light source is 300 nm to 1200 nm, specifically, various lasers can be suitably used as the light source and, among others, an infrared ray laser of a wavelength of 780 nm to 1200 nm is suitably used.

The exposing mechanism may be any of an inner drum format, an outer drum format and a flat bed format.

Furthermore, various mercury lamps of ultrahigh pressure, high pressure, medium pressure, and low pressure, a chemical lamp, a carbon arc lamp, a xenon lamp, a metal halide lamp, various laser lamps of a visible ray and a an ultraviolet ray, a fluorescent lamp, a tungsten lamp, and or a solar light may be used as other exposing rays for the planographic printing plate precursor of the invention.

The planographic printing plate precursor of the invention is developing-treated after exposure. As a developing solution used in such the developing treatment, an aqueous alkali solution having a pH of 14 or lower is particularly preferable, and an aqueous alkali solution having a pH of 8 to 12 containing an anionic surfactant is used. For example, examples include inorganic alkali agents such as sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium bicarbonate, potassium bicarbonate, ammonium bicarbonate, potassium bicarbonate, and lithium bicarbonate. In addition, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine are used. These alkali agents can be used alone, or by combining two or more kinds.

An anionic surfactant is preferably added to the developing solution for use in developing the planographic printing plate precursor of the invention in an amount of generally from 1 to 20 mass %, preferably 3 to 10 mass %, relative to the total amount of the developing solution. Too When the amount of the anionic surfactant is too small amounts thereof, result in impaired developability may be impaired, while when it is too large amounts thereof, produce disadvantageous influences such as the deterioration of the image areas in strength, for example, such as wearing resistance, may occur. Examples of the anionic surfactant include sodium lauryl alcohol sulfate, ammonium lauryl alcohol sulfate, sodium octyl alcohol sulfate, salts of alkylarylsulfonic acids, such as sodium isopropylnaphthalenesulfonate, sodium isobutylnaphthalenesulfonate, the sodium salt of polyoxyethylene glycol mononaphthyl ether sulfate, sodium dodecylbenzenesulfonate, and or sodium m-eta-nitrobenzenesulfonate; sulfuric acid esters of higher alcohols having 8 to 22 carbon atoms, such as disodium alkyl sulfates; phosphoric acid esters of aliphatic alcohols, such as sodium salt of cetyl alcohol phosphate; alkylamide sulfonic acid salts such as $C_{17}H_{33}CON(CH_3)CH_2CH_2SO_3Na$; and sulfonic acid salts of dibasic aliphatic ester, such as sodium dioctyl sulfosuccinate and sodium dihexyl sulfosuccinate.

A slightly water-miscible organic solvent such as benzyl alcohol can be added to the developing solution according to need. Suitable organic solvents have a solubility in to water of about 10 mass % or lower. Preferably, an appropriate organic solvent is selected from ones those having a solubility in water of 5 mass % or lower. Examples thereof include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol, and 3-methylcyclohexanol. The content of such an organic solvent is preferably in a range of 1 to 5 mass % based on the total weight of the developing solution in use. The amount of the organic solvent to be used is closely related to the amount of the surfactant to be used. It is preferable to increase the amount of the anionic surfactant as the amount of the organic solvent increases. This is because, if a large amount of an organic solvent is added to a developing solution containing a small amount of an anionic surfactant, the organic solvent partly remains undissolved, making it impossible to expect satisfactory developability.

The developing solution may further contain additives such as a deforming agent or a water softener. Examples of the water softener include polyphosphates such as $Na_2P_2O_7$, $Na_5P_3O_3$, $Na_3P_3O_9$, $Na_2O_4P(NaO_3P)PO_3Na_2$, and Calgon (sodium polymetaphosphate), aminopolycarboxylic acids (for example, ethylenediaminetetraacetic acid, and potassium salts or sodium salts thereof; diethylenetriaminepentaacetic acid, and potassium salts or sodium salts thereof; triethylenetetraminehexaacetic acid, and potassium salts or sodium salts thereof; hydroxyethylenediaminetriacetic acid, and potassium salts or sodium salts thereof; nitrilotriacetic acid, and potassium salts or sodium salts thereof; 1,2-diaminocyclohexanetetraacetic acid, and potassium salts or sodium salts thereof; and 1,3-diamino-2-propanol tetraacetic acid, and potassium salts or sodium salts thereof); other polycarboxylic acids (for example, 2-phosphonobutanetricarboxylic acid-1, 2,4, and potassium salts or sodium salts thereof; and 2-phosphonobutanonetricarboxylic acid-2,3,4, and potassium salts or sodium salts thereof), organic phosphonic acids (for example, 1-phosphonoethanetricarboxylic acid-1,2,2, potassium salt thereof, and potassium salts or sodium salts thereof; and 1-hydroxyethane-1,1-diphosphonic acid, potassium salt thereof, sodium salt thereof; and aminotri(methylene phosphonic acid), and potassium salts or sodium salts thereof).

The optimum amount of the water softener varies depending on the hardness and amount of hard water used. In general, the water softener is contained in a range of 0.01 to 5 mass %, more preferably 0.01 to 0.5 mass %, relative to the amount of the developing solution at use.

In a case where an automatic developing machine is used for developing the planographic printing plate precursor of the invention, in order to restore the processing power of the developer a replenisher or a fresh developing solution may be further used because the processing ability of the machine is made to be deteriorated in accordance with the increase of the amount of the precursors processed thereby. In this case, the replenishing can be conducted by a method described in U.S. Pat. No. 4,882,246. Developers described in JP-A No. 50-26601, JP-A No. 58-54341, JP-B No. 56-39464, JP-B No. 56-42860 or JP-B No. 57-7427 are also preferable.

Since the specified polyurethane resin used in the photosensitive layer in the planographic printing plate precursor of the invention is excellent in solubility in a developer, a film does not remain on an non-imaged part, and since precipitation in a developer with time is suppressed, even when repetition treatment is performed using an automatic developing machine, a plate disorder such as generation of stain by adhesion of a polymer precipitated in a developing bath to a plate is suppressed and, therefore, the resin can be suitably used in such the treatment.

The planographic printing plate precursor which was subjected to development treatment in this manner may be post-treated with washing water, a surfactant-containing rinse, or a desensitizing gum solution containing gum arabic or a starch derivative, as described in JP-A Nos. 54-8002, 55-115045 or 59-58431. Various combinations of these treatments can be used.

In a process for making the planographic printing plate precursor in of the invention, an entire surface of the plate may be wholly heated according to need before exposure, and during exposure, and/or during the period of the exposure to development according to need. This heating accelerates an image-forming reaction in the photosensitive layer to bring about advantages of improved sensitivity, improved printing durability, and stabilized sensitivity. Furthermore, the technique in which an entire surface of the image formed through development is wholly subjected to post-heating or exposure is effective in improving image area strength and printing durability.

It is generally preferable that the heating before development be is conducted under such mild conditions that the plate is heated at 150° C. or lower from the viewpoint of avoiding an occurrence of an undesired curing reaction. Exceedingly severe conditions are may be used for the heating after development. Usually, this heating is conducted at a temperature in a range of 200 to 500° C. from the viewpoint in consideration of improvement in heightening reaction of the image area strength and pyrolysis of the image areas.

The planographic printing plate obtained by these treatments is loaded onto an offset printing machine, and used for printing on a large number of sheets.

At the time of printing, a plate cleaner may be used for removing dirt from the plate. PS plate cleaners conventionally-known in the art may be used therefor, and examples thereof include Multi-cleaner CL-1, CL-2, CP, CN-4, CN, CG-1, PC-1, SR or IC (all trade names, manufactured by Fuji Film Corporation).

EXAMPLES

The present invention will be explained below by Examples, but the invention is not limited to them.

Synthesis Example 1

Compound Represented by Formula (1)

Compound (1-1) which is the compound represented by the Formula (1) was synthesized according to the following scheme. Details will be described later.

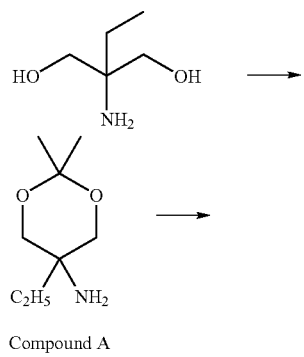

Compound A

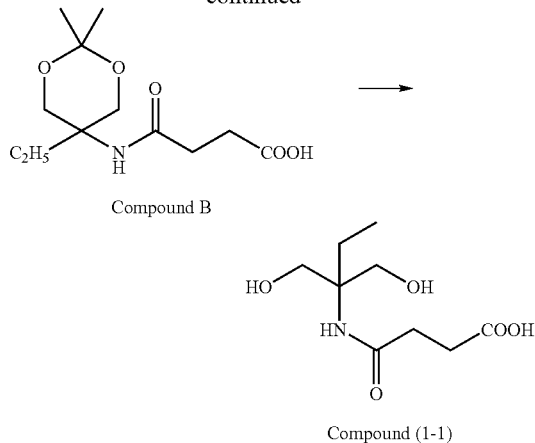

Compound B

Compound (1-1)

[Synthesis of Compound A]

In 0.5 L, three-neck round bottom flask equipped with a calcium chloride tube and a stirrer, 0.3 L of acetone was added to 52 g of amino-2-ethyl-1,3-propanediol (manufactured by Tokyo Kasei Kogyo Co., Ltd.) to uniformly dissolve it. After the reaction solution was cooled with an ice to 5° C. or lower, 42.8 g of methanesulfonic acid (manufactured by Wako Pure Chemical Industries, Ltd.) was added dropwise so that an inner temperature became 20° C. or higher. At completion of addition, a white pasty precipitate was produced. Then, under ice-cooling, 68 g of 2,2-dimethoxypropane (manufactured by Wako Pure Chemical Industries, Ltd.) was added dropwise. After completion of addition, the reaction solution was returned to room temperature and, at the reaction for 1 hour, the reaction solution become uniform. Further, the reaction was continued for 4 hours.

After completion of the reaction, the reaction solution was concentrated under reduced pressure. To the concentrate was added an aqueous solution in which 18.7 g of sodium hydroxide had been dissolved in 150 ml of water. After the reaction solution was extracted with ethyl acetate, the organic layer was washed with an aqueous saturated sodium chloride solution. After the organic layer was dried with sodium sulfate, this was concentrated with an evaporator under reduced pressure. Further, the solvent was distilled off using a vacuum pump to obtain 50 g of Compound A.

[Synthesis of Compound B]

In 200 ml of acetonitrile were dissolved 50 g of Compound A and 31.8 g of triethylamine. This mixture was cooled with an ice, and 31.4 g of solid anhydrous succinic acid (manufactured by Tokyo Kasei Kogyo Co., Ltd.) was added in portions at an inner temperature of 5° C. Thereupon, heat was produced until 45° C. After completion of the reaction, 32.7 g of concentrated hydrochloric acid was added at an inner temperature of 5° C. And, 150 ml of water was added, this was extracted with ethyl acetate, and the organic layer was washed with an aqueous saturated sodium chloride solution and dried with sodium sulfate. The organic layer was concentrated with an evaporator under reduced pressure to obtain 75 g of a crude pale yellow crystal. This crude material was recrystallized with acetonitrile to obtain 66 g of Compound B as a white crystal. $^1$H-NMR data of the resulting Compound B is shown below.

NMR (CDCl$_3$)

6.12 (1H, s), 4.0 (2H, d), 3.7 (2H, d), 2.7 (2H, t), 2.5 (2H, t), 1.7 (2H, q), 1.4 (6H, d), 0.8 (3H, t)

[Synthesis of Compound 1-1]

To 29 g of Compound B was added 60 g of water, and this was heated to stir at 55° C. After completion of the reaction, the reaction solution became uniform. The reaction solution was concentrated with an evaporator at 50° C. and 45 mbar ($4.5 \times 10^3$ Pa). To the resulting residue was added 50 g of acetonitrile, and the reaction solution was concentrated with an evaporator at 40° C. and 45 mbar to obtain 25 g of viscous oily Compound (1-1). $^1$H NMR data of the resulting Compound 1-1 is shown below.

NMR (CD$_3$OD)

3.8 (2H, d), 3.6 (2H, d), 2.6 (2H, t), 2.5 (2H, t), 1.7 (2H, q), 0.8 (3H, t)

[Dehydration of Compound 1-1]

To 25 g of the viscous oily Compound (1-1) were added 25 g of dehydrated N-methylpyrrolidone, and 70 g of dehydrated acetonitrile as an azeotropy dehydrating solvent, and the reaction solution was concentrated with an evaporator at 50° C. and 45 mbar. A content of the concentrate was measured by a Karl Fischer's method and, as a result, a content was 0.05%.

Synthesis Example 2

Polyurethane Resin (P-1)

The "polyurethane resin (P-1)" which is the specified polyurethane resin related to the invention was synthesized as follows.

Into a 500 ml of a three-neck round bottom flask equipped with a condenser and a stirrer were placed Compound 1-1 obtained by Synthesis Example 1 (39.57 g, 50% 1-methyl-2-pyrrolidone solution subjected to azeotropic dehydration, water content 0.05%), hexamethylene diisocyanate (5.08 g, manufactured by Wako Pure Chemical Industries, Ltd.), diphenylmethane diisocyanate (30.24 g, manufactured by Wako Pure Chemical Industries, Ltd.), polypropylene glycol having an average molecular weight of 1000 (57.55 g, manufactured by Wako Pure Chemical Industries, Ltd.), 1-methyl-2-pyrrolidone (80 g, manufactured by Wako Pure Chemical Industries, Ltd.) and Neostan U-600 (5 droplets, manufactured by Nitto Chemical Industry Co., Ltd.), and this was heated at 100° C. for 8 hours. Thereafter, this was diluted with methanol (100 ml), and 1-methyl-2-pyrrolidone (560 g). The reaction solution was placed into water (4 L) while stirring, to precipitate a white polymer. This polymer was filtered, washed with water, and vacuum-dried to obtain the specified polyurethane resin (P-1) (15.8 g) shown in the following Table 1.

A weight average molecular weight of the resulting specified polyurethane resin (P-1) was measured by gel permeation chromatography, and found to be 95000 in terms of polystyrene. And, an acid value was 0.61 meq/g.

In addition, as in the Synthesis Example 1 and the Synthesis Example 2, diisocyanate compounds and diol compounds shown in Table 1 to Table 3 were used to obtain polyurethane resins (P-2) to (P-7) related to the invention, and comparative polyurethane resins (CP-1) to (CP-3).

TABLE 1

| Specified polyurethane resin | Diisocyanate compound used (number is mol %) | |
|---|---|---|
| P-1 | 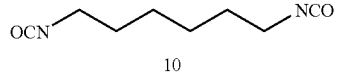 40 | 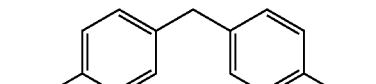 10 |
| P-2 | 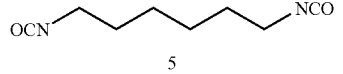 40 | 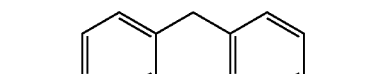 10 |
| P-3 | 45 | 5 |
| P-4 | 50 | |

TABLE 1-continued
| Specified polyurethane resin | Diol compound used (number is mol %) | Weight average molecular weight (×10000) |
|---|---|---|
| P-1 | 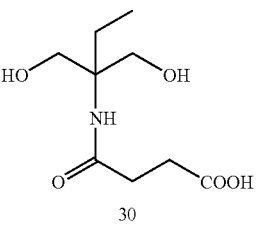   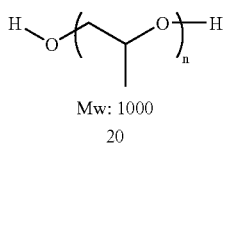 | 9.5 |
| P-2 | 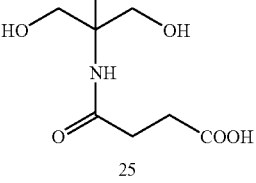   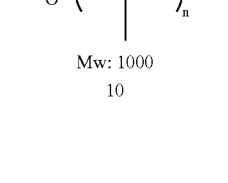 | 9.7 |
| P-3 | 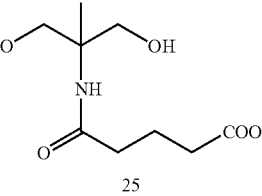   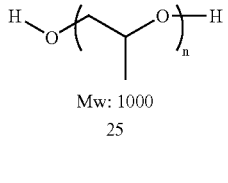 | 8.6 |
| P-4 | 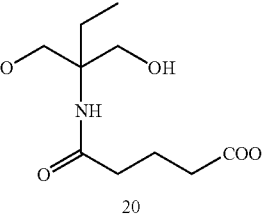   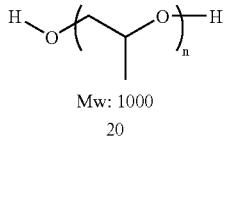 | 8.8 |
TABLE 2
| Specified polyurethane resin | Diisocyanate compound used (number is mol %) |
|---|---|
| P-5 | 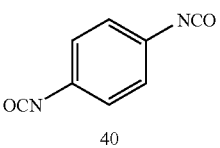   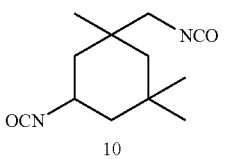 |

TABLE 2-continued

| Specified polyurethane resin | Diisocyanate compound used (number is mol %) | |
|---|---|---|
| P-6 | 1,5-naphthalene diisocyanate, 30 | OCN-CH₂CH₂-O-CH₂CH₂-O-CH₂CH₂-NCO, 20 |
| P-7 | 4,4'-methylenebis(phenyl isocyanate), 40 | OCN-(CH₂)₆-NCO, 10 |

| Specified polyurethane resin | Diol compound used (number is mol %) | | | Weight average molecular weight (×10000) |
|---|---|---|---|---|
| P-5 | HOCH₂-C(CH₃)(NHCO-CH₂CH₂-C(CH₃)₂-COOH)-CH₂OH, 25 | H-[O-CH(CH₃)-CH₂]ₙ-OH, Mw: 1000, 10 | HOCH₂-C(CH₃)(CH₂OH)-COO-CH₂CH₂CH₂-OOC-C(CH₃)=CH₂, 15 | 7.5 |
| P-6 | HOCH₂-C(C₂H₅)(NHCO-CH₂-O-CH₂-COOH)-CH₂OH, 25 | H-[O-CH(CH₃)-CH₂]ₙ-OH, Mw: 1000, 10 | HOCH₂-C(CH₃)(CH₂OH)-COO-CH₂CH₂CH₂-OOC-C(CH₃)=CH₂, 15 | 9.0 |
| P-7 | HOCH₂-C(C₂H₅)(NHCO-CH₂CH₂-COOH)-CH₂OH, 30 | H-[O-CH(CH₃)-CH₂]ₙ-OH, Mw: 1000, 20 | | 8.5 |

TABLE 3

| Specified polyurethane resin | Diisocyanate compound used (number is mol %) | |
|---|---|---|
| CP-1 | 4,4'-methylenebis(phenyl isocyanate), 40 | OCN-(CH₂)₆-NCO, 10 |

TABLE 3-continued

| Specified polyurethane resin | Diisocyanate compound used (number is mol %) | | Weight average molecular weight (×10000) |
|---|---|---|---|
| CP-2 | 4,4'-methylenebis(phenyl isocyanate) — 40 | OCN-(CH₂)₆-NCO — 10 | |
| CP-3 | 4,4'-methylenebis(phenyl isocyanate) — 40 | OCN-(CH₂)₆-NCO — 10 | |

| Specified polyurethane resin | Diol compound used (number is mol %) | | | Weight average molecular weight (×10000) |
|---|---|---|---|---|
| CP-1 | 2,2-bis(hydroxymethyl)propionate ester with COOH — 30 | poly(propylene glycol) Mw: 1000 — 20 | | 9.2 |
| CP-2 | 2,2-bis(hydroxymethyl)propionate ester with COOH — 25 | poly(propylene glycol) Mw: 1000 — 10 | glycerol methacrylate — 15 | 8.6 |
| CP-3 | N,N-bis(2-hydroxyethyl) amide with COOH — 20 | poly(propylene glycol) Mw: 1000 — 15 | glycerol methacrylate — 15 | 7.8 |

The specified polyurethane resins obtained above [(P-1) to (P-7)] were subjected to a test of precipitation of a polymer with time. That is, 12.5 g of the polyurethane resin was dissolved in 0.5 liter of an aqueous alkali solution at a pH of 12, and this was sealed, and stored under the 25° C. atmosphere for 60 days. After storage, the presence or the absence of polymer precipitation was observed visually, and precipitation of the polymer was not seen also after 60 days in the specified polyurethane resins P-1 to P-7 (alkali-soluble polymer) in the invention. On the other hand, polymer precipitation was confirmed visually in comparative polymers CP-1 and CP-2.

Examples 1 to 7

Comparative Examples 1-3

By the following procedure, negative planographic printing plate precursors of Examples 1 to 7, and Comparative Examples 1 to 3 shown in Table 4 were manufactured, and printing performance was assessed. Results are also described in Table 4.

[Production of Support]

Using a JAS A 1050 aluminum plate having a thickness of 0.24 mm and a width of 1030 mm, continuous treatment was performed as follows.

(a) Using the existing mechanical roughening device, mechanical roughening was performed using a rotating roller-like nylon brush while an abrasion slurry solution of an abrasion (pumice) having a specific gravity of 1.12 and a suspension in water was supplied to a surface of the aluminum plate. An average particle diameter of the abrasive was 40 to 45 µm and a maximum particle diameter was 200 µm. As the nylon brush, 6·10 nylon was used, a bristle length was 50 mm, and a bristle diameter was 0.3 mm. The nylon brush was a brush planted so as to be dense by perforating a ϕ300 mm stainless cylinder. Three rotating brushes were used. A distance between two supporting rollers (ϕ200 mm) at a lower part of the brush was 300 mm. The brush roller was pushed until a load of a driving motor which rotates the brush became 7 kw plus relative to a load before pushed against the aluminum plate. A rotation direction of the brush was the same as a movement direction of the aluminum plate, and a rotation number of 200 rpm.

(b) The aluminum plate was etching-treated by spraying at a sodium hydroxide concentration of 2.6% by mass, an aluminum ion concentration of 6.5% by mass, and a temperature of 70° C., to dissolve the aluminum plate at 0.3 g/m². Thereafter, this was washed with water by spraying.

(c) Desmutting treatment was performed by spraying with an aqueous solution (containing 0.5% by mass of aluminum ion) having a nitrate concentration of 1% by mass at a temperature of 30° C., followed by water washing by spraying. As the aqueous nitric acid solution used in the desmutting, a waste liquid of a step of performing electrochemical roughening using an alternating current in an aqueous nitric acid solution was used.

(d) Using a 60 Hz alternating voltage, electrochemical roughening treatment was performed continuously. Thereupon, an electrolyte was an aqueous solution of 1% by mass of nitric acid (containing 0.5% by mass of aluminum ion, and 0.007% by mass of aluminum ion) at a temperature of 40° C. Using a trapezium rectangular-wave alternating current having a time from zero of a current value to a peak, TP, of 2 msec, and a duty ratio of 1:1 as an alternating source, electrochemical roughening treatment was performed using a carbon electrode as a counter-electrode. Ferrite was used in an accessory anode. A current density was 30 A/dm² as expressed by a current peak value, and an electric amount was 255 C/cm² as expressed by as a sum of electricity amounts when the aluminum plate was an anode. Five % of a current flowing from the source was branched into the accessory anode. Thereafter, water washing was performed by spraying.

(e) The aluminum plate was etching-treated by spraying at a sodium hydroxide concentration of 26% by mass, and an aluminum ion concentration of 6.5% by mass at 32° C. to dissolve the aluminum plate at 0.2 g/m², a smut component containing mainly aluminum hydroxide produced at electrochemical roughening using an alternating current in the immediately before paragraph was removed, and an edge part of a produced pit was dissolved to smoothen the edge part. Thereafter, this was washed with water by spraying.

(f) Desmutting treatment was performed by spraying with an aqueous solution (containing 0.5% by mass of aluminum ion) having a sulfuric acid concentration of 25% by mass at a temperature of 60° C. was performed and, thereafter, this was washed with water by spraying.

(g) Using the existing anodizing device (first and second electrolysis part length, each 6 m, first feeding part length 3 m, second feeding part length 3 m, first and second feeding electrode length, each 2.4 m) of a two-stage feeding electrolysis treating method, anodizing treatment was performed at a sulfuric acid concentration of 170 g/liter (containing 0.5% by mass of aluminum ion) at an electrolysis part, at a temperature of 38° C. Thereafter, this was washed with water by spraying. Thereupon, in the anodizing device, a current from a source is flown to the first feeding electrode provided at the first feeding part, is flown to the plate-like aluminum via an electrolyte to generate an oxidized film on a surface of the plate-like aluminum at the first electrolysis part, and is returned to the source through the electrolysis electrode provided at the first feeding part. On the other hand, a current from the source is flown to the second feeding electrode provided at the second feeding part, is similarly flown to the plate-like aluminum via the electrode to generate an oxidized film on a surface of a plate-like aluminum at the second electrolysis part, and an electric amount fed to the first feeding part from the source and an electric amount fed to the second feeding part from the source were the same, and a feeding current density on the oxidized film surface at the second feeding part was about 25 A/dm². At the second feeding part, electricity is fed from the 1.35 g/m² oxidized film surface. A final oxidized film amount was 2.7 g/m². The foregoing aluminum support is designated as [AS-1].

[Hydrophilizing Treatment]

The aluminum support [AS-1] was silicate-treated in order to enhance hydrophilicity as a printing plate non-image part. The aluminum support was treated by conveying the support at an aluminum web contact time of 15 seconds while a 1.5% aqueous No. 3 sodium silicate solution was retained at 70° C., and washing this with water. An adhesion amount of Si was 10 mg/m². This support is designated as [AS-2].

[Coating of Photosensitive Layer]

A photosensitive layer coating solution having the following composition was coated on the thus treated aluminum support [AS-1] at a dry coating amount of 1.0 g/m² to 1.2 g/m², and this was dried at 100° C. for 1 minute to form a photosensitive layer.

| (Photosensitive layer coating solution) | |
| --- | --- |
| Addition polymerizable compound (compound described in Table 4) | 1.5 g |
| Specified polyurethane resin or comparative binder polymer (Resin described in Table 4) | 2.0 g |
| Sensitizing dye (compound described in Table 4) | 0.2 g |
| Photopolymerization initiator (compound described in Table 4) | 0.4 g |
| Cosensitizing dye (compound described in Table 4 as other additive) | 0.4 g |
| Fluorine-based nonionic surfactant (trade name: Megafack F-177, manufactured by Dainippon Ink and Chemicals, Incorporated) | 0.03 g |
| Thermal polymerization inhibitor (N-nitrosophenylhydroxylamine aluminum salt) | 0.01 g |
| Coloring pigment dispersion of the following composition | 2.0 g |
| Methyl ethyl ketone | 20.0 g |
| Propylene glycol monomethyl ether | 20.0 g |
| Coloring pigment dispersion composition | |
| Pigment Blue 15:6 | 15 parts by mass |
| Allyl methacrylate/methacrylic acid copolymer (Copolymerization mole ratio 80/20, weight average molecular weight: 40000) | 10 parts by mass |
| Cyclohexanone | 15 parts by mass |
| Methoxypropyl acetate | 20 parts by mass |
| Propylene glycol monomethyl ether | 40 parts by mass |

[Coating of Protective Layer]

A 3 mass % aqueous solution of polyvinyl alcohol (saponification degree 98 mol %, polymerization degree 550) was coated on the resulting photosensitive layer at a dry coating mass of 2 g/m², and this was dried at 100° C. for 2 minutes.

[Exposure of Planographic Printing Plate Precursor]

Using a violet semiconductor laser setter (InGaN semiconductor laser, 405 nm±10 mm emission/output 30 mW, trade name: Vx9600, manufactured by FUJIFILM Electronic Imaging Ltd), the planographic printing plate precursor was subjected to dot image exposure at an exposure amount of 90 μJ/cm² and resolution of 2438 dpi, and at an interval of 1% from 1 to 99%. Thereafter, the precursor was heated in an oven at 100° C. for 10 seconds.

[Development/Plate Making]

After exposure, a developer D-1, and a finisher (trade name: FP-2W, manufactured by Fuji Photo Film Co., Ltd.) were placed, respectively, into an automatic developing machine (trade name: FLP-813, manufactured by Fuji Photo Film Co., Ltd.), and the exposed plate was subjected to development/plate making under the condition of a developer temperature of 30° C. and a developing time of 18 seconds to obtain a planograhic printing plate.

[Image Part Printing Durability Test]

As a printing machine, R201 manufactured by Roland was used and, as an ink, Graph G(N) manufactured by Dainippon Ink and Chemicals, Incorporated was used. A printed material of a solid image part was observed, and printing durability of an image part was examined by the printing number at which an image became blurred. A greater number indicates that printing durability is better. Results are shown in Table 4.

[Evaluation of Development Scum]

The resulting each planographic printing plate precursor (area 0.88 m²) was exposed to light by the exposing method so that an area of a non-image part became 0.75 m², and 1200 precursors were development-treated continuously with a developer at a pH of 11.90 (30° C.) using a developing machine (trade name: LP-1310, manufactured by Fuji Photo Film Co., Ltd.) equipped with a protective layer removing device. The developer used is D-1.

Evaluation was conducted by judging visually whether a development scum was precipitated in the developer after treatment or not. Results are shown in Table 4.

The addition polymerizable compound, the polymerization initiator, the sensitizing dye, the infrared absorbing agent, other additive, and the developer used described in Table 4, including those used in other Examples described later (described in Table 5 and Table 6), are shown below.

<Addition polymerizable compound>

M1: Pentaerythritol tetraacrylate (trade name: NK ester A-TMMT, manufactured by Shin-Nakamura Chemical Co., Ltd.)
M-3: NK ester A-BPE 4, manufactured by Shin-Nakamura Chemical Co., Ltd.
M-4: Compound having the following structure

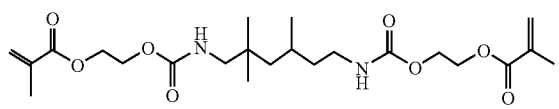

<Polymerization initiator>

(I-1)

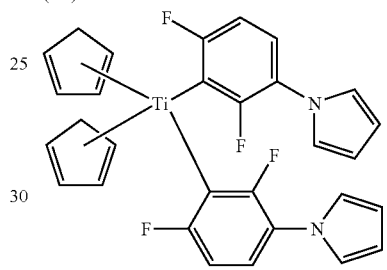

(I-2)

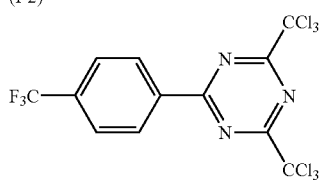

TABLE 4

| | Specified polyurethane resin/ comparative binder polymer | Polymerizable compound | Polymerization initiator | Sensitizing dye | Other additive | Presence or absence of protective layer | Support | Developer | Printing durability (×10000 times printing) | Development scum | Light source (nm) |
|---|---|---|---|---|---|---|---|---|---|---|---|
| Example 1 | P-1 | M-4 | I-3 | S-4 | C-1 | Present | AS-1 | D-1 | 21 | Absent | 405 |
| Example 2 | P-2 | M-4 | I-1 | S-2 | C-1 | Present | AS-1 | D-1 | 29 | Absent | 405 |
| Example 3 | P-3 | M-4 | I-2 | S-2 | C-1 | Present | AS-1 | D-1 | 22 | Absent | 405 |
| Example 4 | P-4 | M-4 | I-1 | S-2 | C-1 | Present | AS-1 | D-1 | 27 | Absent | 405 |
| Example 5 | P-5 | M-4 | I-1 | S-4 | C-1 | Present | AS-1 | D-1 | 27 | Absent | 405 |
| Example 6 | P-6 | M-4 | I-3 | S-2 | C-1 | Present | AS-1 | D-1 | 26 | Absent | 405 |
| Example 7 | P-7 | M-4 | I-3 | S-2 | C-1 | Present | AS-1 | D-1 | 22 | Absent | 405 |
| Comparative example 1 | CP-1 | M-4 | I-3 | S-4 | C-1 | Present | AS-1 | D-1 | 21 | Present | 405 |
| Comparative example 2 | CP-2 | M-4 | I-1 | S-4 | C-1 | Present | AS-1 | D-1 | 25 | Present | 405 |
| Comparative example 3 | CP-3 | M-4 | I-3 | S-4 | C-1 | Present | AS-1 | D-1 | 18 | Absent | 405 |

-continued (I-3)

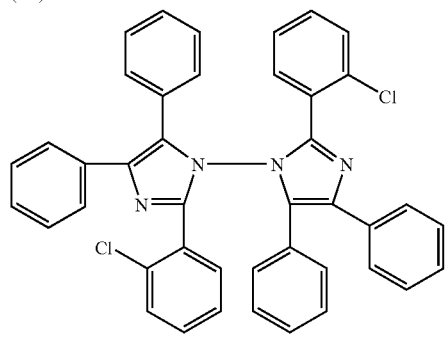

<Sensitizing dye>

(S-1)

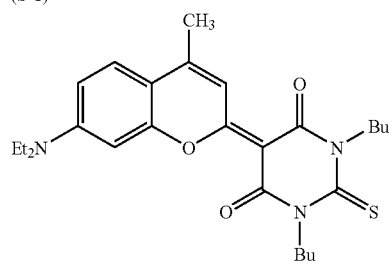

(S-2)

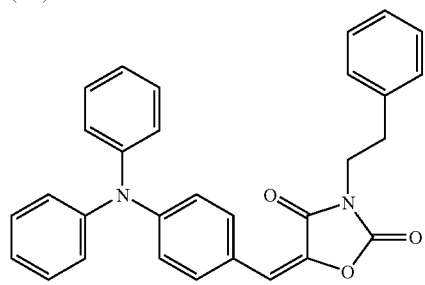

(S-4)

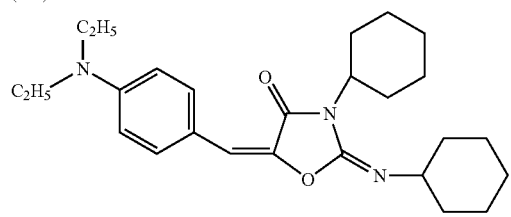

<Infrared absorbing agent>

(S-5)

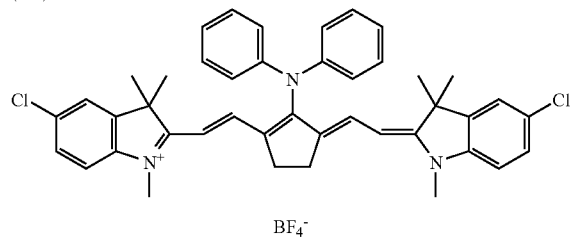

-continued

<Other additive>

(C-1)

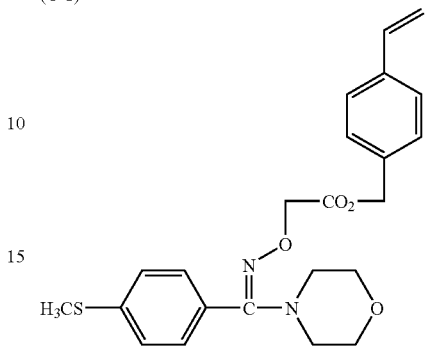

(C-2)

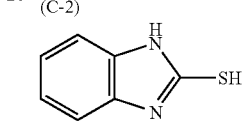

(C-4)

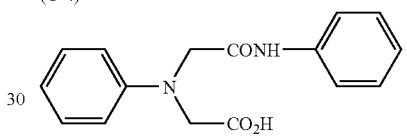

<Developer>

D-1:
Aqueous solution of pH 10 consisting of the following composition

| | |
|---|---|
| Monoethanolamine | 0.1 part by mass |
| Triethanolamine | 1.5 parts by mass |
| Compound of the following Formula 01 | 4.0 parts by mass |
| Compound of the following Formula 02 | 2.5 parts by mass |
| Compound of the following Formula 03 | 0.2 part by mass |
| Water | 91.7 parts by mass |

Formula (01)

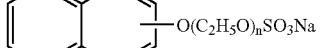

Formula (02)

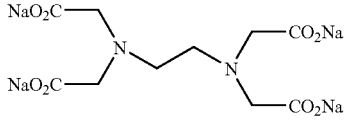

Formula (03)

In the (Formula 01), $R^{14}$ represents a hydrogen atom or a butyl group.

D-2:
Aqueous solution consisting of the following composition

| | |
|---|---|
| 1K potassium silicate | 3.0 parts by mass |
| Potassium hydroxide | 1.5 parts by mass |
| Compound of the Formula 03 | 0.2 part by mass |
| Water | 95.3 parts by mass |

-continued

D-3:

1:4 Aqueous diluted solution of DH-N manufactured by Fuji Photo Film Co., Ltd.

Examples 8 to 14

Comparative Examples 4 to 6

According to the same manners as those of Examples 1 to 7, and Comparative Examples 1 to 3 except that the aluminum support [AS-2] was used as the support, and components of the photosensitive layer coating solution were changed to those shown in Table 5, negative planographic printing plate precursors of Examples 8 to 14, and Comparative Examples 4 to 6 shown in Table 5 were manufactured. In the present Examples and Comparative Examples, the coating solution was coated so that a coating amount after drying of the photosensitive layer became 1.3 g/m² to 1.5 g/m².

[Image Part Printing Durability Test]

As a printing machine, R201 manufactured by Roland was used and, as an ink, Graph G(N) manufactured by Dainippon Ink and Chemicals, Incorporated was used. A printed matter of a plain image part was observed, and printing durability of an image part was examined by the printing number at which an image became blurred. A greater number indicates that printing durability is better. Results are shown in Table 5.

[Evaluation of Development Scum]

The resulting each planographic printing plate precursor (area 0.88 m²) was exposed to light by the exposing method so that an area of a non-image part became 0.75 m², and 1200 precursors were development-treated continuously with a developer at a pH of 11.90 (30° C.) using a developing machine (trade name: LP-1310, manufactured by Fuji Photo Film Co., Ltd.) equipped with a protective layer removing device. The developer used is D-2.

TABLE 5

| | Specified polyurethane resin/ comparative binder polymer | Polymerizable compound | Polymer- ization initiator | Sensitizing dye | Other additive | Presence or absence of protective layer | Support | Developer | Printing durability (×10000 times printing) | Development scum | Light source (nm) |
|---|---|---|---|---|---|---|---|---|---|---|---|
| Example 8 | P-1 | M-1 | I-1 | S-1 | C-2 | Present | AS-2 | D-2 | 21 | Absent | 532 |
| Example 9 | P-2 | M-1 | I-1 | S-1 | C-2 | Present | AS-2 | D-2 | 31 | Absent | 532 |
| Example 10 | P-3 | M-1 | I-1 | S-1 | C-2 | Present | AS-2 | D-2 | 22 | Absent | 532 |
| Example 11 | P-4 | M-1 | I-1 | S-1 | C-2 | Present | AS-2 | D-2 | 27 | Absent | 532 |
| Example 12 | P-5 | M-1 | I-1 | S-1 | C-2 | Present | AS-2 | D-2 | 27 | Absent | 532 |
| Example 13 | P-6 | M-1 | I-1 | S-1 | C-2 | Present | AS-2 | D-2 | 27 | Absent | 532 |
| Example 14 | P-7 | M-1 | I-1 | S-1 | C-2 | Present | AS-2 | D-2 | 22 | Absent | 532 |
| Comparative example 4 | CP-1 | M-1 | I-1 | S-1 | C-2 | Present | AS-2 | D-2 | 21 | Present | 532 |
| Comparative example 5 | CP-2 | M-1 | I-1 | S-1 | C-2 | Present | AS-2 | D-2 | 26 | Present | 532 |
| Comparative example 6 | CP-3 | M-1 | I-1 | S-1 | C-2 | Present | AS-2 | D-2 | 17 | Absent | 532 |

[Exposure of Planographic Printing Plate Precursor]

Using a FD-YAG (532 nm) laser exposing machine (plate setter, trade name: Gutenberg, manufactured by Heidelberg), the resulting planographic printing plate precursor was subjected to dot image exposure by plain image exposure at 2540 dpi, and 175 line/inch, and at an interval of 1% from 1 to 99%, by adjusting an exposing power so that a plate exposure energy density became 200 µJ/cm².

[Development/Plate Making]

After exposure, a developer D-2, and a finisher (trade name: FP-2W, manufactured by Fuji Photo Film Co., Ltd.) were placed, respectively, into an automatic developing machine (trade name: FLP-813, manufactured by Fuji Photo Film Co., Ltd.), and the exposed plate was subjected to development/plate making under the condition of a developer temperature of 30° C. and a developing time of 18 seconds to obtain a planographic printing plate.

Evaluation was conducted by judging visually whether a development scum was precipitated in the developer after treatment or not. Results are shown in Table 5.

Examples 15 to 21

Comparative Examples 7 to 9

Production of Support

An aluminum plate (material 1050) having a thickness of 0.3 mm was defatting-treated at 50° C. for 30 seconds using a 10 mass % aqueous sodium aluminate solution to remove a rolling oil on a surface of the plate, and an aluminum surface was subjected to graining using three bundle-planted nylon brushes having a blister diameter of 0.3 mm, and pumice having a median diameter of 25 µm-suspension in water (specific gravity of 1.1 g/cm³), and washed well with water. This plate was etched by immersing in a 25% aqueous sodium hydroxide solution at 45° C. for 9 seconds, washed with water, immersed in 20% nitric acid at 60° C. for 20 seconds, and washed with water. Thereupon, an etching amount of a graining surface was about 3 g/m².

Then, electrochemical roughening treatment was performed continuously using a 60 Hz alternating voltage. Thereupon, an electrolyte was a 1 mass % aqueous nitric acid solution (containing 0.5% by mass of aluminum ion) at a temperature of 50° C. Using a trapezoid rectangular-wave alternating current having a time from zero of a current value to a peak, TP, of 0.8 msec, and a duty ratio of 1:1 as a an alternating source wave shape, electrochemical roughening treatment was performed using a carbon electrode as a counter-electrode. Ferrite was used in an accessory anode. A current density expressed by a peak value of a current was 30 A/dm², and 5% of a current flowing from a source was branched to an accessory anode. An electric amount at nitric acid electrolysis was an electric amount of 175 C/dm² when the aluminum plate was an anode. Thereafter, water washing was performed by spraying.

Then, electrochemical roughening treatment was performed with a 0.5 mass % aqueous hydrochloric acid solution (containing 0.5% by mass of aluminum ion), and an electrolyte at a liquid temperature of 50° C. by the same manner as that of nitric acid electrolysis under the condition of an electric amount of 50 C/dm² when the aluminum plate was an anode and, thereafter, water washing was performed by spraying. On this plate, a film anodized with a 2.5 g/m² direct current was provided at a current density of 15 A/dm² using 15% sulfuric acid (containing 0.5% by mass of aluminum ion) as an electrolyte, and the plate was washed with water, and dried to obtain a support A. A central line average roughness (Ra) of this substrate was measured using a needle having a diameter of 2 μm, and found to be 0.51 μm. The support obtained thus was designated as [AS-3].

<Undercoating Layer>

Then, the following coating solution for an undercoating layer was coated on a surface of this aluminum support [AS-3] with a wire bar, and this was dried at 100° C. for 10 seconds. A coating amount was 10 mg/m².

| -Coating solution for undercoating layer- | |
|---|---|
| Polymer compound A of the following structure (weight average molecular weight: 10,000) | 0.05 g |
| Methanol | 27 g |
| Ion-exchanged water | 3 g |

Polymer compound A

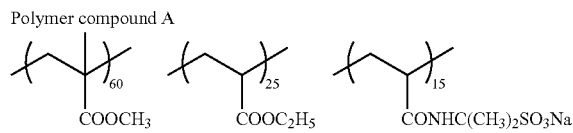

[Coating of Photosensitive Layer]

A photosensitive layer coating solution having the following composition was prepared, and the coating solution was coated thereupon using a wire bar so that a coating amount after drying became 0.9 g/m², and dried with a warm air drying device at 115° C. for 34 seconds to form a photosensitive layer.

| (Photosensitive layer coating solution) | |
|---|---|
| Infrared absorbing agent (compound described in Table 6) | 0.038 g |
| Polymerization initiator A (compound described in Table 6) | 0.061 g |
| Polymerization initiator B (compound described in Table 6) | 0.094 g |
| Mercapto compound (SH-1: following structure) | 0.015 g |
| Addition polymerizable compound (compound described in Table 6) | 0.311 g |
| Binder polymer (B-1: following structure) | 0.311 g |
| Specified polyurethane resin (compound described in Table 6) | 0.311 g |
| Additive (compound described in Table 6) | 0.079 g |
| Polymerization initiator (Q-1: following structure) | 0.0012 g |
| Ethyl Violet (EV-1: following structure) | 0.021 g |
| Fluorine-based surfactant (trade name: Megafack F-780-F, manufactured by Dainippon Ink and Chemicals, Incorporated, 30 mass % solution in methyl isobutyl ketone (MIBK)) | 0.0081 g |
| Methyl ethyl ketone | 5.886 g |
| Methanol | 2.733 g |
| 1-Methoxy-2-propanol | 5.886 g |

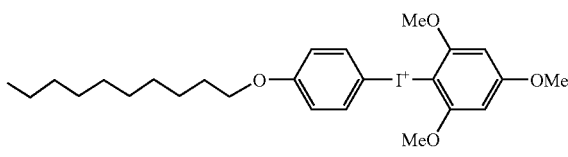

I-4

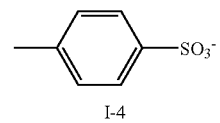

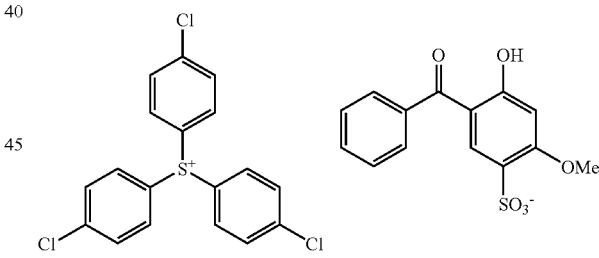

I-5

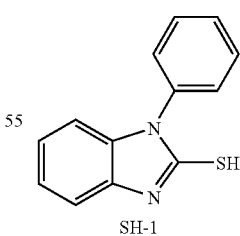

SH-1

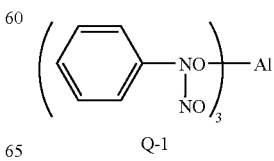

Q-1

-continued (Photosensitive layer coating solution)

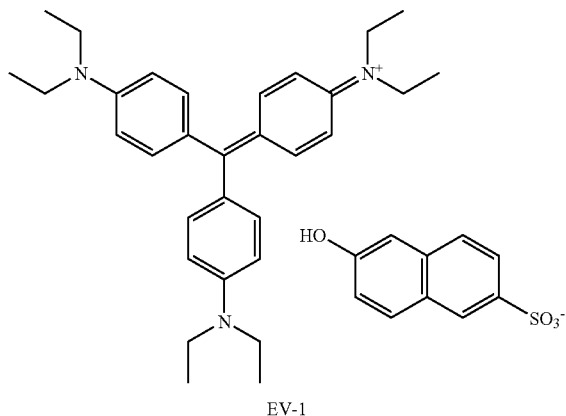

EV-1

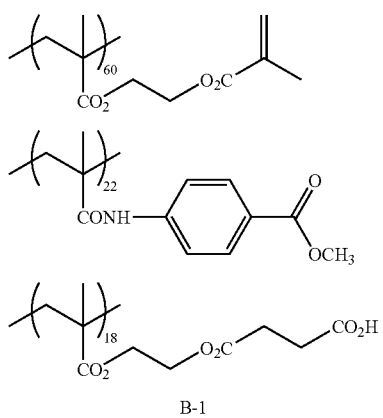

B-1

[Coating of Protective Layer]

<Under Protective Layer>

A mixed aqueous solution (coating solution for protective layer) of synthetic mica (3.2% dispersion in water, trade name: Somasif MEB-3L, manufactured by Corp CHEMICAL CO., LTD.), polyvinyl alcohol (sulfuric acid-modified polyvinyl alcohol, saponification degree 99 mol %, polymerization degree 300, trade name: Goseran CKS-50, manufactured by Nippon Synthetic Chemical Industry Co. Ltd., a surfactant A (trade name: EMULEX 710, manufactured by Nippon Emulsion Co.) and a surfactant B (trade name: Adekapluronic P-84, manufactured by Asahi Denka Kogyo K.K.) was coated on a photosensitive layer surface with a wire bar, and dried with a warm air drying device at 125° C. for 30 seconds.

A content ratio of synthetic mica (solid content)/polyvinyl alcohol/surfactant A/surfactant B in this mixed aqueous solution (coating solution for protective layer) was 7.5/89/2/1.5 (mass %), and a coating amount (covering amount after drying) was 0.5 g/m².

<Upper Protective Layer>

A mixed aqueous solution (coating solution for protective layer) of an organic filler (trade name: ART PEARL J-7P, manufactured by Negami Chemical Industrial CO., LTD.), synthetic mica (3.2% dispersion in water, trade name: Somasif MEB-3L, manufactured by Corp Chemical CO., LTD.), polyvinyl alcohol (sulfuric acid-modified polyvinyl alcohol, saponification degree 87 mol %, polymerization degree 300, trade name: L-3266, manufactured by Nippon Synthetic Chemical Industry Co., Ltd.), a viscosity increasing agent (trade name: Celogen FS-B, manufactured by Dai-ichi Kogyo Seiyaku Co., Ltd.), a polymer compound A (aforementioned structure), and a surfactant (trade name: EMULEX 710, manufactured by Nippon Emulsion Co.) was coated on a lower protective layer surface with a wire bar, and dried with a warm air drying device at 120° C. for 30 seconds.

A content ratio of organic filler/synthetic mica (solid content)/polyvinyl alcohol/viscosity increasing agent/polymer compound A/surfactant in this mixed aqueous solution (coating solution for protective layer) was 4.7/2.8/67.4/18.6/2.3/4.2 (mass %), and a coating amount (covering amount after drying) was 1.8 g/m².

Thereby, planographic printing plate precursors of Examples 15 to 21, and Comparative Examples 7 to 9 were obtained.

[Exposure of Planographic Printing Plate Precursor]

The thus obtained Example planographic printing plate precursor was exposed to light with Trendsetter3244VFS manufactured by Creo mounted with a water-cooling 40 W infrared semiconductor laser under the condition of an out put of 9 W, a rotation number of an outer surface drum of 210 rpm, a plate energy of 100 mJ/cm², and resolution of 2400 dpi.

[Development/Plate Making]

After exposure, a developer D-3, and a 1:1 water-diluted solution of a finisher (trade name: GN-2K, manufactured by Fuji Photo Film Co., Ltd.) were placed, respectively, into "LP-1310News" manufactured by Fuji Photo Film Co., Ltd., and this was subjected to development/plate making at 30° C. to obtain a planographic printing plate.

[Image Part Printing Durability Test]

As a printing machine, Lisron manufactured by Komori Corporation K.K. was used and, as an ink, Graph G(N) manufactured by Dainippon Ink and Chemicals, Incorporated was used. A printed material at a solid image part was observed, and printing durability of an image part was examined by the printing number at which an image became blurred. A greater number indicates that printing durability is better. Results are shown in Table 6.

[Evaluation of Development Scum]

The resulting each planographic printing plate precursor (area 0.88 m²) was exposed to light by the exposing method so that an area of a non-image part became 0.75 m², and 1200 precursors were development-treated continuously with a developer at a pH of 11.90 (30° C.) using a developing machine (trade name: LP-1310, manufactured by Fuji Photo Film Co., Ltd.) equipped with a protective layer removing device. The developer used is D-3.

Evaluation was conducted by judging visually whether a development scum was precipitated in the developer after treatment or not. Results are shown in Table 6.

TABLE 6

| | Specified polyurethane resin/ comparative binder polymer | Polymerizable compound | Polymerization initiator A | Polymerization initiator B | Sensitizing dye | Other additive | Presence or absence of protective layer | Support | Developer | Printing durability (×10000 times printing) | Development scum | Light source (nm) |
|---|---|---|---|---|---|---|---|---|---|---|---|---|
| Example 15 | P-1 | M-3 | I-4 | I-5 | S-5 | C-4 | Present | AS-3 | D-3 | 21 | Absent | 830 |
| Example 16 | P-2 | M-3 | I-4 | I-5 | S-5 | C-4 | Present | AS-3 | D-3 | 24 | Absent | 830 |
| Example 17 | P-3 | M-3 | I-4 | I-5 | S-5 | C-4 | Present | AS-3 | D-3 | 21 | Absent | 830 |
| Example 18 | P-4 | M-3 | I-4 | I-5 | S-5 | C-4 | Present | AS-3 | D-3 | 24 | Absent | 830 |
| Example 19 | P-5 | M-3 | I-4 | I-5 | S-5 | C-4 | Present | AS-3 | D-3 | 23 | Absent | 830 |
| Example 20 | P-6 | M-3 | I-4 | I-5 | S-5 | C-4 | Present | AS-3 | D-3 | 24 | Absent | 830 |
| Example 21 | P-7 | M-3 | I-4 | I-5 | S-5 | C-4 | Present | AS-3 | D-3 | 22 | Absent | 830 |
| Comparative example 7 | CP-1 | M-3 | I-4 | I-5 | S-5 | C-4 | Present | AS-3 | D-3 | 20 | Present | 830 |
| Comparative example 8 | CP-2 | M-3 | I-4 | I-5 | S-5 | C-4 | Present | AS-3 | D-3 | 21 | Present | 830 |
| Comparative example 9 | CP-3 | M-3 | I-4 | I-5 | S-5 | C-4 | Present | AS-3 | D-3 | 18 | Absent | 830 |

As apparent from Table 4 to Table 6, it was confirmed that the planographic printing plate precursor with the photosensitive layer comprising of a polymerizable composition (polymerizable composition of the invention) containing the specified polyurethane resin related to the invention, even when an image is formed by exposure to light of any wavelength of 405 nm, 532 nm, and 830 nm, has very excellent printing durability and, further, precipitation of the development scum is not generated even by continuous treatment. From this, it is seen that the polymerizable composition of the invention enables formation a film having better film quality, and is excellent in solubility in the developer. It is seen that, by having the photosensitive layer containing such the polymerizable composition, the planographic printing plate precursor of the invention is a planographic printing plate precursor suitable in high speed writing by laser exposure as performed in the present Example. Therefore, it can be said that the planographic printing plate precursor to which the invention has been applied, exerts high productivity.

Exemplary embodiments of the invention will be shown below.

(1) A polymerizable composition comprising a compound having an addition polymerizable ethylenic unsaturated bond, a photo- or thermal-polymerization initiator, and an alkali soluble polyurethane resin synthesized from a compound represented by the following Formula (1):

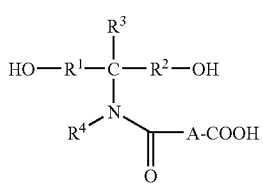

Formula (1)

wherein, in Formula (1), each of $R^1$ and $R^2$ independently represents a single bond or an alkylene group optionally having a substituent, $R^3$ represents a hydrogen atom or an alkyl group, $R^4$ represents a hydrogen atom or an alkyl group, and A represents a divalent or higher linking group, provided that $R^1$ and $R^2$ are not both a single bond.

(2) The polymerizable composition of (1), wherein the alkali soluble polyurethane resin is synthesized from a diisocyanate compound and a combination of at least one diol compound other than the compound represented by Formula (1) in addition to the compound represented by Formula (1).

(3) The polymerizable composition of (1), wherein the alkali-soluble polyurethane resin comprises a functional group having an unsaturated bond at a side chain.

(4) The polymerizable composition of (1), wherein the compound represented by Formula (1) is a compound represented by the following Formula (2):

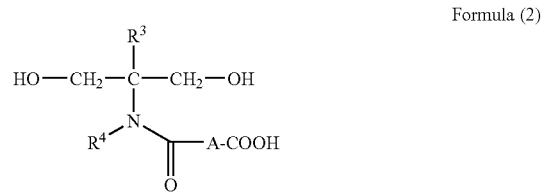

Formula (2)

wherein, in Formula (2), $R^3$ represents a hydrogen atom or an alkyl group, $R^4$ represents a hydrogen atom or an alkyl group, and A represents a divalent or higher linking group.

(5) A planographic printing plate precursor comprising, on a support, a photosensitive layer including the polymerizable composition of (1).

(6) An alkali-soluble polyurethane resin synthesized from a compound represented by the following Formula (1):

Formula (1)

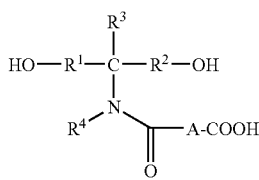

wherein, in Formula (1), each of $R^1$ and $R^2$ independently represents a single bond or an alkylene group optionally having a substituent, $R^3$ represents a hydrogen atom or an alkyl group, $R^4$ represents a hydrogen atom or an alkyl group, and A represents a divalent or higher linking group, provided that $R^1$ and $R^2$ are not both a single bond.

(7) The alkali-soluble polyurethane resin of (6), which is synthesized from a diisocyanate compound and a combination of at least one diol compound other than the compound represented by Formula (1) in addition to the compound represented by Formula (1).

(8) The alkali-soluble polyurethane resin of (6), wherein the alkali-soluble polyurethane resin comprises a functional group having an unsaturated bond at a side chain.

(9) The alkali-soluble polyurethane resin of (6), wherein the compound represented by Formula (1) is a compound represented by the following Formula (2):

Formula (2)

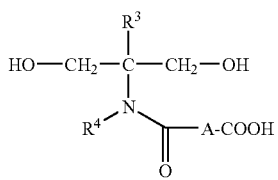

wherein, in Formula (2), $R^3$ represents a hydrogen atom or an alkyl group, $R^4$ represents a hydrogen atom or an alkyl group, and A represents a divalent or higher linking group.

(10) A method for producing a compound represented by Formula (2), the method comprising hydrolyzing a compound represented by the following Formula (3) with water at a reaction temperature of 60° C. or lower without using an acidic catalyst:

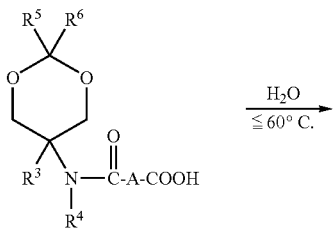

Formula (3)

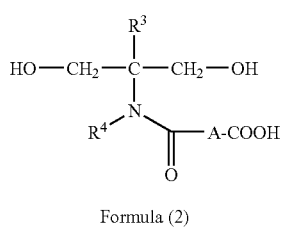

Formula (2)

wherein, in the Formula (2), $R^3$ represents a hydrogen atom or an alkyl group, $R^4$ represents a hydrogen atom or an alkyl group, and A represents a divalent or higher linking group and, in the Formula (3), each of $R^5$ and $R^6$ independently represents a hydrogen atom or an alkyl group, and $R^3$, $R^4$ and A are as for the same as $R^3$, $R^4$ and A in the Formula (2).

(11) The method of (10), wherein an amount of water included in the compound represented by Formula (2) is adjusted to 0.1% by mass or less using an organic solvent that forms an azeotrope with water at a temperature of 60° C. or lower under reduced pressure, after the hydrolyzing.

All publications, patent applications, and technical standards mentioned in this specification are herein incorporated by reference to the same extent as if each individual publication, patent application, or technical standard was specifically and individually indicated to be incorporated by reference.

What is claimed is:

1. A polymerizable composition comprising a compound having an addition polymerizable ethylenic unsaturated bond, a photo- or thermal-polymerization initiator, and an alkali soluble polyurethane resin synthesized from a compound represented by the following Formula (1):

Formula (1)

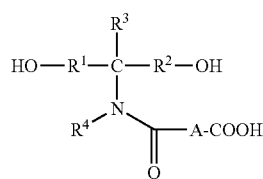

wherein, in Formula (1), each of $R^1$ and $R^2$ independently represents a single bond or an alkylene group optionally having a substituent, $R^3$ represents a hydrogen atom or an alkyl group, $R^4$ represents a hydrogen atom or an alkyl group, and A represents a divalent or higher linking group that comprises no cyclic structure in a part of its structure, provided that $R^1$ and $R^2$ are not both a single bond.

2. The polymerizable composition of claim 1, wherein the alkali soluble polyurethane resin is synthesized from a diisocyanate compound and a combination of at least one diol compound other than the compound represented by Formula (1) in addition to the compound represented by Formula (1).

3. The polymerizable composition of claim 1, wherein the alkali-soluble polyurethane resin comprises a functional group having an unsaturated bond at a side chain.

4. The polymerizable composition of claim 1, wherein the compound represented by Formula (1) is a compound represented by the following Formula (2):

Formula (2)

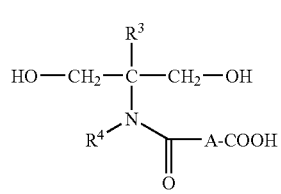

wherein, in Formula (2), $R^3$ represents a hydrogen atom or an alkyl group, $R^4$ represents a hydrogen atom or an alkyl group, and A represents a divalent or higher linking group.

5. A planographic printing plate precursor comprising, on a support, a photosensitive layer including the polymerizable composition of claim 1.

6. An alkali-soluble polyurethane resin synthesized from a compound represented by the following Formula (1):

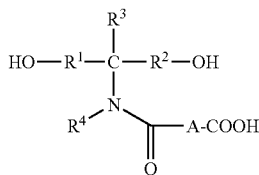

Formula (1)

wherein, in Formula (1), each of $R^1$ and $R^2$ independently represents a single bond or an alkylene group optionally having a substituent, $R^3$ represents a hydrogen atom or an alkyl group, $R^4$ represents a hydrogen atom or an alkyl group, and A represents a divalent or higher linking group that comprises no cyclic structure in a part of its structure, provided that $R^1$ and $R^2$ are not both a single bond.

7. The alkali-soluble polyurethane resin of claim 6, which is synthesized from a diisocyanate compound and a combination of at least one diol compound other than the compound represented by Formula (1) in addition to the compound represented by Formula (1).

8. The alkali-soluble polyurethane resin of claim 6, wherein the alkali-soluble polyurethane resin comprises a functional group having an unsaturated bond at a side chain.

9. The alkali-soluble polyurethane resin of claim 6, wherein the compound represented by Formula (1) is a compound represented by the following Formula (2):

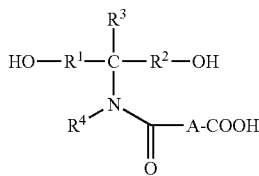

Formula (1)

wherein, in Formula (2), $R^3$ represents a hydrogen atom or an alkyl group, $R^4$ represents a hydrogen atom or an alkyl group, and A represents a divalent or higher linking group.

10. A method for producing a compound represented by Formula (2), the method comprising hydrolyzing a compound represented by the following Formula (3) with water at a reaction temperature of 60° C. or lower without using an acidic catalyst:

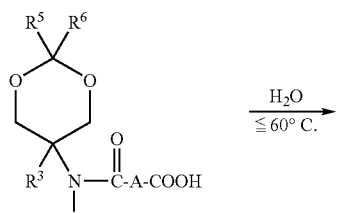

Formula (3)

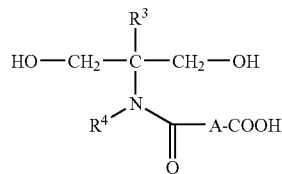

Formula (2)

wherein, in the Formula (2), $R^3$ represents a hydrogen atom or an alkyl group, $R^4$ represents a hydrogen atom or an alkyl group, and A represents a divalent or higher linking group and, in the Formula (3), each of $R^5$ and $R^6$ independently represents a hydrogen atom or an alkyl group, and $R^3$, $R^4$ and A are as for the same as $R^3$, $R^4$ and A in the Formula (2).

11. The method of claim 10, wherein an amount of water included in the compound represented by Formula (2) is adjusted to 0.1% by mass or less using an organic solvent that forms an azeotrope with water at a temperature of 60° C. or lower under reduced pressure, after the hydrolyzing.

* * * * *